(12) United States Patent
Choi

(10) Patent No.: US 10,978,476 B2
(45) Date of Patent: Apr. 13, 2021

(54) SEMICONDUCTOR DEVICE AND METHOD OF MANUFACTURING THE SAME

(71) Applicant: SK hynix Inc., Gyeonggi-do (KR)

(72) Inventor: Kang Sik Choi, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/584,267

(22) Filed: Sep. 26, 2019

(65) Prior Publication Data

US 2020/0020719 A1 Jan. 16, 2020

Related U.S. Application Data

(63) Continuation of application No. 15/861,861, filed on Jan. 4, 2018, now Pat. No. 10,490,567.

(30) Foreign Application Priority Data

Jun. 21, 2017 (KR) .......................... 10-2017-0078577

(51) Int. Cl.

| | |
|---|---|
| *H01L 21/02* | (2006.01) |
| *H01L 21/311* | (2006.01) |
| *H01L 21/768* | (2006.01) |
| *H01L 21/762* | (2006.01) |
| *G11C 16/04* | (2006.01) |
| *H01L 21/28* | (2006.01) |

(Continued)

(52) U.S. Cl.
CPC ...... *H01L 27/11582* (2013.01); *H01L 23/528* (2013.01); *H01L 27/11565* (2013.01); *H01L 29/0649* (2013.01); *H01L 29/0847* (2013.01); *H01L 29/1037* (2013.01); *H01L 29/1095* (2013.01); *H01L 21/0217* (2013.01); *H01L 21/02164* (2013.01); *H01L 21/02532* (2013.01); *H01L 21/02636* (2013.01); *H01L 21/31111* (2013.01); *H01L 21/76895* (2013.01); *H01L 29/0676* (2013.01); *H01L 29/40117* (2019.08); *H01L 29/66439* (2013.01); *H01L 29/775* (2013.01)

(58) Field of Classification Search
CPC ................................................. H01L 21/02636
See application file for complete search history.

(56) References Cited

U.S. PATENT DOCUMENTS

| | | | |
|---|---|---|---|
| 2013/0009235 A1* | 1/2013 | Yoo ................... | H01L 21/76237 257/329 |
| 2014/0131783 A1* | 5/2014 | Lee .................... | H01L 23/5226 257/314 |

(Continued)

*Primary Examiner* — Omar F Mojaddedi
(74) *Attorney, Agent, or Firm* — IP & T Group LLP

(57) ABSTRACT

The semiconductor device includes: a first channel pattern including a first horizontal part, vertical parts extending from the first horizontal part, a connection part extending from the first horizontal part in a direction opposite to the vertical parts, and a second horizontal part extending from the connection part in a direction parallel to the first horizontal part; a first gate stack enclosing the vertical parts of the first channel pattern and disposed over the first horizontal part; a well structure disposed under the second horizontal part, and including a first conductivity type impurity; and a first well contact line directly contacting with the second horizontal part and the well structure to couple the second horizontal part of the first channel pattern with the well structure.

20 Claims, 42 Drawing Sheets

(51) Int. Cl.
*H01L 27/11582* (2017.01)
*H01L 29/10* (2006.01)
*H01L 23/528* (2006.01)
*H01L 29/06* (2006.01)
*H01L 29/08* (2006.01)
*H01L 27/11565* (2017.01)
H01L 29/66 (2006.01)
H01L 29/775 (2006.01)

(56) References Cited

U.S. PATENT DOCUMENTS

2016/0218059 A1\* 7/2016 Nakada ............... H01L 23/5226
2016/0329101 A1\* 11/2016 Sakakibara ........ G11C 16/0483
2018/0151672 A1\* 5/2018 Choi .................. H01L 29/1037

\* cited by examiner

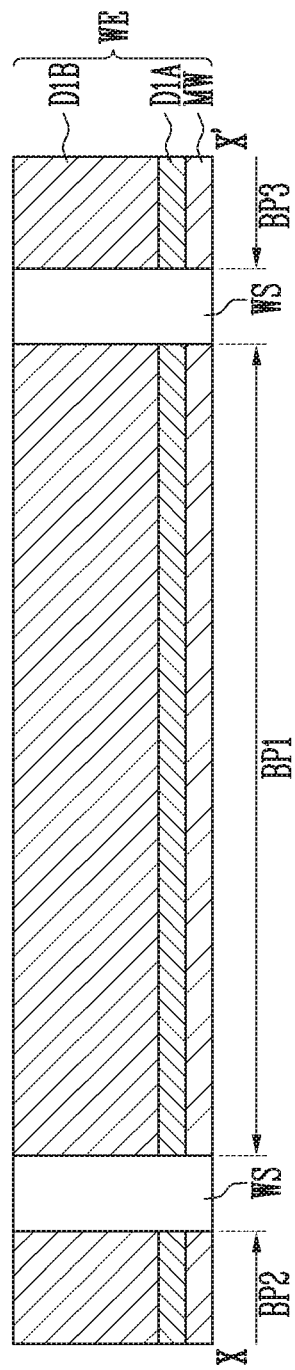

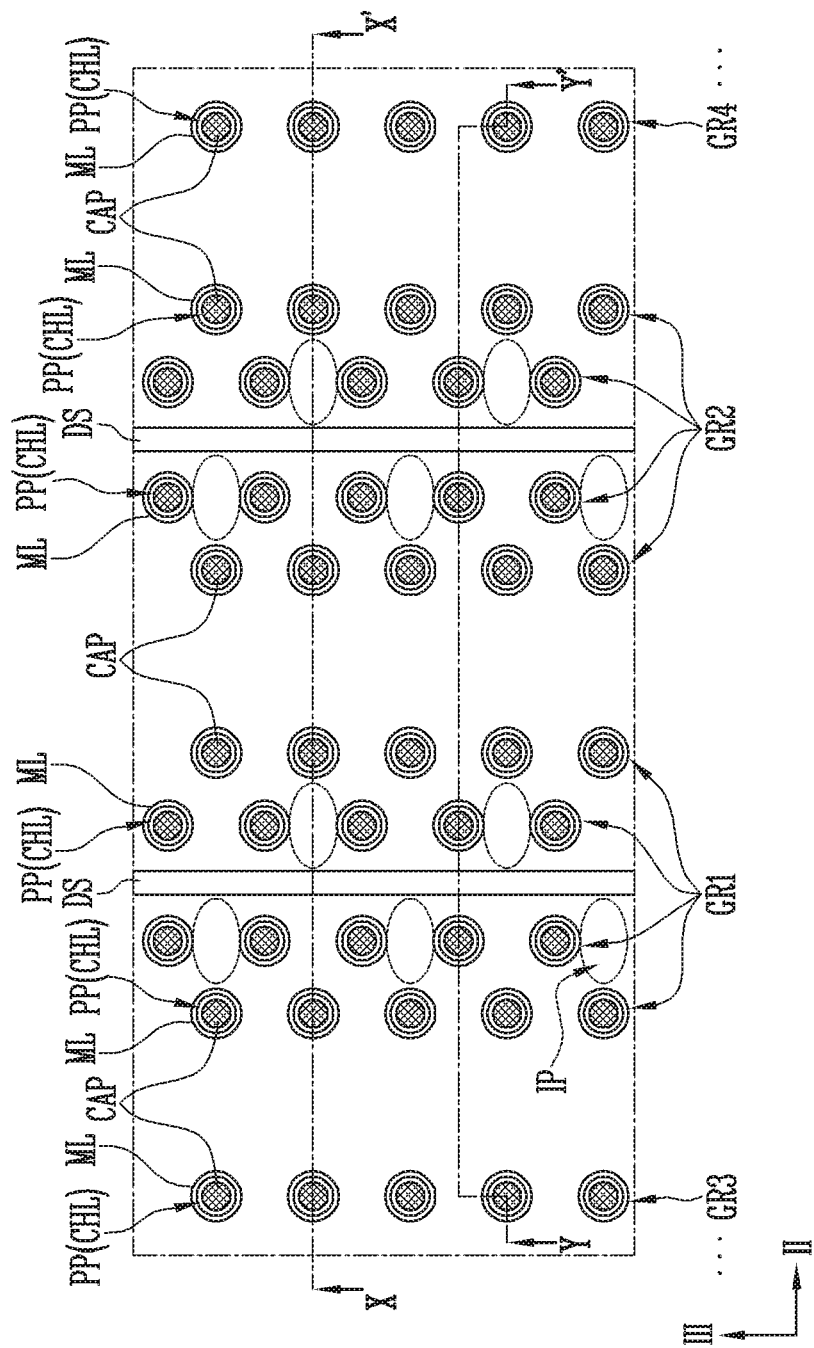

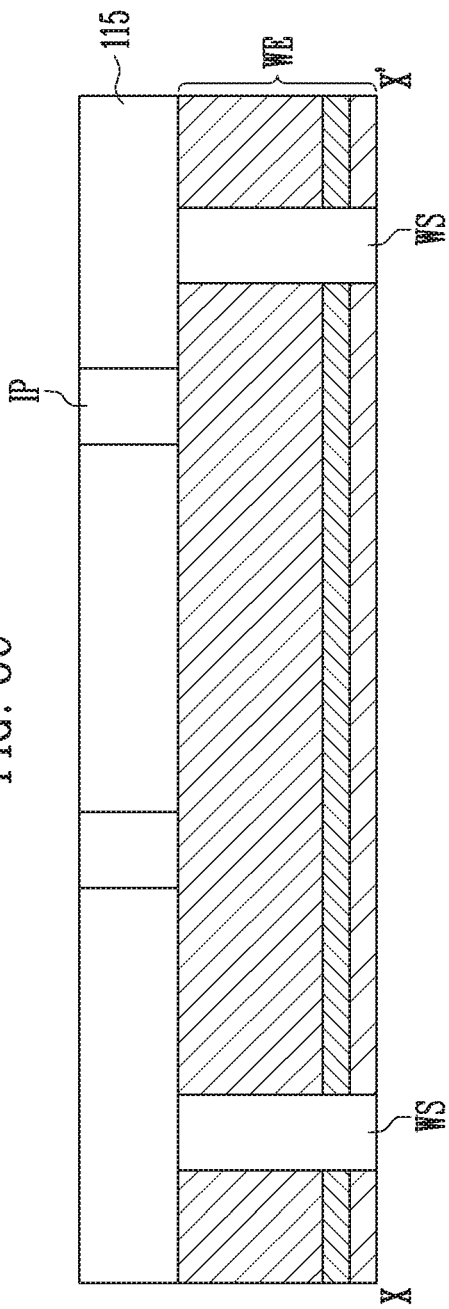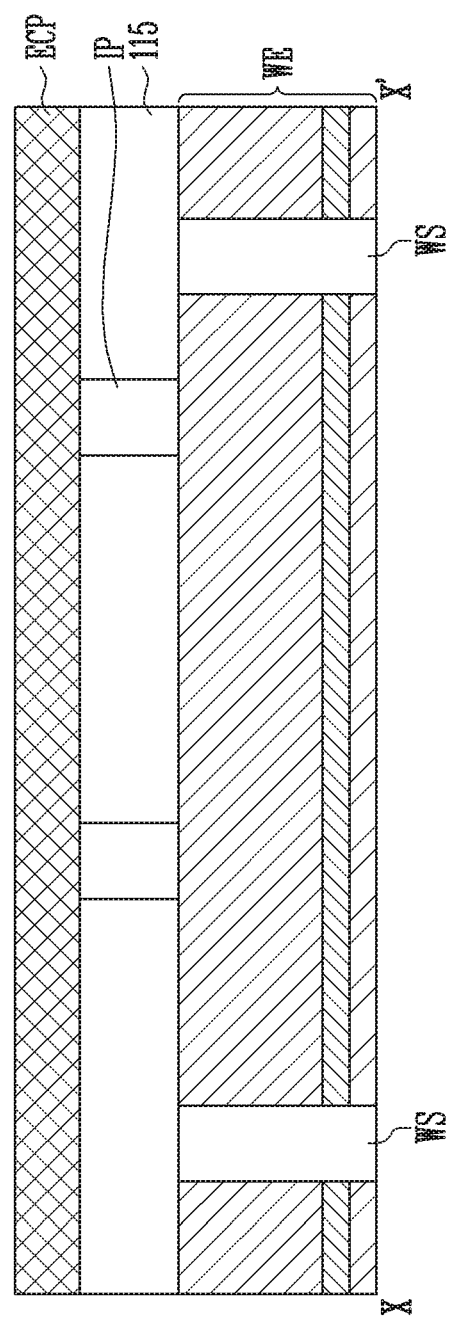

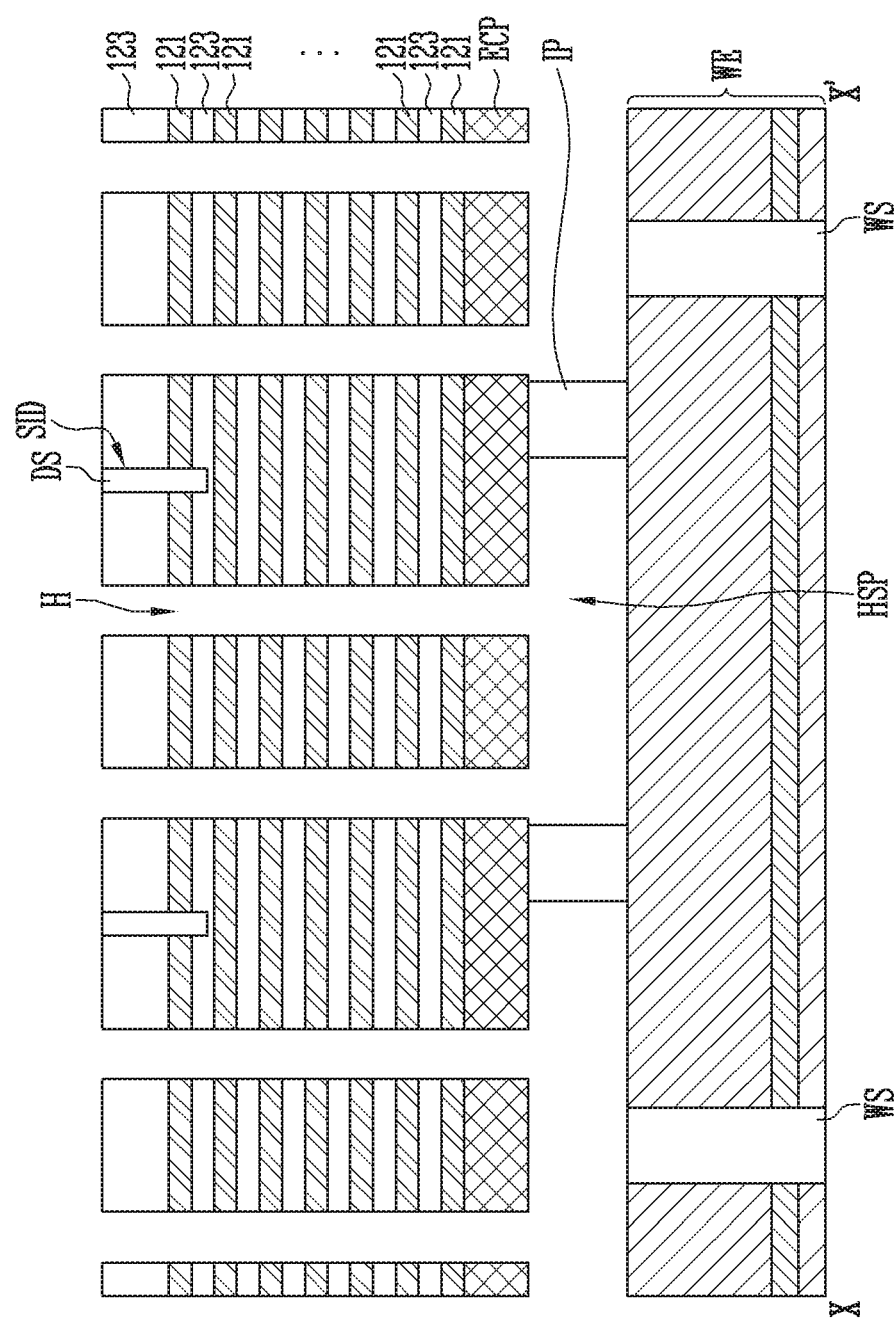

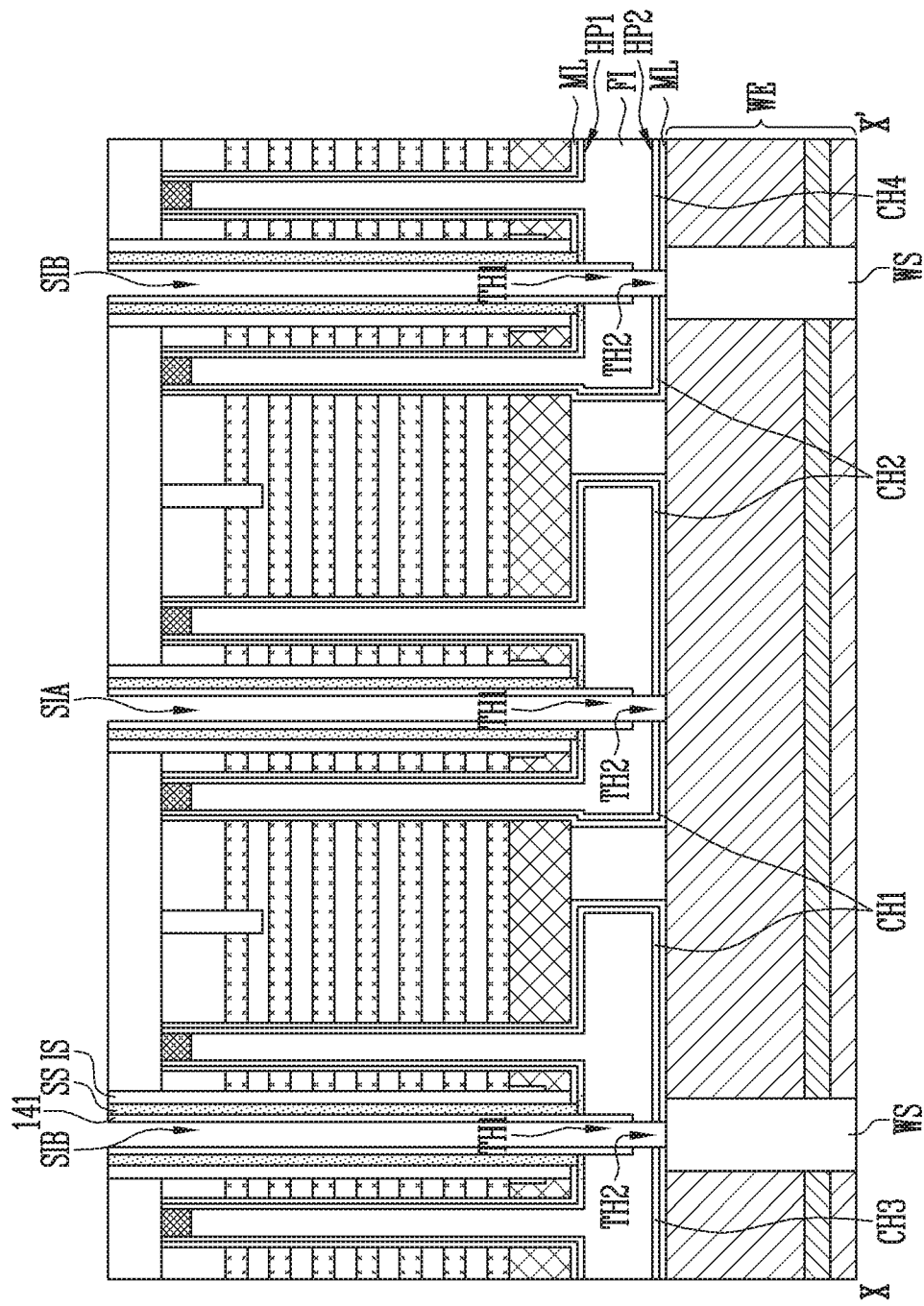

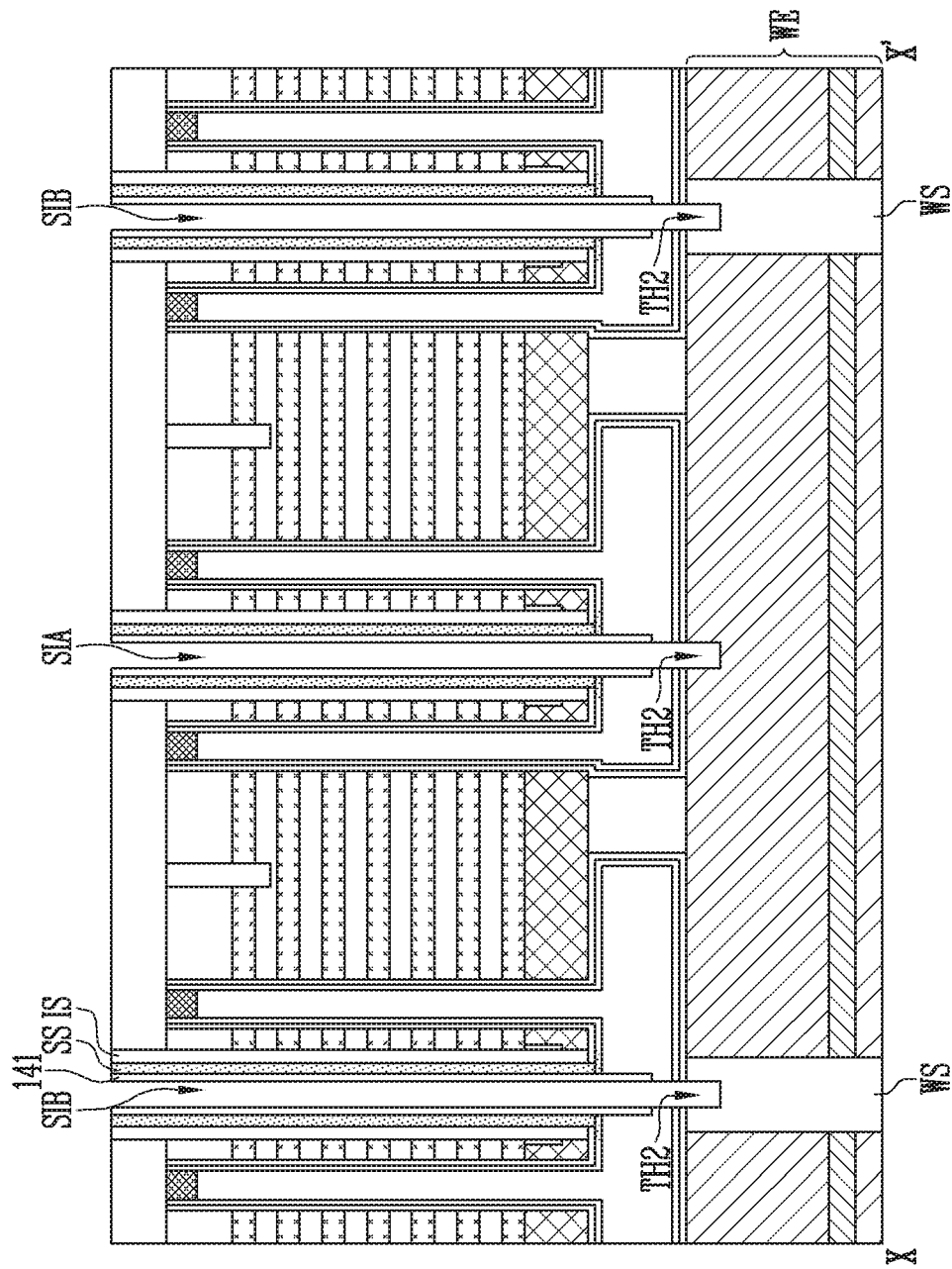

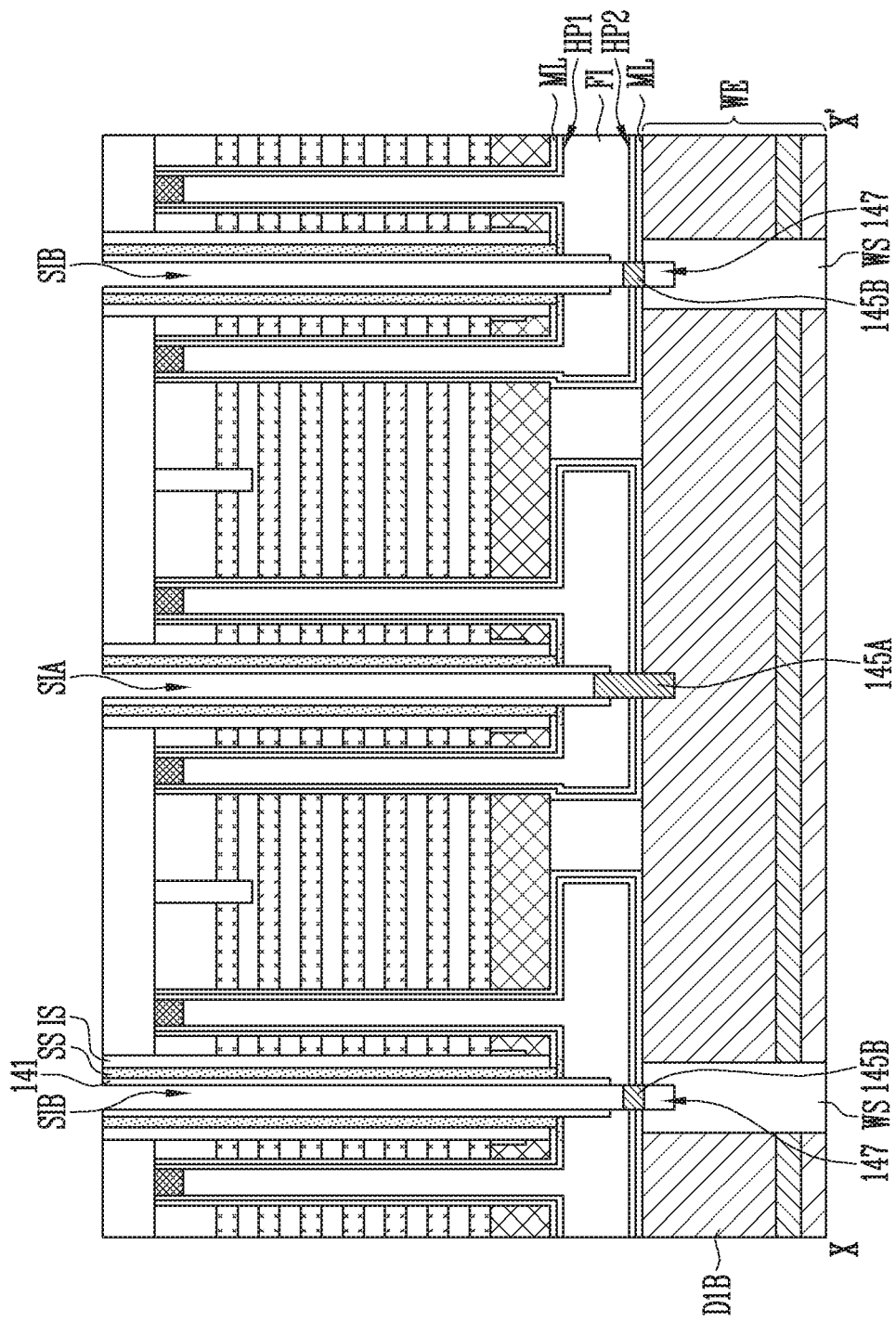

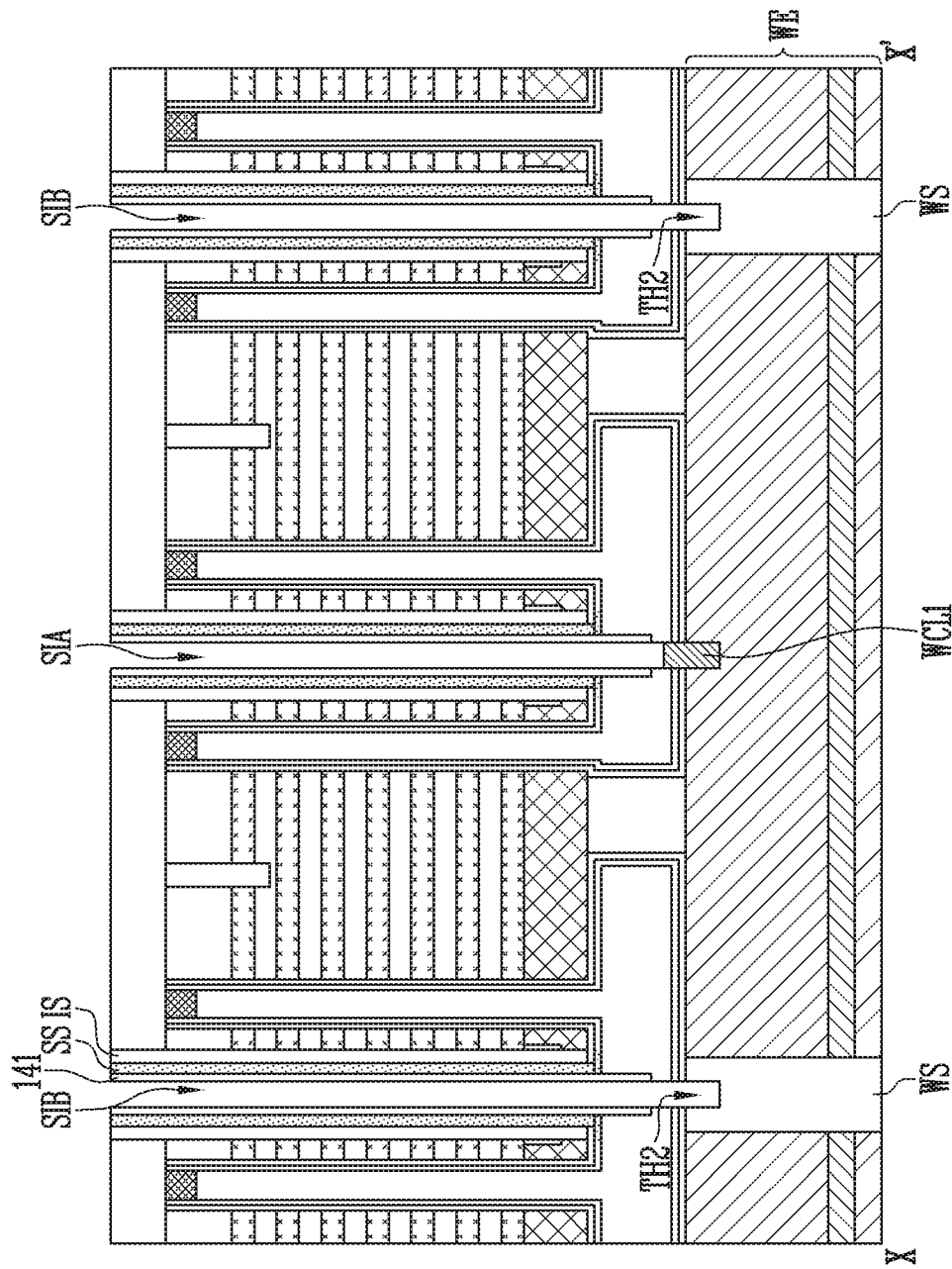

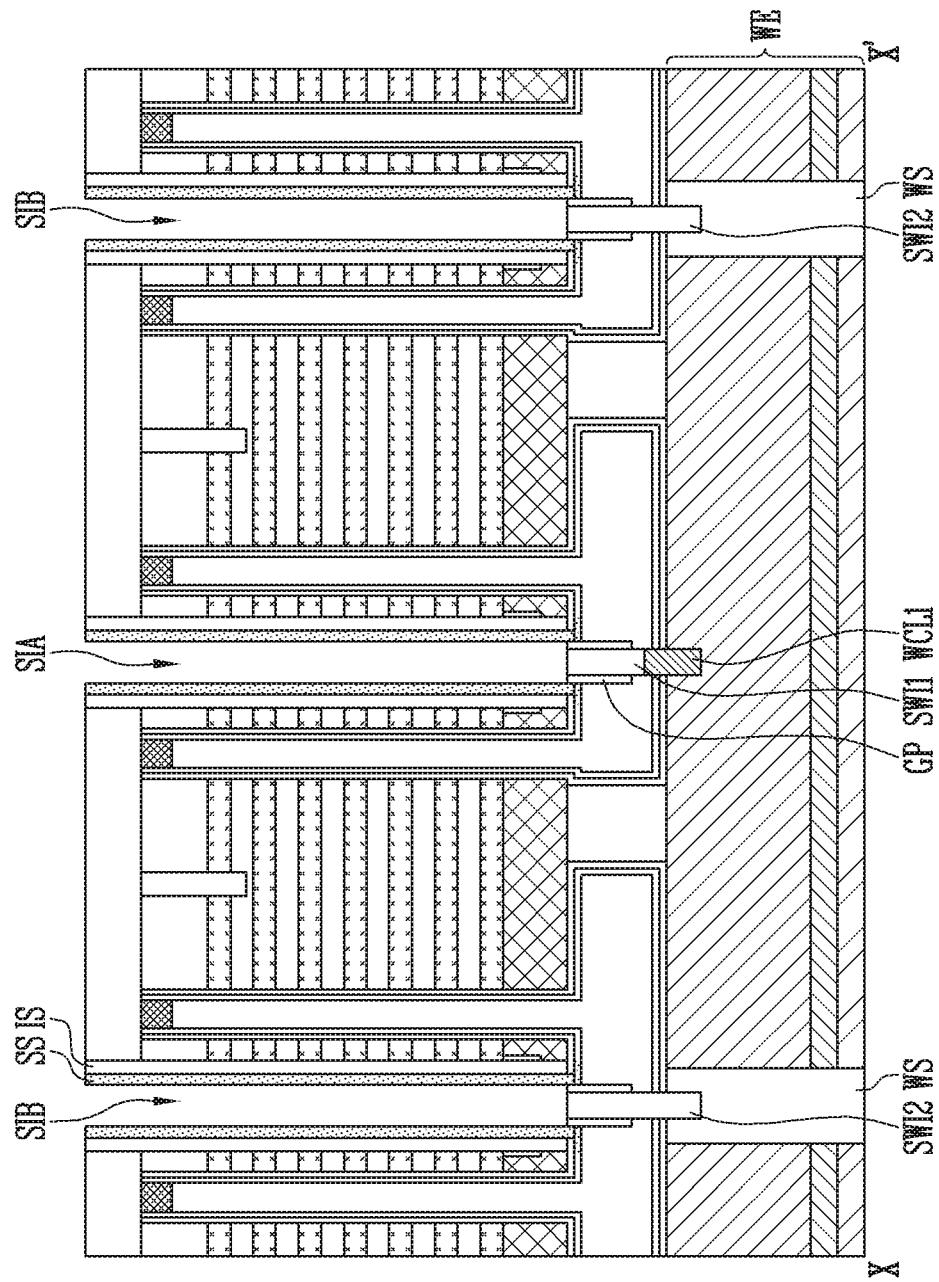

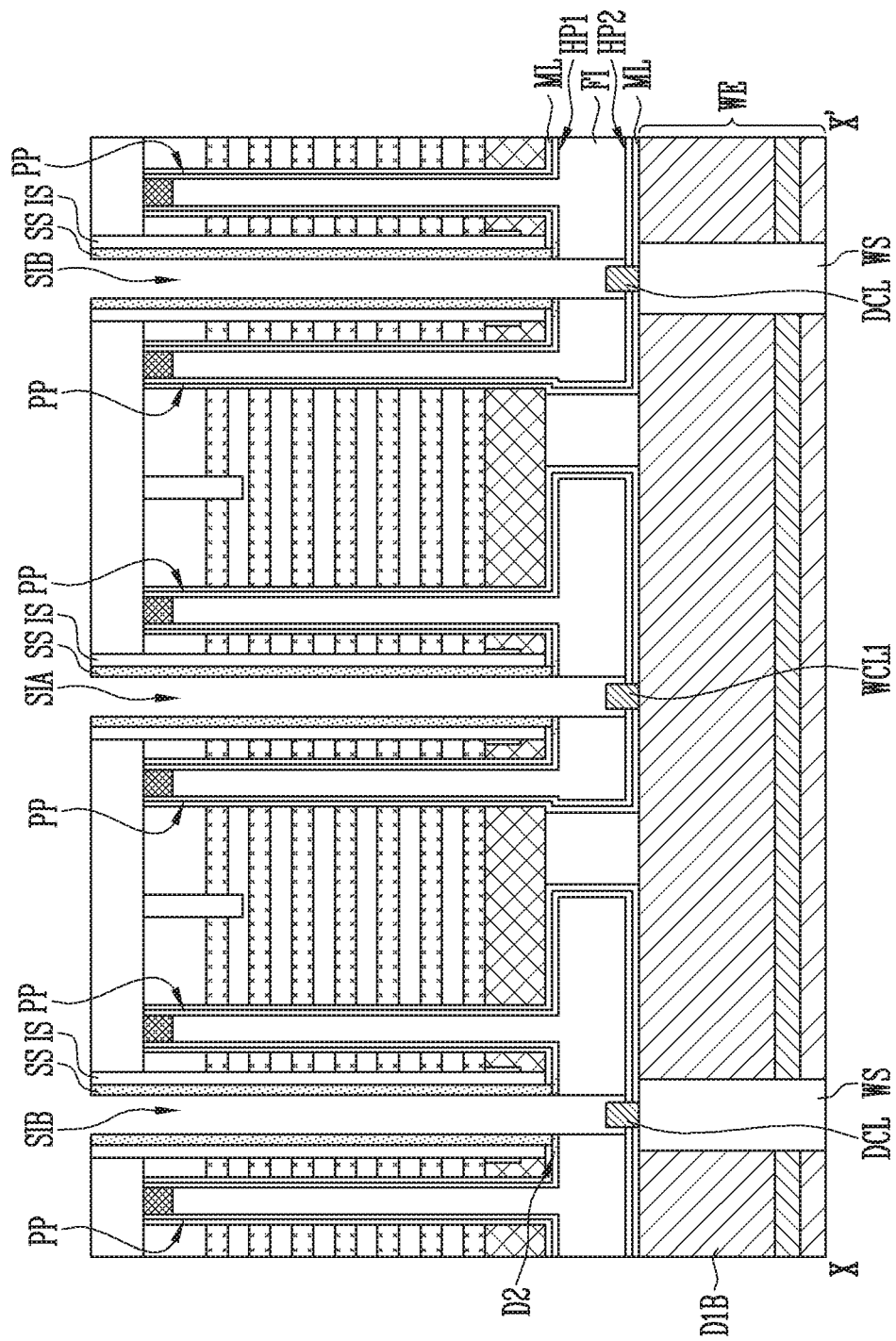

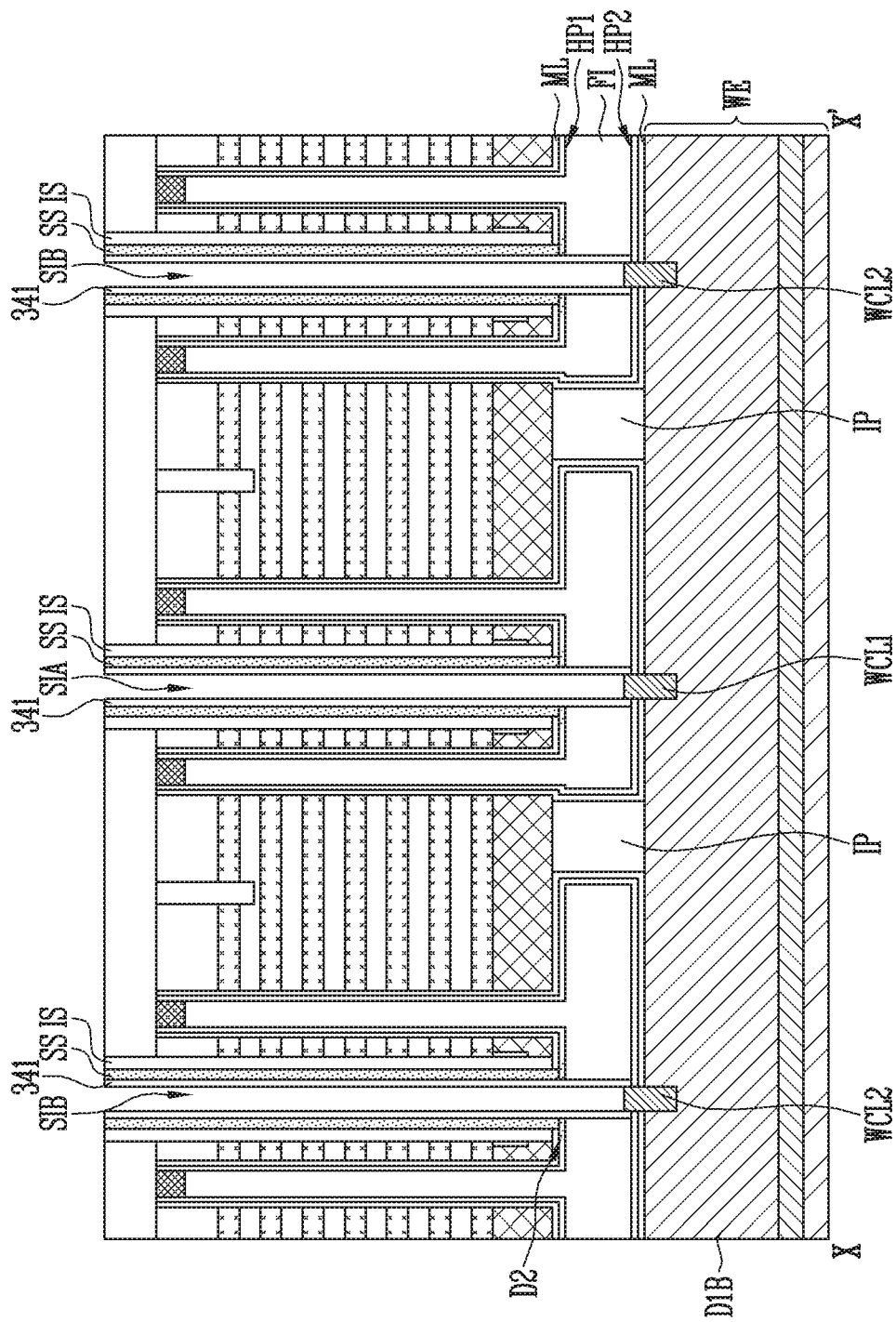

US 10,978,476 B2

SEMICONDUCTOR DEVICE AND METHOD OF MANUFACTURING THE SAME

CROSS-REFERENCE TO RELATED APPLICATION

This application is a continuation of U.S. patent application Ser. No. 15/861,861 filed on Jan. 4, 2018, which claims benefits of priority of Korean Patent Application No. 10-2017-0078577 filed on Jun. 21, 2017. The disclosure of each of the foregoing application is incorporated herein by reference in its entirety.

BACKGROUND

Field of the Invention

Various embodiments of the present disclosure relate to a semiconductor device and a method of manufacturing the same and, more particularly, to a three-dimensional semiconductor memory device and a method of manufacturing the same.

Description of Related Art

A semiconductor device includes a plurality of memory cell transistors capable of storing data. The memory cell transistors may be coupled in series between select transistors to form memory strings. To increase the integration of a semiconductor device, a three-dimensional semiconductor device has been proposed. In a three-dimensional semiconductor, gate electrodes of the memory cell transistors and the select transistors may be stacked on top of one another to form the three-dimensional semiconductor device. Various techniques for improving the operational reliability of three-dimensional semiconductor devices are currently being developed.

SUMMARY

An embodiment of the present disclosure may provide for a semiconductor device including: a first channel pattern comprising a first horizontal part, vertical parts extending from the first horizontal part in a first direction, a connection part extending from the first horizontal part in a direction opposite to the vertical parts, and a second horizontal part extending from the connection part in a direction parallel to the first horizontal part; a first gate stack enclosing the vertical parts of the first channel pattern and disposed over the first horizontal part of the first channel pattern; a well structure disposed under the second horizontal part of the first channel pattern, and including an impurity of a first conductivity type; and a first well contact line directly contacting with the second horizontal part of the first channel pattern and the well structure to couple the second horizontal part of the first channel pattern with the well structure.

An embodiment of the present disclosure may provide for a method of manufacturing a semiconductor device, including: forming a well structure including an impurity of a first conductivity type; forming a channel layer comprising a first horizontal part spaced from the well structure in a first direction and provided parallel to the well structure, a second horizontal part disposed closer to the well structure than is the first horizontal part and provided parallel to the well structure, a connection part extending from the second horizontal part toward the first horizontal part, and vertical parts extending from the first horizontal part in the first direction; forming a first through hole group passing through the first horizontal part; forming a second through hole group coupled to the first through hole group and passing through the second horizontal part; and forming a first well contact line coupling the well structure with the second horizontal part through the second through hole group. These and other features and advantages of the present invention will become apparent to the skilled person from the following detailed description in conjunction with the accompanying drawings.

BRIEF DESCRIPTION OF THE DRAWINGS

FIGS. 6 to 19 are views illustrating a method of manufacturing the semiconductor device illustrated in FIG. 1.

FIGS. 23A to 24 are views illustrating a method of manufacturing the semiconductor device illustrated in FIG. 3.

DETAILED DESCRIPTION

Figure 1:
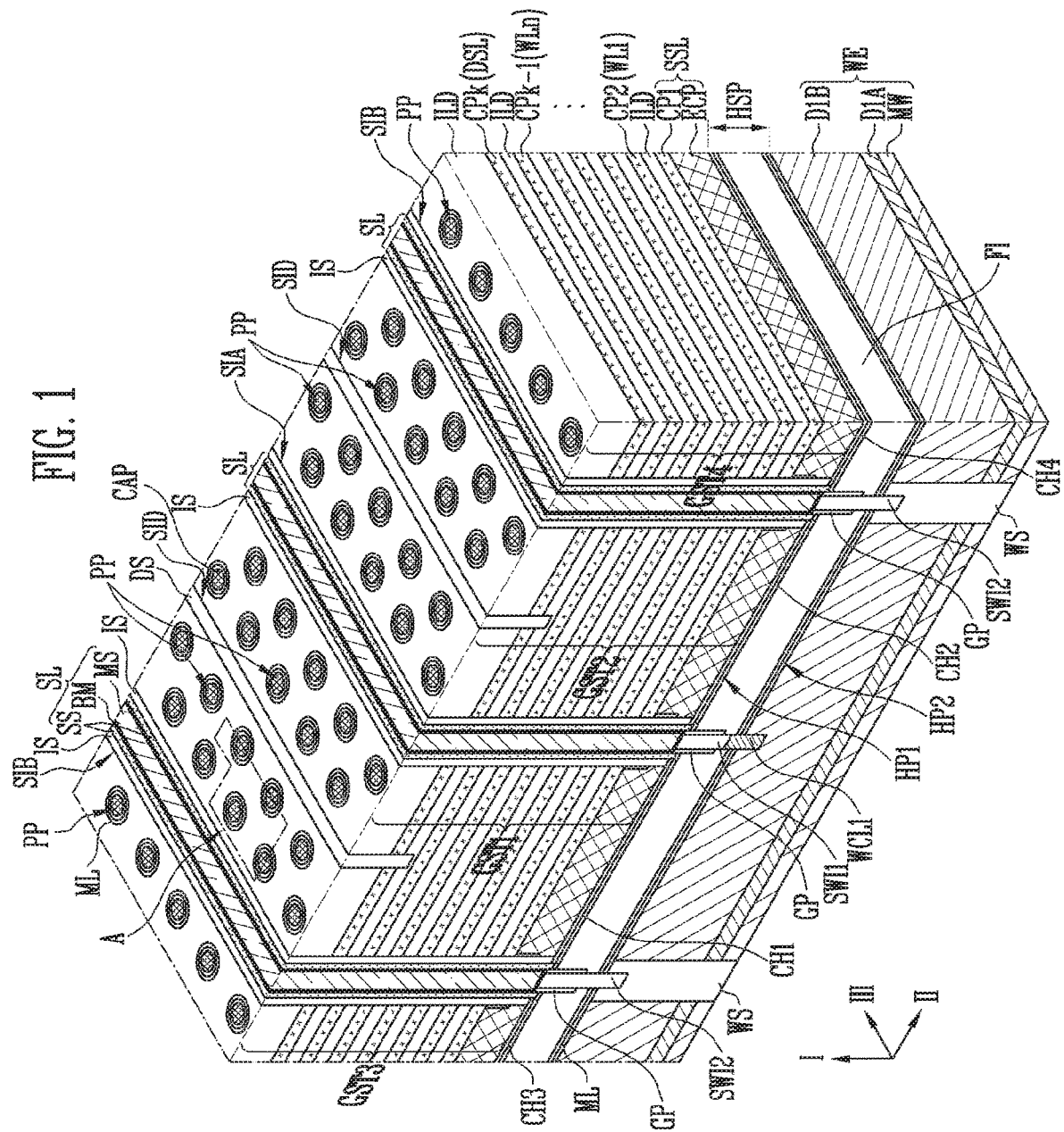
FIGS. 1 to 3 are perspective views illustrating embodiments of a semiconductor device in accordance with the present disclosure.

Hereinafter, embodiments of the present invention will be described with reference to the accompanying drawings. In the figures, for the sake of explanation, the sizes or thicknesses of the elements may be exaggerated compared to the actual physical thicknesses or sizes thereof. In the following description, redundant descriptions and detailed descriptions of known functions and elements that may unnecessarily make the gist of the present invention obscure will be omitted. Reference should now be made to the drawings, in which the same reference numerals are used throughout the different drawings to designate the same or similar components.

Embodiments of the present disclosure provide a three-dimensional semiconductor device which has improved operational reliability, and a method of manufacturing the same.

Figure 2:
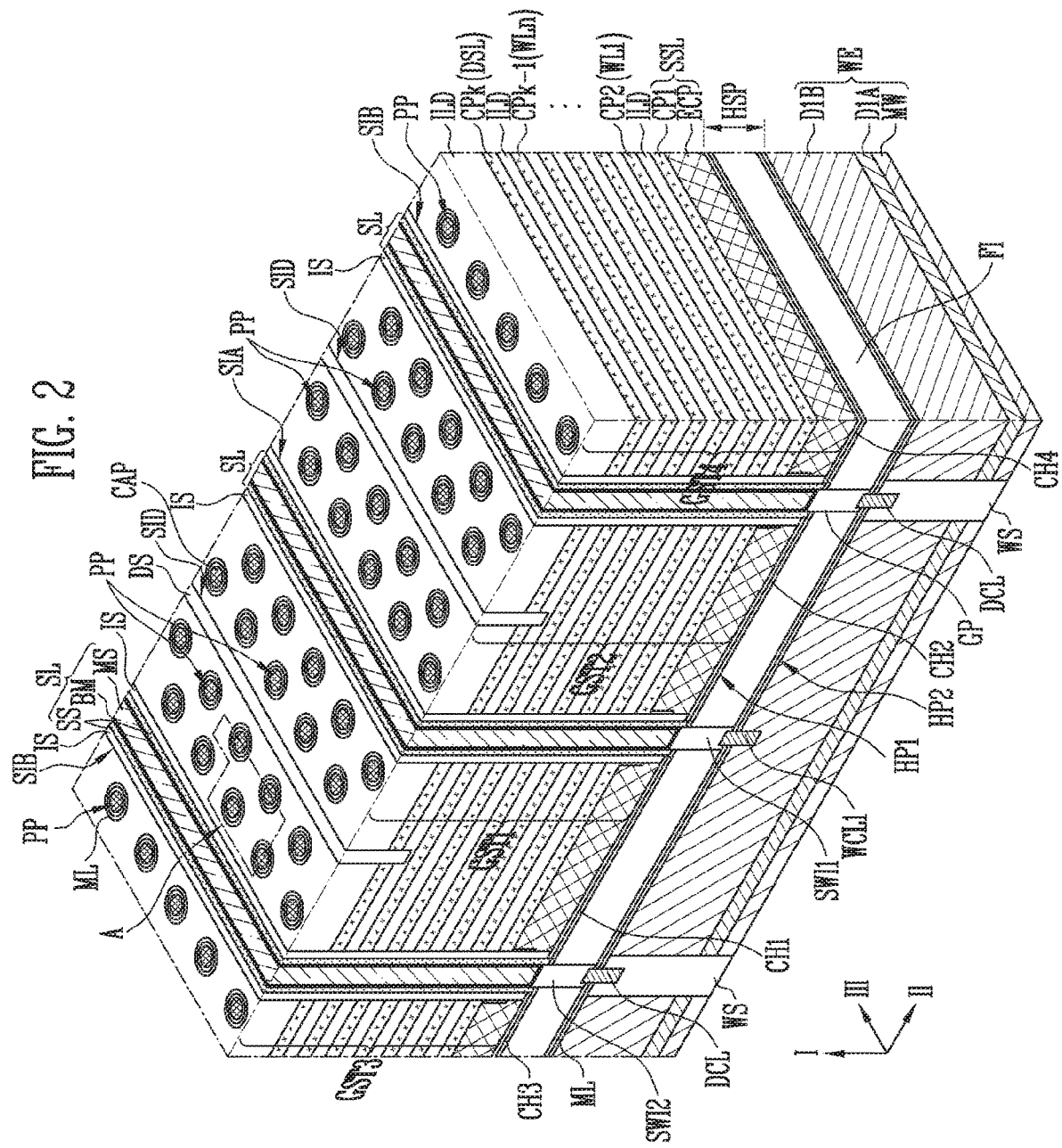
Figure 3:
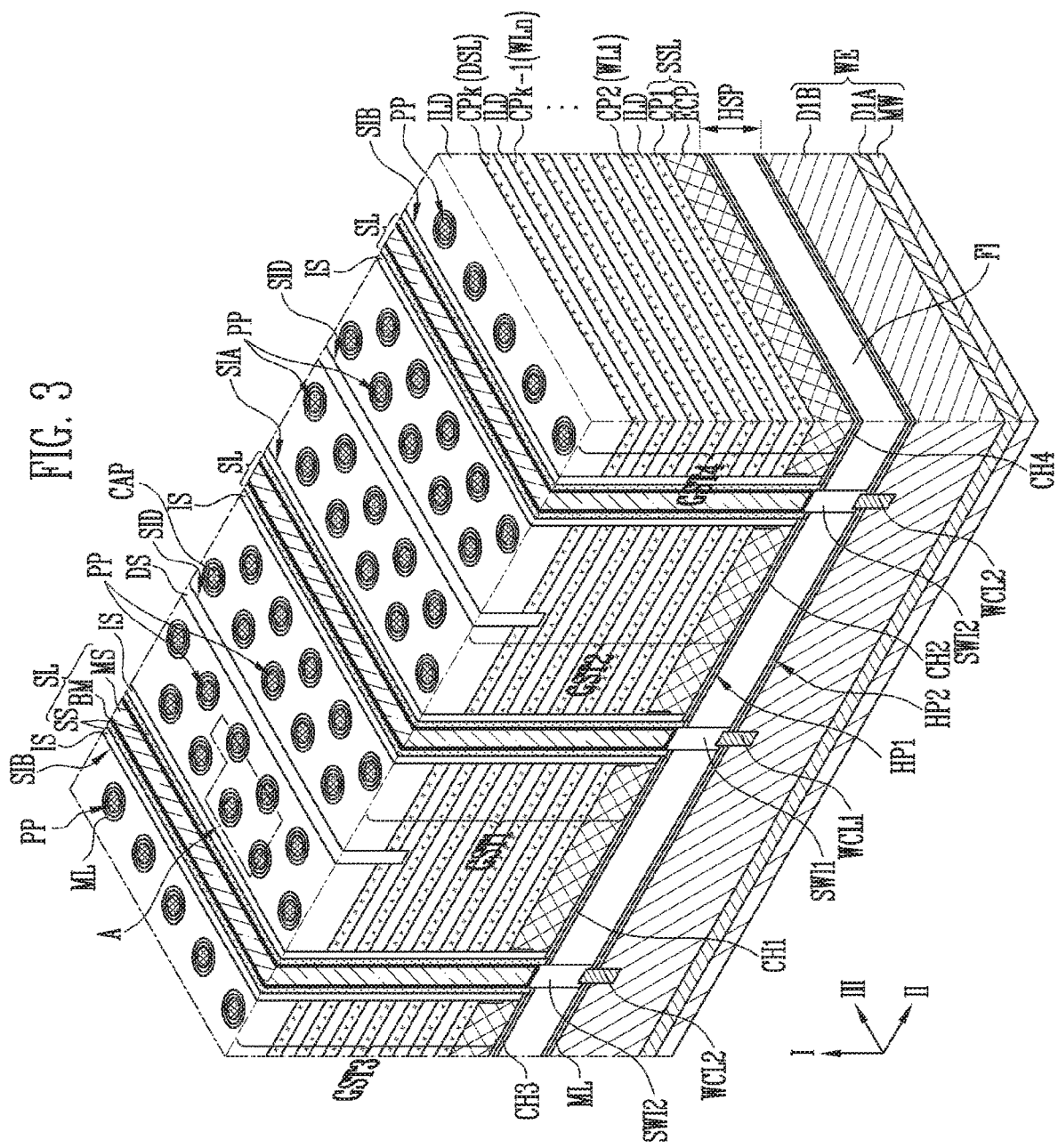

FIGS. 1 to 3 are perspective views illustrating various embodiments of a semiconductor device in accordance with the present disclosure.

Referring to FIGS. 1 to 3, the semiconductor device in accordance with an embodiment of the present disclosure may include channel patterns CH1 to CH4, gate stacks GST1 to GST4 which are respectively coupled to the channel patterns CH1 to CH4 and form transistors arranged three-dimensionally, a well structure WE which is disposed below the gate stacks GST1 to GST4 and include an impurity of a first conductivity type, a first well contact line WCL1 coupled to the well structure WE, and source lines SL each of which is disposed between adjacent ones of the gate stacks GST1 to GST4 and coupled to the corresponding channel patterns CH1 to CH4.

The gate stacks may include first to fourth gate stacks GST1 to GST4. The first and second gate stacks GST1 and GST2 may be included in a first memory block. The third gate stack GST3 may be included in a second memory block adjacent to the first memory block. The fourth gate stack GST4 may be included in a third memory block opposite to the second memory block with the first memory block interposed between the second and third memory block. Although not shown, the semiconductor device in accordance with an embodiment of the present disclosure may further include a plurality of memory blocks as well as the first to third memory blocks.

The first to fourth gate stacks GST1 to GST4 may be separated from each other by first and second slits SIA and SIB. The first slit SIA is disposed between the first gate stack GST1 and the second gate stack GST2 that form one memory block. In other words, each memory block may include the corresponding gate stacks separated from each other by the first slit SIA.

The first and second gate stacks GST1 and GST2 are disposed between the third and fourth gate stacks GST3 and GST4. The third and fourth gate stacks GST3 and GST4 are separated from the first and second gate stacks GST1 and GST2 by the second slits SIB. Hence, the second slits SIB are disposed on boundaries between the memory blocks. In detail, the second slits SIB are disposed on a boundary between the first and second memory blocks and a boundary between the first and third memory blocks and, more specifically, between the first gate stack GST1 and the third gate stack GST3 and between the second gate stack GST2 and the fourth gate stack GST4.

The source lines SL are respectively formed in the first slit SIA and the second slits SIB. The source lines SL may be insulated from the first to fourth gate stacks GST1 to GST4 by insulating spacers IS formed on side surfaces of the first to fourth gate stacks GST1 to GST4.

Each of the source lines SL may include a pair of source semiconductor layers SS, and a metal source line MS formed between the pair of source semiconductor layers SS to fill a corresponding one of the first and second slits SIA and SIB. Each of the source lines SL may further include a barrier metal pattern BM that encloses the metal source line MS along the outer side surfaces and the bottom surface of the metal source line MS.

The source semiconductor layers SS may be formed on the insulating spacers IS. Each of the source semiconductor layers SS includes an impurity of a second conductivity type different from the first conductivity type. The second conductivity type impurity may be an n-type impurity. For example, each of the source semiconductor layers SS may be formed of an n-type doped silicon layer.

The metal source line MS may be formed of low-resistance metal. For example, the metal source line MS may be formed of low-resistance metal such as tungsten. The metal source line MS is disposed between corresponding adjacent source semiconductor layers SS in each of the first and second slits SIA and SIB.

The barrier metal pattern BM may extend both along an interface between the source semiconductor layer SS and the metal source line MS and along a bottom surface of the metal source line MS. The barrier metal pattern BM may be formed of a material layer capable of preventing metal from diffusing from the metal source line MS. For example, the barrier metal pattern BM may include at least any one of a titanium nitride layer, a tungsten nitride layer, and a tantalum nitride layer.

The channel patterns CH may include a first channel pattern CH1 coupled to the first gate stack GST1, a second channel pattern CH2 coupled to the second gate stack GST2, a third channel pattern CH3 coupled to the third gate stack GST3, and a fourth channel pattern CH4 coupled to the fourth gate stack GST4. The first to fourth channel patterns CH1 to CH4 may be spaced apart from each other so that they are structurally separated from each other.

Each of the first to fourth channel patterns CH1 to CH4 may extend in a first direction I, a second direction II intersecting the first direction I, and a third direction III intersecting the first and second directions I and II. The first to fourth channel patterns CH1 to CH4 may have the same shape.

In detail, each of the first to fourth channel patterns CH1 to CH4 may be formed in an integrated pattern in which a first horizontal part HP1, a second horizontal part HP2, connection parts (not shown), and vertical parts PP are integrally coupled with each other.

The first horizontal part HP1 and the second horizontal part HP2 may extend parallel with each other. The first horizontal part HP1 and the second horizontal part HP2 may extend in the second and third directions II and III in a horizontal space HSP, the horizontal space HSP defined under the first to fourth gate stacks GST1 to GST4. The horizontal space HSP is a space defined between the well structure WE and the first to fourth gate stacks GST1 to GST4. The first horizontal part HP1 is a part of a channel layer formed along an upper surface of the horizontal space HSP adjacent to the first to fourth gate stacks GST1 to GST4. The second horizontal part HP2 is a part of a channel layer formed along a lower surface of the horizontal space HSP adjacent to the well structure WE. According to this structure, the second horizontal part HP2 is disposed at a position closer to the well structure WE than is the first horizontal part HP1 and disposed at a position farther from the first to fourth gate stacks GST1 to GST4 than is the first horizontal part HP1.

The connection parts couple the first horizontal part HP1 with the second horizontal part HP2. The connection parts will be described in more detail later with reference to FIG. 4A.

The vertical parts PP protrude from the first horizontal part HP1 and extend in the first direction I. The vertical parts PP of the first to fourth channels CH1 to CH4 pass through the first to fourth gate stacks GST1 to GST4.

An outer surface of each of the first to fourth channel patterns CH1 to CH4 may be enclosed by a multilayer memory layer ML. Each of the vertical parts PP of the first to fourth channel patterns CH1 to CH4 may have an upper end enclosing a capping pattern CAP.

The first horizontal part HP1 of each of the first to fourth channel patterns CH1 to CH4 may extend to contact the lower ends of the corresponding insulating spacers IS and the lower ends of the corresponding source semiconductor layers SS. The first horizontal part HP1 comes into direct contact with the source semiconductor layers SS that are disposed over the first horizontal part HP1. Hence, the first to fourth channel patterns CH1 to CH4 may come into direct contact with the source semiconductor layers SS. The source semiconductor layers SS extend along the side surfaces of the first to fourth gate stacks GST1 to GST4.

The first horizontal part HP1 of each of the first to fourth channel patterns CH1 to CH4 may include source junctions having second conductivity impurities. The source junctions will be described in detail later with reference to FIGS. 18, 19, 22, and 24.

The first to fourth gate stacks GST1 to GST4 enclose the respective vertical parts PP of the first to fourth channel patterns CH1 to CH4 and are disposed on the respective first horizontal parts HP1 of the first to fourth channel patterns CH1 to CH4. For example, the first gate stack GST1 encloses the vertical parts PP of the first channel pattern CH1 and is disposed on the first horizontal part HP1 of the first channel pattern CH1.

Each of the first to fourth gate stacks GST1 to GST4 includes conductive layers ECP, and CP1 to CPk and interlayer insulating layers ILD that enclose the corresponding vertical parts PP. The conductive layers ECP, and CP1 to CPk correspond to gate lines SSL, WL1 to WLn, and DSL which are used as gate electrodes of the transistors. The gate lines SSL, WL1 to WLn, and DSL and the interlayer insulating layers ILD enclose the vertical parts PP and are alternately stacked in the first direction I.

The conductive layers ECP, and CP1 to CPk may include an etch stop conductive layer ECP, and second conductive layers CP1 to CPk. The etch stop conductive layer ECP may be adjacent to the first horizontal part HP1 and be formed of a first conductive material. The second conductive layers CP1 to CPk may be a group of conductive layers formed of the same conductive material, and may be formed of a conductive material different than the first conductive material.

The etch stop conductive layer ECP may be formed of conductive material which can function as an etch stop layer, taking into account a process of forming the first and second slits SIA and SIB. For example, the etch stop conductive layer ECP may be formed of a doped silicon layer including a second conductivity type impurity. The second conductivity type impurity may be an n-type impurity. The etch stop conductive layer ECP is formed to be thick enough to function as an etch stop layer during an etching process of forming the first and second slits SIA and SIB. The etch stop conductive layer ECP may have a thickness greater than that of each of the second conductive layers CP1 to CPk.

The second conductive layers CP1 to CPk may be formed of conductive material having resistance lower than that of the etch stop conductive layer ECP. In more detail, the second conductive layers CP1 to CPk may include a metal layer having low resistance. For example, the second conductive layers CP1 to CPk may include tungsten.

The etch stop conductive layer ECP is used as a source select line SSL. Among the second conductive layers CP1 to CPk, the lowermost second conductive layer CP1 disposed closest to the etch stop conductive layer ECP is used as a source select line SSL. The etch stop conductive layer ECP and the lowermost second conductive layer CP1 may be electrically coupled with each other, thus forming a single source select line SSL. Among the second conductive layers CP1 to CPk, the uppermost second conductive layer CPk disposed farthest from the etch stop conductive layer ECP is used as a drain select line DSL. The second conductive layers CP2 to CPk−1 between the drain select line DSL and the source select line SSL may be used as word lines WL1 to WLn.

In FIGS. 1 to 3, there is illustrated the case where the single second conductive layer CP1 is used as the source select line SSL and the single second conductive layer CPk is used as the drain select line DSL, but the present disclosure is not limited to this. In other words, among the second conductive layers CP1 to CPk, one or more second conductive layers that are disposed successively upward from the lowermost second conductive layer CP1 may be used as the source select line SSL. One or more second conductive layers that are disposed successively downward from the uppermost second conductive layer CPk may be used as the drain select line DSL. The word lines WL1 to WLn are stacked between the source select line SSL and the drain select line DSL and spaced apart from each other.

Each interlayer insulating layer ILD may be formed of an insulating material such as an oxide layer. Each interlayer insulating layer ILD may be disposed between corresponding gate lines SSL, WL1 to WLn, and DSL disposed adjacent to each other in the first direction I.

The source select line SSL and the word lines WL1 to WLn may be disposed between corresponding adjacent first and second slits SIA and SIB. A drain separation slit SID may further be disposed between the adjacent first and second slits SIA and SIB. The drain separation slit SID extends from the top of each gate stack GST1 and GST2 to pass through the top interlayer insulating layer and the conductive layer (e.g., CPk) which forms the drain select line DSL. The drain separation slit SID may extend partially into the interlayer insulating layer ILD that is next to the drain select line conductive layer (e.g., CPk) in a downward I direction. The drain separation slit SID is filled with a drain separation insulating layer SD. Drain select lines DSL disposed on the same layer between adjacent first and second slits SIA and SIB are separated from each other by the drain separation insulating layer SD. The depths of the drain separation slit SID and the drain separation insulating layer SD may be controlled such that they do not pass through the source select line SSL and the word lines WL1 to WLn.

The source line SL, the source semiconductor layers SS, the barrier metal pattern BM, the metal source line MS, the insulating spacer IS, the drain separation slit SID, the drain separation insulating layer SD, the first slit SIA, and the second slits SIB may extend in the third direction III.

The vertical parts PP passing through each of the first to fourth gate stacks GST1 to GST4 may be arranged in a zigzag manner, and may be arranged in the form of a matrix including a plurality of columns and a plurality of rows.

The well structure WE is disposed under the second horizontal part HP2. The well structure WE may include at least one doped semiconductor layer such as a doped silicon layer including a first conductivity type impurity. For example, the well structure WE may be formed of a stack structure including a metal layer MW coupled with a driving circuit unit (not shown), a first doped silicon layer D1A having a first conductivity type impurity at a first concentration, and a second doped silicon layer D1B having a first conductivity type impurity at a second concentration. The first doped silicon layer D1A is between the metal layer MW and the second doped silicon layer D1B. The first concentration may be higher than the second concentration. The first conductivity type impurity may be a p-type impurity. Although not shown, the driving circuit unit may be formed on a substrate under the well structure WE such that it overlaps the well structure WE.

The first well contact line WCL1 comes into direct contact with the well structure WE and extends in the first direction I. The first well contact line WCL1 may protrude further than the second horizontal part HP2 of each of the first to fourth channel patterns CH1 to CH4 toward the metal source line MS. The first well contact line WCL1 may extend into the horizontal space HSP.

The first well contact line WCL1 comes into direct contact with the second horizontal part HP2 of each of the first and second channel patterns CH1 and CH2 that are adjacent to each other. In this way, the first well contact line WCL1 may electrically couple the well structure WE with the second horizontal part HP2. The first well contact line WCL1 may be formed of a conductive material, for example, a silicon layer.

The first well contact line WCL1 overlaps the first slit SIA and extends in the third direction III in the same manner as that of the first slit SIA. More specifically, the first well contact line WCL1 may overlap the metal source line MS that is disposed between the first gate stack GST1 and the second gate stack GST2. In other words, the first well contact line WCL1 may be substantially aligned in the first direction I with the metal source line MS. The first well contact line WCL1 is disposed under the metal source line MS. A first inter-well-source insulating pattern SWI1 may further be disposed between the metal source line MS and the first well contact line WCL1. Thereby, the metal source line MS and the first well contact line WCL1 may be insulated from each other. The first inter-well-source insulating pattern SWI1 extends in the third direction III in the same manner as that of the first slit SIA. The first inter-well-source insulating pattern SWI1 and the first well contact line WCL1 may structurally separate the first channel pattern CH1 and the second channel pattern CH2 from each other.

Second inter-well-source insulating patterns SWI2 may overlap the respective metal source lines MS that fill the second slits SIB. The second inter-well-source insulating patterns SWI2 are disposed under the metal source lines MS. The second inter-well-source insulating patterns SWI2 extend in the third direction III in the same manner as that of the second slits SIB.

The first inter-well-source insulating pattern SWI1 and the second inter-well-source insulating patterns SWI2 may protrude further than the first horizontal part HP1 toward the metal source lines MS. The first inter-well-source insulating pattern SWI1 and the second inter-well-source insulating patterns SWI2 may penetrate through the first horizontal part HP1 to contact directly the barrier metal patterns BM of the source lines SL.

Hereinafter, structural differences between the embodiments will be described in detail.

Referring to FIGS. 1 and 2, the well structure WE may be divided into a plurality of block patterns by the well separation insulating layers WS. Among the block patterns, the block pattern that forms the first memory block may extend to overlap the first and second gate stacks GST1 and GST2.

The well separation insulating layers WS may be disposed on boundaries between the memory blocks. In more detail, the well separation insulating layers WS overlap the second slits SIB and the second inter-well-source insulating patterns SWI2 and extend along with the second slits SIB in the third direction III. In the case where the well structure WE is divided into the plurality of block patterns, an erase voltage may be separately supplied to each block pattern, whereby current consumption during an erase operation of the semiconductor device may be reduced.

Referring to FIG. 1, the second inter-well-source insulating patterns SWI2 may structurally separate the adjacent first and third channel patterns CH1 and CH3 from each other, and structurally separate the adjacent second and fourth channel patterns CH2 and CH4 from each other. The second inter-well-source insulating patterns SWI2 may extend toward the second slits SIB from the interiors of the respective well separation insulating layers WS.

The first inter-well-source insulating pattern SWI1 may have a side surface that is collinear with a side surface of the first well contact line WCL1, and may be disposed between the first well contact line WCL1 and the corresponding metal source line MS. The first inter-well-source insulating pattern SWI1 may be shorter than the second inter-well-source insulating patterns SWI2 with respect to the first direction I. The contact interface between the first inter-well-source insulating pattern SWI1 and the first well contact line WCL1 may lie within the gap fill pattern FI of the horizontal space HSP.

A growth protection pattern GP may further be formed on a side surface of each of the first inter-well-source insulating pattern SWI1 and the second inter-well-source insulating pattern SWI2. The first inter-well-source insulating pattern SWI1 may protrude farther than the growth protection pattern GP toward the well structure WE. The second inter-well-source insulating patterns SWI2 may protrude farther than the growth protection pattern GP toward the well separation insulating layers WS and extend into the corresponding well separation insulating layers WS.

Each growth protection pattern GP may extend along an interface between the corresponding one of the first and second inter-well-source insulating patterns SWI1 and SWI2 and the associated source semiconductor layer SS. The side surface of each of the first and second inter-well-source insulating patterns SWI1 and SWI2 that protrude further than the first horizontal part HP1 may be covered with the corresponding growth protection pattern GP.

Referring to FIG. 2, the first inter-well-source insulating pattern SWI1 may extend toward the second horizontal part HP2 to cover the side surface of the first well contact line WLC1 which extends into the gap fill pattern FI of the horizontal space HSP.

Dummy contact lines DCL may further be disposed between the second inter-well-source insulating patterns SWI2 and the well separation insulating layers WS. The dummy contact lines DCL may be formed of the same conductive material as that of the first well contact line WCL1.

Each of the dummy contact lines DCL may include a lower end protruding further than the second horizontal part HP2 toward the well separation insulating layer WS, and an upper end protruding further than the second horizontal part HP2 toward the metal source line MS in the second slit SIB. The upper end of each of the dummy contact lines DCL may be covered with the corresponding second inter-well-source insulating pattern SWI2.

The second inter-well-source insulating patterns SWI2 and the dummy contact lines DCL may structurally separate the adjacent first and third channel patterns CH1 and CH3 from each other, and structurally separate the adjacent second and fourth channel patterns CH2 and CH4 from each other.

The first inter-well-source insulating pattern SWI1 and the second inter-well-source insulating patterns SWI2 may come into direct contact with the side surfaces of the corresponding source semiconductor layers SS that protrude farther than the metal source lines MS toward the well structure WE.

Referring to FIG. 3, the well structure WE may be shared with the first to fourth gate stacks GST1 to GST4 without being divided into a plurality of block patterns. In this case, the well structure WE may extend to overlap the first to fourth gate stacks GST1 to GST4 and the first and second slits SIA and SIB.

Second well contact lines WCL2 may further be disposed between the second inter-well-source insulating patterns SWI2 and the well structure WE. The second well contact lines WCL2 may extend from the well structure WE toward the second slits SIB and protrude further than the second horizontal part HP2. The second well contact lines WCL2 may come into direct contact with the well structure WE and the second horizontal part HP2 and electrically couple the well structure WE with the second horizontal part HP2. The second well contact lines WCL2 may be formed of the same conductive material as that of the first well contact line WCL1.

The first inter-well-source insulating pattern SWI1 and the second inter-well-source insulating patterns SWI2 may extend toward the second horizontal part HP2 and cover side surfaces of the first and second well contact lines WCL1 and WCL2.

The second inter-well-source insulating patterns SWI2 and the second well contact lines WCL2 may structurally separate the adjacent first and third channel patterns CH1 and CH3 from each other, and structurally separate the adjacent second and fourth channel patterns CH2 and CH4 from each other.

The first inter-well-source insulating pattern SWI1 and the second inter-well-source insulating patterns SWI2 may protrude through the first horizontal part HP1 to come into direct contact with the bottom surface of the respective barrier metal patterns BM and with the side surfaces of the corresponding source semiconductor layers SS that protrude farther than the metal source lines MS toward the well structure WE.

According to the embodiments described with reference to FIGS. 1 to 3, source select transistors may be defined at the intersections between the vertical parts PP and the source select line SSL, memory cell transistors may be defined at the intersections between the vertical parts PP and the word lines WL1 to WLn, and the drain select transistors may be defined at the intersections between the vertical parts PP and the drain select line DSL. The memory cell transistors may be three-dimensionally arranged along the first to third directions I to III to form a three-dimensional semiconductor device.

According to the embodiments described with reference to FIGS. 1 to 3, each of the channel patterns CH1 to CH4 includes the first horizontal part HP1 and the second horizontal part HP2. The first horizontal part HP1 is electrically coupled to the source line SL including a second conductivity type impurity. The second horizontal part HP2 is coupled to the well structure WE including a first conductivity type impurity through at least one or more well contact lines WCL1 and WCL2. In other words, each of the channel patterns CH1 to CH4 includes a source-side terminal coupled with the source line SL, and a well-side terminal coupled to the well structure WE. The source-side terminal and the well-side terminal are structurally separated from each other. Therefore, during a program operation or a read operation, the flow of current may be controlled by a voltage applied to the source lines SL. During an erase operation, holes may be supplied through the well structure WE. Thereby, in an embodiment of the present disclosure, the operational characteristics of the semiconductor device may be enhanced.

The well contact lines WCL1 and WCL2 may be insulated from the source lines SL through the inter-well-source insulating patterns SWI1 and SWI2. Consequently, during a program operation, even when the voltage to be applied to the source lines SL is increased to reduce leakage current of a program inhibit mode, current consumption in the well structure WE may be reduced. In this case, since it is easy to control the leakage current of the program inhibit mode, the operational characteristics of the semiconductor device in accordance with an embodiment of the present disclosure may be improved.

Figure 4A:
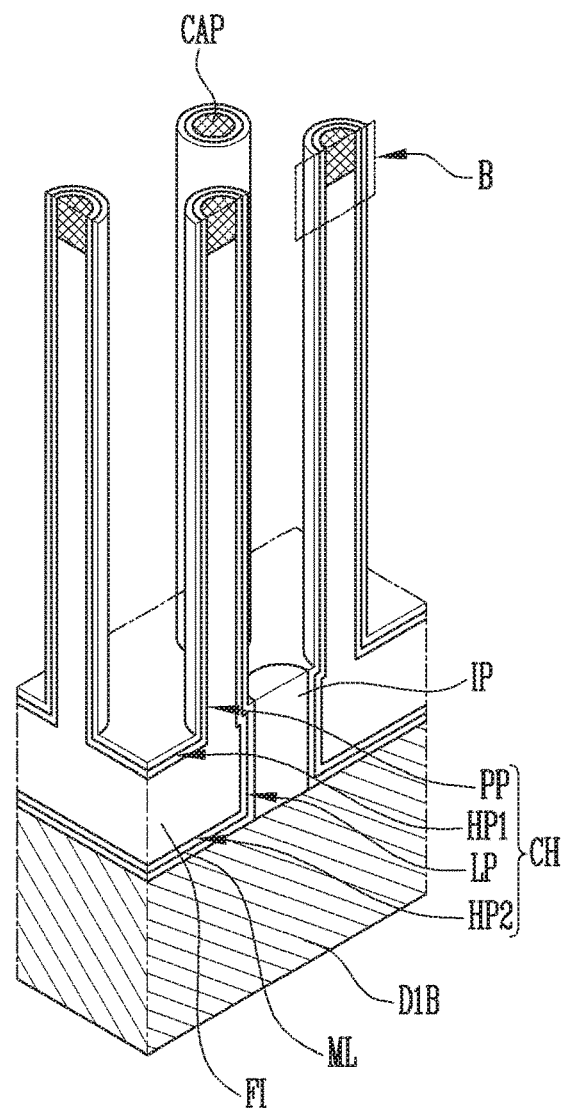
FIGS. 4A and 4B are views illustrating the structure of a channel pattern in accordance with an embodiment of the present disclosure.
Figure 4B:
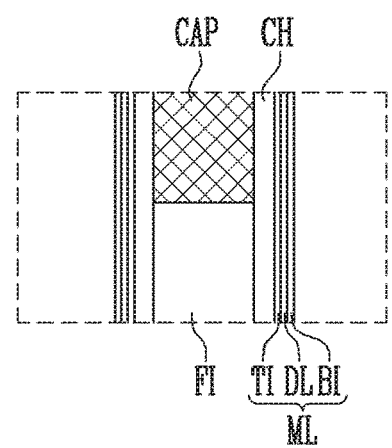

FIGS. 4A and 4B are views illustrating the structure of a channel pattern CH in accordance with an embodiment of the present disclosure. In detail, FIG. 4A is a perspective view illustrating the structure of the channel pattern CH corresponding to portion A shown in FIGS. 1 to 3. FIG. 4B is an enlarged sectional view of portion B of FIG. 4A. The structure of the channel pattern CH shown in FIGS. 4A and 4B may be applied to each of the first to fourth channel patterns CH1 to CH4 described with reference to FIGS. 1 to 3.

Referring to FIG. 4A, the channel pattern CH may include a first horizontal part HP1, vertical parts PP extending from the first horizontal part HP1 in the first direction I, a connection part LP extending from the first horizontal part HP1 in a direction opposite to the vertical parts PP, and a second horizontal part HP2 extending from the connection part LP in a direction parallel to the first horizontal part HP1. The second horizontal part HP2 is a part disposed adjacent to the second doped silicon layer D1B of the well structure. The connection part LP is a part extending from the first horizontal part HP1 toward the second horizontal part HP2 and is formed to enclose an insulating pillar IP. The first horizontal part HP1, the vertical parts PP, the connection part LP, and the second horizontal part HP2 may form a channel pattern CH with an integrated structure without having a separate interface.

An outer surface of the channel pattern CH may be enclosed by a multilayer memory layer ML. The multilayer memory layer ML extends along the surfaces of the first horizontal part HP1, the vertical parts PP, the connection part LP, and the second horizontal part HP2. The channel pattern CH may be formed in such a way as to enclose a gap-fill pattern FI. The gap-fill pattern FI that are enclosed by the vertical parts PP may extend to fill horizontal internal space between the first and second horizontal parts HP1 and HP2.

The gap-fill pattern FI may have a height lower than the vertical parts PP. In this case, capping patterns CAP that are enclosed by the respective vertical parts PP may be disposed on the gap-fill pattern FI. Each of the capping patterns CAP may be formed of a semiconductor layer including a second conductivity type impurity. For example, each of the capping patterns CAP may be formed of a doped silicon layer doped with an n-type impurity. Each of the capping patterns CAP may be used as a drain junction.

The insulating pillar IP has a side surface enclosed by the connection part LP of the channel pattern CH. The multilayer memory layer ML extends between the connection part LP and the insulating pillar IP.

Referring to FIG. 4B, the channel pattern CH may have an inner surface facing the capping pattern CAP and the gap-fill pattern FI, and an outer surface facing away from the inner surface. The multilayer memory layer ML may enclose the outer surface of the channel pattern CH.

The multilayer memory layer ML may include a tunnel insulating layer TI enclosing the channel pattern CH, a data storage layer DL enclosing the tunnel insulating layer TI, and a blocking insulating layer BI enclosing the data storage layer DL. The data storage layer DL may store data to be changed using Fowler-Nordheim tunneling caused by a voltage difference between the channel pattern CH and the word lines WL1 to WLn shown in FIGS. 1 to 3. For this operation, the data storage layer DL may be formed of various materials, for example, a nitride layer capable of trapping charges. In addition, the data storage layer DL may include silicon, phase-change material, nanodots, etc. The blocking insulating layer BI may include an oxide layer capable of blocking charges.

A part of the multilayer memory layer ML disposed between the channel pattern CH and the drain select line DSL described with reference to FIGS. 1 to 3, and a part of the multilayer memory layer ML disposed between the channel pattern CH and the source select line SSL described with reference to FIGS. 1 to 3 may be used as a gate insulating layer.

Figure 5:
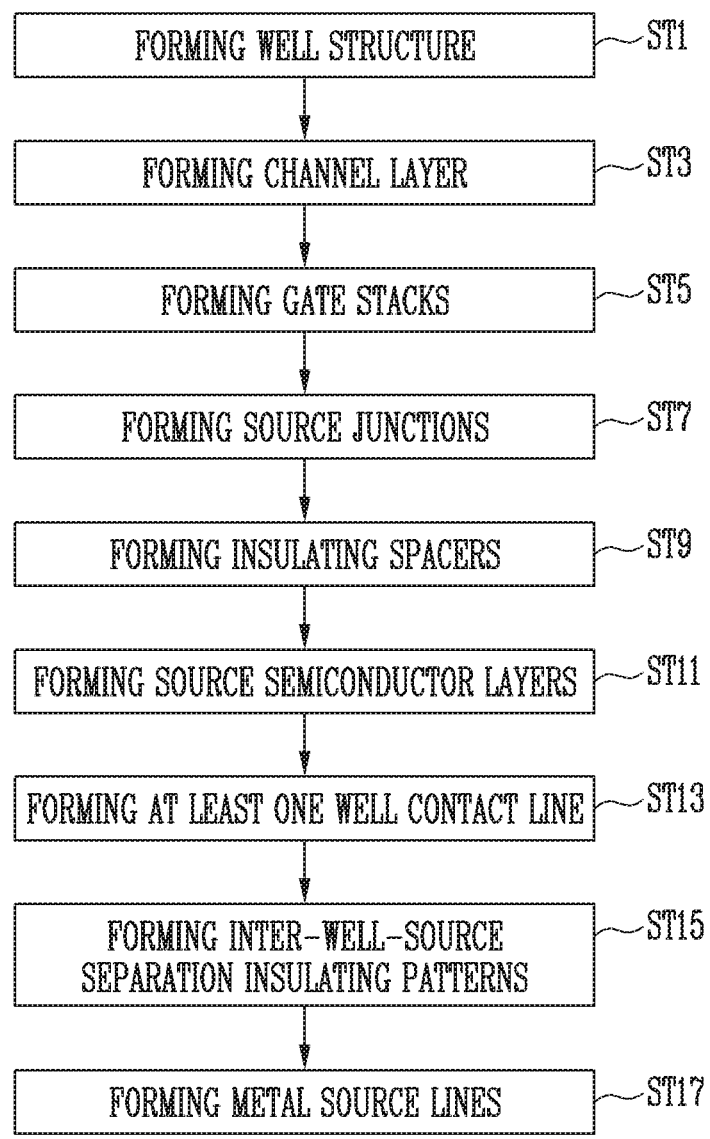
FIG. 5 is a flowchart schematically illustrating a method of manufacturing a semiconductor device in accordance with an embodiment of the present disclosure.

FIG. 5 is a flowchart schematically illustrating a method of manufacturing a semiconductor device in accordance with an embodiment of the present disclosure.

Referring to FIG. 5, the step ST1 of forming a well structure may be performed. Although not shown, before the step ST1 is performed, driving transistors constituting a driving circuit configured to drive the semiconductor device may be formed on a substrate. In this case, the step ST1 may be performed on the substrate with the driving transistors.

FIG. 6 is a sectional view illustrating the step ST1 shown in FIG. 5.

Referring to FIG. 6, the step ST1 may include the step of forming a metal layer MW, the step of forming a first doped silicon layer D1A on the metal layer MW, the first doped silicon layer D1A including a first conductivity type impurity at a first concentration, the step of forming a second doped silicon layer D1B on the first doped silicon layer D1A, the second doped silicon layer D1B including the first conductivity type impurity at a second concentration, and the step of forming well separation insulating layers WS passing through the second and first doped silicon layers D1B and D1A and the metal layer MW. According to this process, the well structure WE is divided into first to third block patterns BP1 to BP3 by the formation of the well separation insulating layers WS.

The metal layer MW may include a barrier metal layer, and a low-resistance metal layer. For example, the metal layer MW may have a stack structure including a tungsten layer and a titanium nitride layer. The first conductivity type impurity may be a p-type impurity capable of supplying holes.

Referring to FIG. 5, after the step ST1 has been performed, the step ST3 of forming a channel layer CHL may be performed.

FIG. 7 is a plan view illustrating the channel layer CHL formed through the step ST3 shown in FIG. 5. FIG. 7 also illustrates a layout of insulating pillars IP disposed under the channel layer CHL.

Referring to FIG. 7, the channel layer CHL may include vertical parts PP which are divided into first to fourth groups GR1 to GR4. Each of the first to fourth groups GR1 to GR4 may include a plurality of columns of vertical parts PP. The first group GR1 and the second group GR2 are disposed adjacent to each other between the third group GR3 and the fourth group GR4.

Drain separation insulating layers DS may be respectively disposed between a pair of columns of vertical parts PP disposed on an intermediate portion of the first group GR1 among a plurality of columns of vertical parts PP constituting the first group GR1 and between a pair of columns of vertical parts PP disposed on an intermediate portion of the second group GR2 among a plurality of columns of vertical parts PP constituting the second group GR2. The drain separation insulating layers DS may extend in the third direction III corresponding to a column direction.

Each of the vertical parts PP may be formed to enclose the corresponding capping pattern CAP. The outer surface of the channel layer CHL may be enclosed by a multilayer memory layer ML.

The insulating pillars IP may overlap areas defined between the vertical parts PP and be disposed at positions spaced apart from each other without being coupled with each other.

FIGS. 8A to 8J are sectional views illustrating in detail the step ST3 shown in FIG. 5. FIGS. 8A to 8J are sectional views taken along line X-X' of FIG. 7.

Figure 8A:
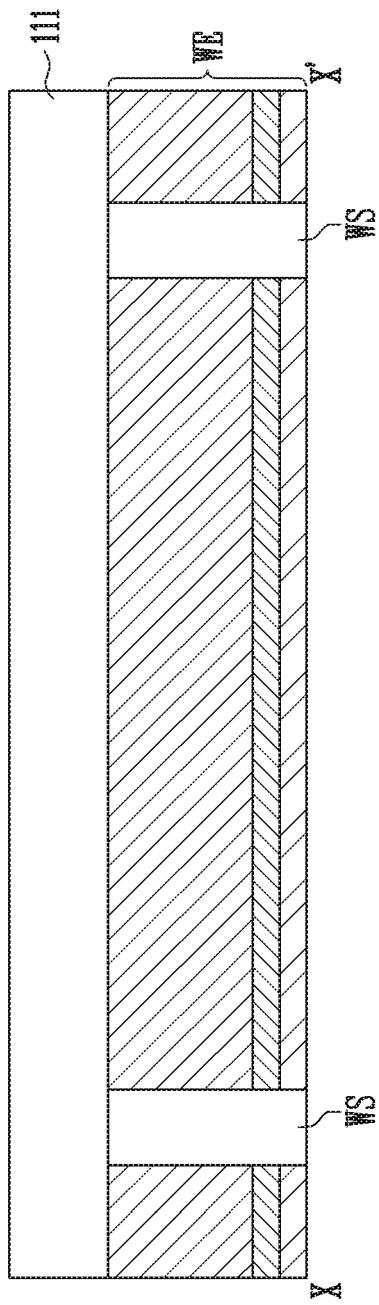

Referring to FIG. 8A, the step ST3 may include the step of forming an insulating layer 111 on the well structure WE of FIG. 6. The insulating layer 111 may be formed of an oxide layer, for example.

Figure 8B:
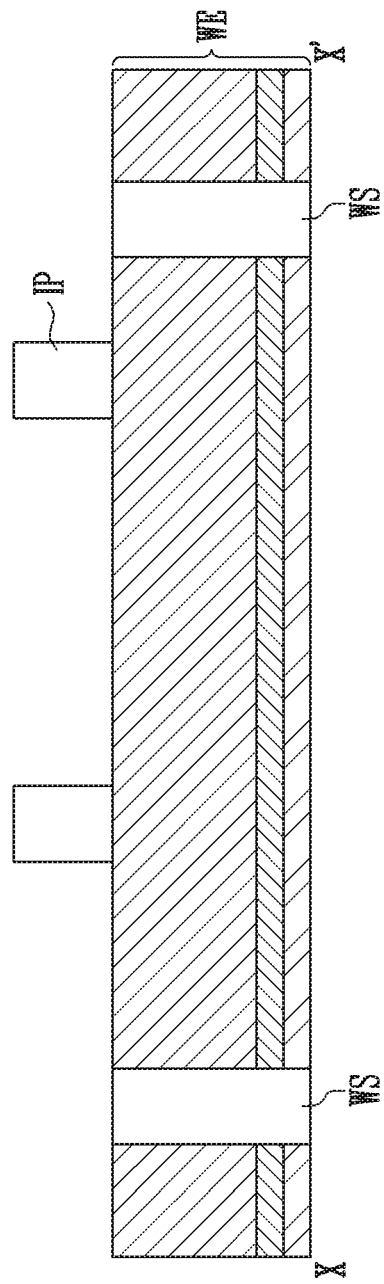

Referring to FIG. 8B, the step ST3 may include the step of forming insulating pillars IP by etching the insulating layer 111. The insulating pillars IP are disposed at positions spaced apart from each other according to the pattern of FIG. 7.

Referring to FIG. 8B, the step ST3 may include the step of forming a sacrificial layer 115 with which space between the insulating pillars IP is filled. The sacrificial layer 115 may be made of material having an etch rate different from that of the insulating pillars IP or first and second material layers to be formed through a following process. For this, the sacrificial layer 115 may be made of material different from that of the insulating pillars IP or the first and second material layers. For example, the sacrificial layer 115 may be formed of a titanium nitride layer.

The sacrificial layer 115, through which the insulating pillars IP pass, may be formed on the well structure WE through the process described with reference to FIGS. 8A to 8C. The insulating pillars IP may be disposed at positions at which they do not overlap the first or second slits to be formed through a following process.

The sacrificial layer 115, through which the insulating pillars IP pass, may be formed by a method different from the method described with reference to FIGS. 8A to 8C. For example, the step ST3 may include the step of forming a sacrificial layer 115 on the well structure WE, the step of forming holes passing through the sacrificial layer 115, and the step of filling the holes with insulating pillars IP.

Referring to FIG. 8D, after the sacrificial layer 115 through which the insulating pillars IP pass have been formed, the step ST3 may further include the step of forming an etch stop conductive layer ECP. The step of forming the etch stop conductive layer ECP may be omitted, as needed.

The etch stop conductive layer ECP may be formed of material capable of functioning as an etch stop layer during a following etching process for forming slits. In detail, the etch stop conductive layer ECP may be formed of any one selected from among materials having etch rates different from that of the sacrificial layer 115 or the first and second material layers to be formed through a following process. For example, the etch stop conductive layer ECP may be formed of a doped silicon layer. The etch stop conductive layer ECP has a thickness sufficient to function as the etch stop layer. The thickness of the etch stop conductive layer ECP may be greater than that of each of the first material layers to be formed through a following process.

Figure 8E:
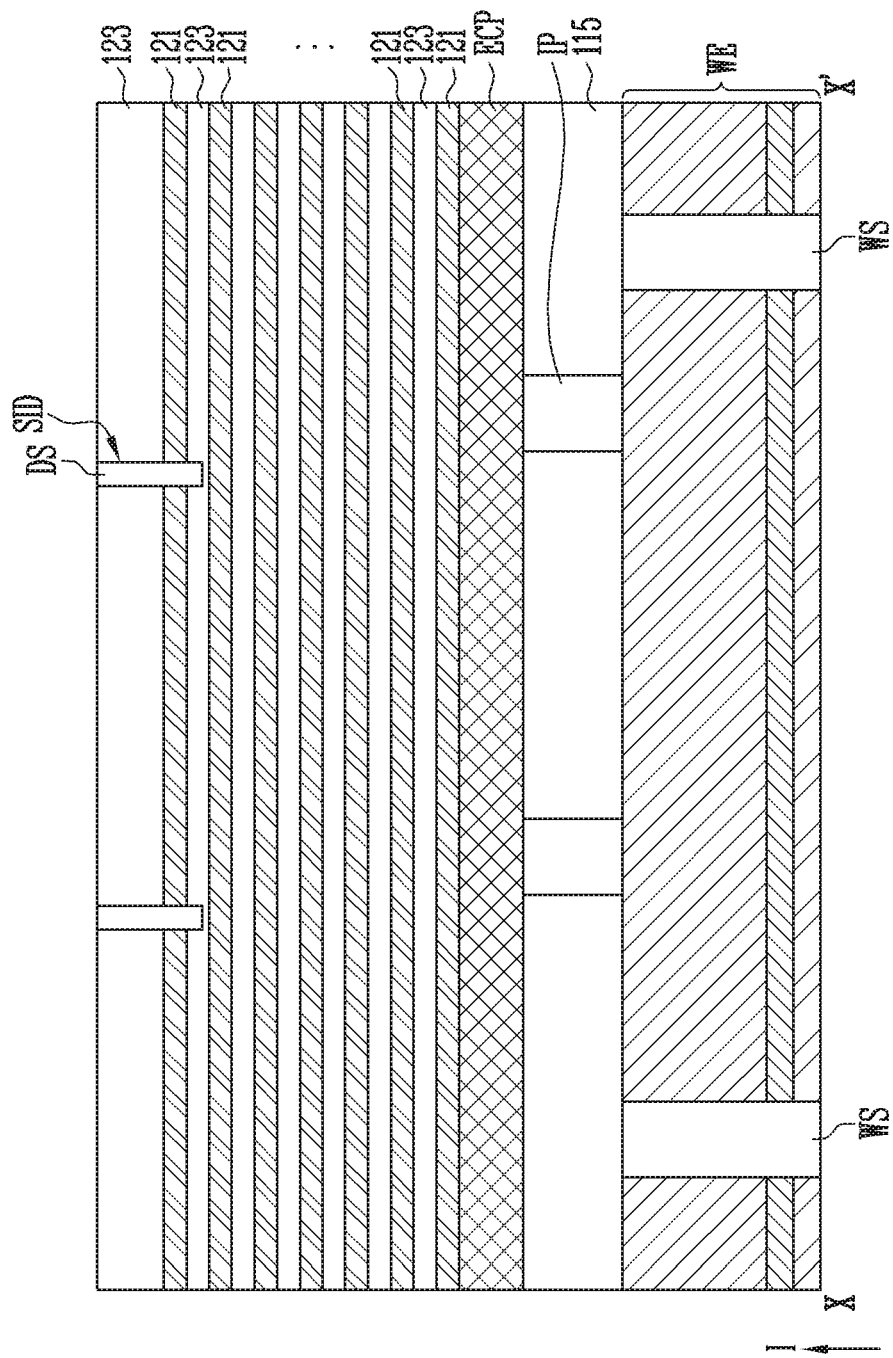

Referring to FIG. 8E, the step ST3 may include the step of alternately stacking first material layers 121 and second material layers 123 in the first direction I. The first material layers 121 and the second material layers 123 may be formed on the sacrificial layer 115 or the etch stop conductive layer ECP.

The second material layers 123 may be formed of material different from that of the first material layers 121. The first material layers 121 may be made of sacrificial insulating material, and the second material layers 123 may be made of insulating material for interlayer insulating layers. In detail, each first material layer 121 may be formed of a silicon nitride layer, and each second material layer 123 may be formed of a silicon oxide layer.

Although not shown, the first material layers 121 may be formed of second conductive layers for gate lines, and the second material layers 123 may be formed of insulating material for interlayer insulating layers. In this case, the first material layers 121 may be formed of metal having resistance lower than that of the etch stop conductive layer ECP. For example, the first material layers 121 may include tungsten.

Drain separation slits SID may pass through some of the first material layers 121 and the second material layers 123. Each drain separation slit SID may be filled with a drain separation insulating layer SD. The drain separation insulating layer SD may be formed to separate drain select lines from each other. The depth of the drain separation insulating layer SD may be changed in various ways depending on designs. The drain separation slit SID and the drain separation insulating layer DS may be omitted, as needed.

Figure 8F:
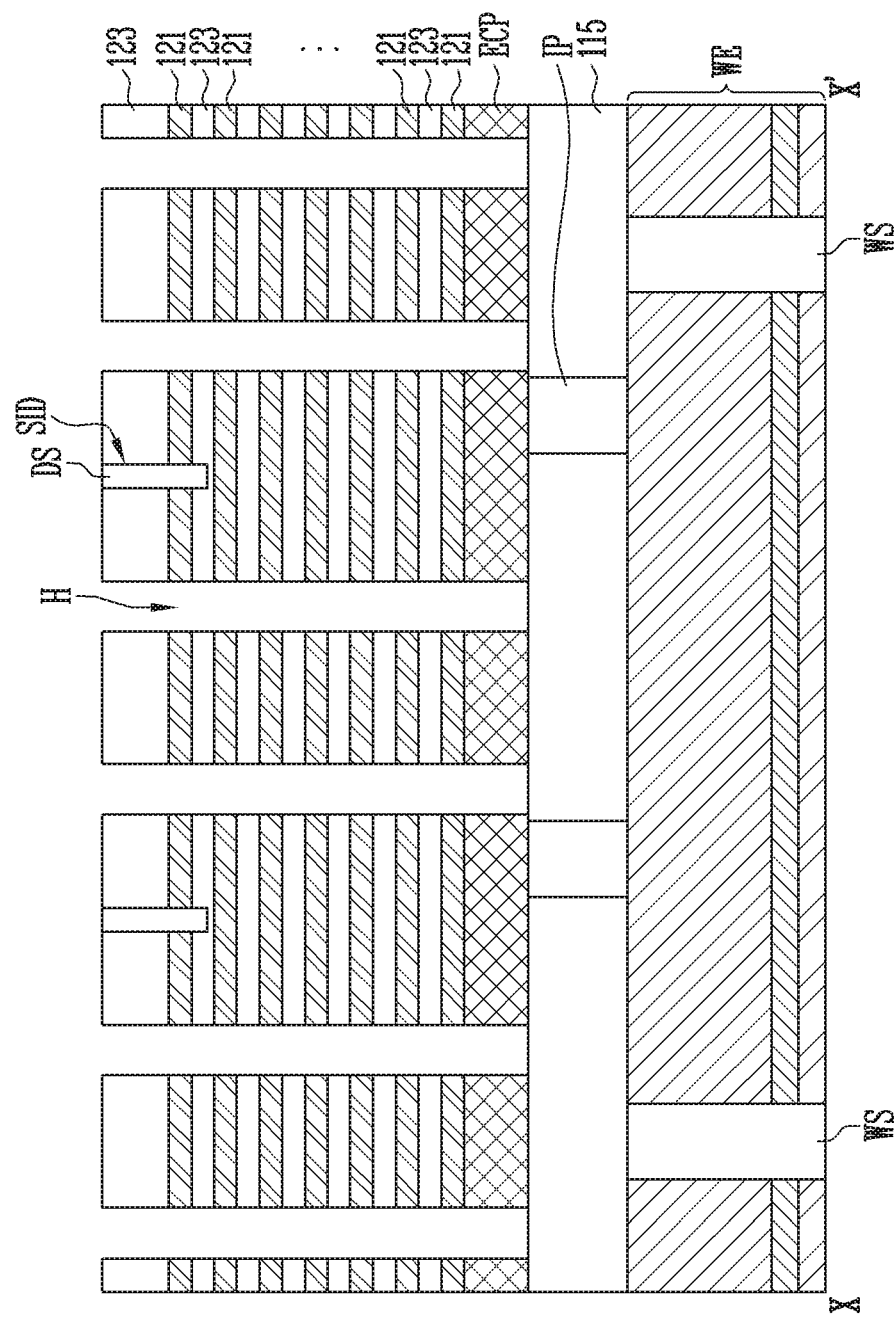

Referring to FIG. 8F, the step ST3 may include the step of forming to vertical holes H that pass through the first material layers 121 and the second material layers 123 so that the sacrificial layer 115 is exposed through the vertical holes H. The vertical holes H may also pass through the etch stop conductive layer ECP to expose the sacrificial layer 115.

Referring to FIG. 8G, the sacrificial layer 115 is selectively removed through the vertical holes H so that an open horizontal space HSP is formed. The gap of the horizontal space HSP may be maintained because of the support provided by the insulating pillars IP.

Figure 8H:
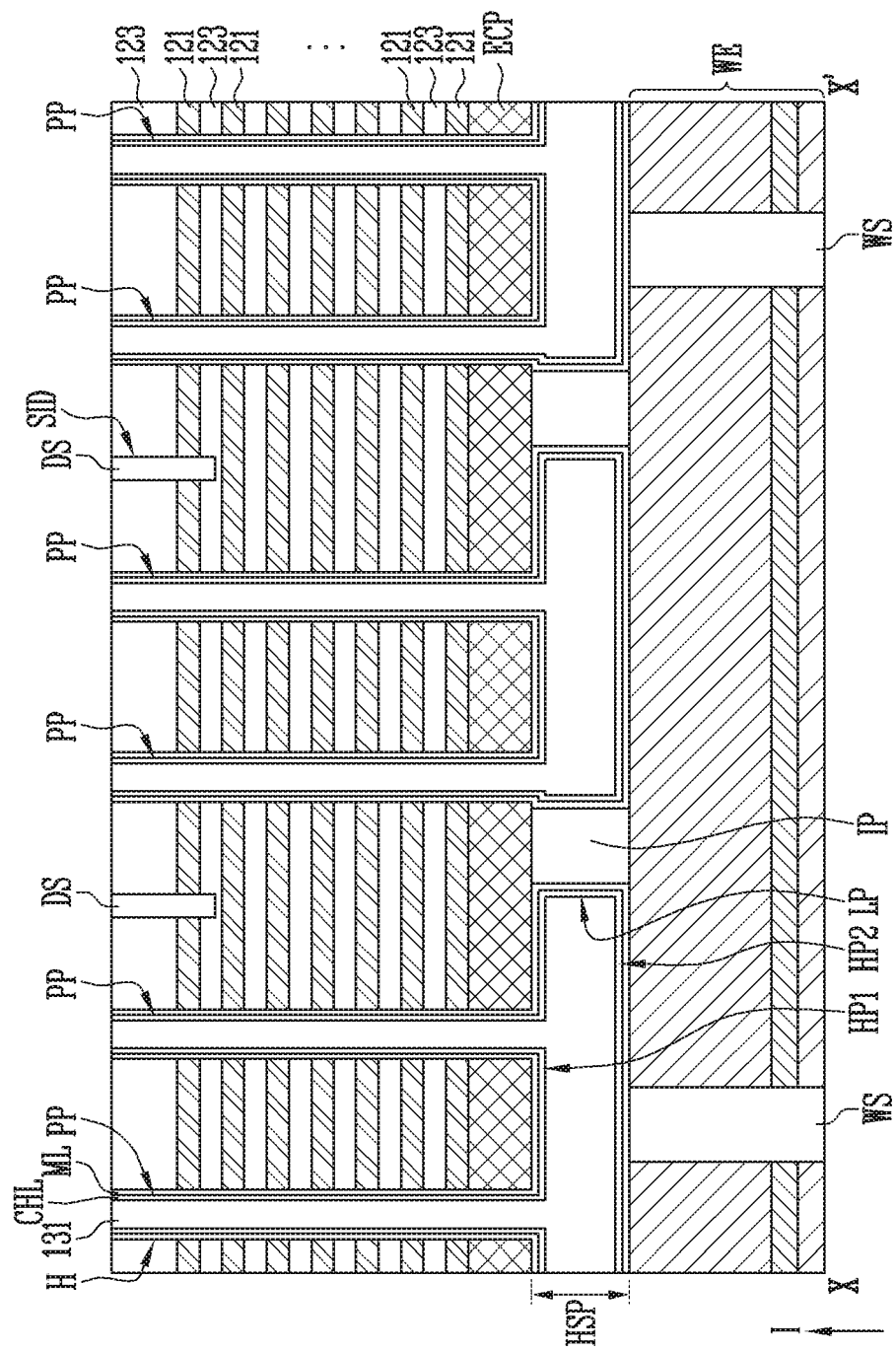

Referring to FIG. 8H, the step ST3 may include the step of forming a multilayer memory layer ML extending along the inside surfaces of the vertical holes H, a surface of the horizontal space HSP, and side surfaces of the insulating pillars IP. The step of forming the multilayer memory layer ML may include the step of forming a blocking insulating layer, the step of forming a data storage layer on the blocking insulating layer, and the step of forming a tunnel insulating layer on the data storage layer.

The step ST3 may include the step of forming a channel layer CHL on the multilayer memory layer ML. The channel layer CHL may extend along the surfaces of the vertical holes H, the surface of the horizontal space HSP, and the side surfaces of the insulating pillars IP and be enclosed by the multilayer memory layer ML.

The channel layer CHL may be divided into a first horizontal part HP1, a second horizontal part HP2, connection parts LP, and vertical parts PP. The first horizontal part HP1 may be a part of the channel layer CHL that is spaced apart from the well structure WE in the first direction I, is parallel to the well structure WE, and extends along an upper surface of the horizontal space HSP adjacent to the vertical holes H. The second horizontal part HP2 may be a part of the channel layer CHL that is disposed closer to the well structure WE than is the first horizontal part HP1 and is parallel to the well structure WE. The connection parts LP are parts of the channel layer CHL that extend from the second horizontal part HP2 toward the first horizontal part HP1 and extend along the side surfaces of the insulating pillars IP to enclose the insulating pillars IP. The vertical parts PP are parts of the channel layer CHL that extend from the first horizontal part HP1 in the first direction I and fills the vertical holes H.

The channel layer CHL may be formed of a semiconductor layer. For instance, the channel layer CHL may be formed by depositing a silicon layer. The channel layer CHL may be formed as an integrated layer without any interfaces between its parts.

The step ST3 may further include the step of forming a gap-fill layer 131 extending from the interior of the vertical holes H into the horizontal space HSP. The gap-fill layer 131 is enclosed by the channel layer CHL. The gap-fill layer 131 may be formed of an insulating material.

Figure 8I:
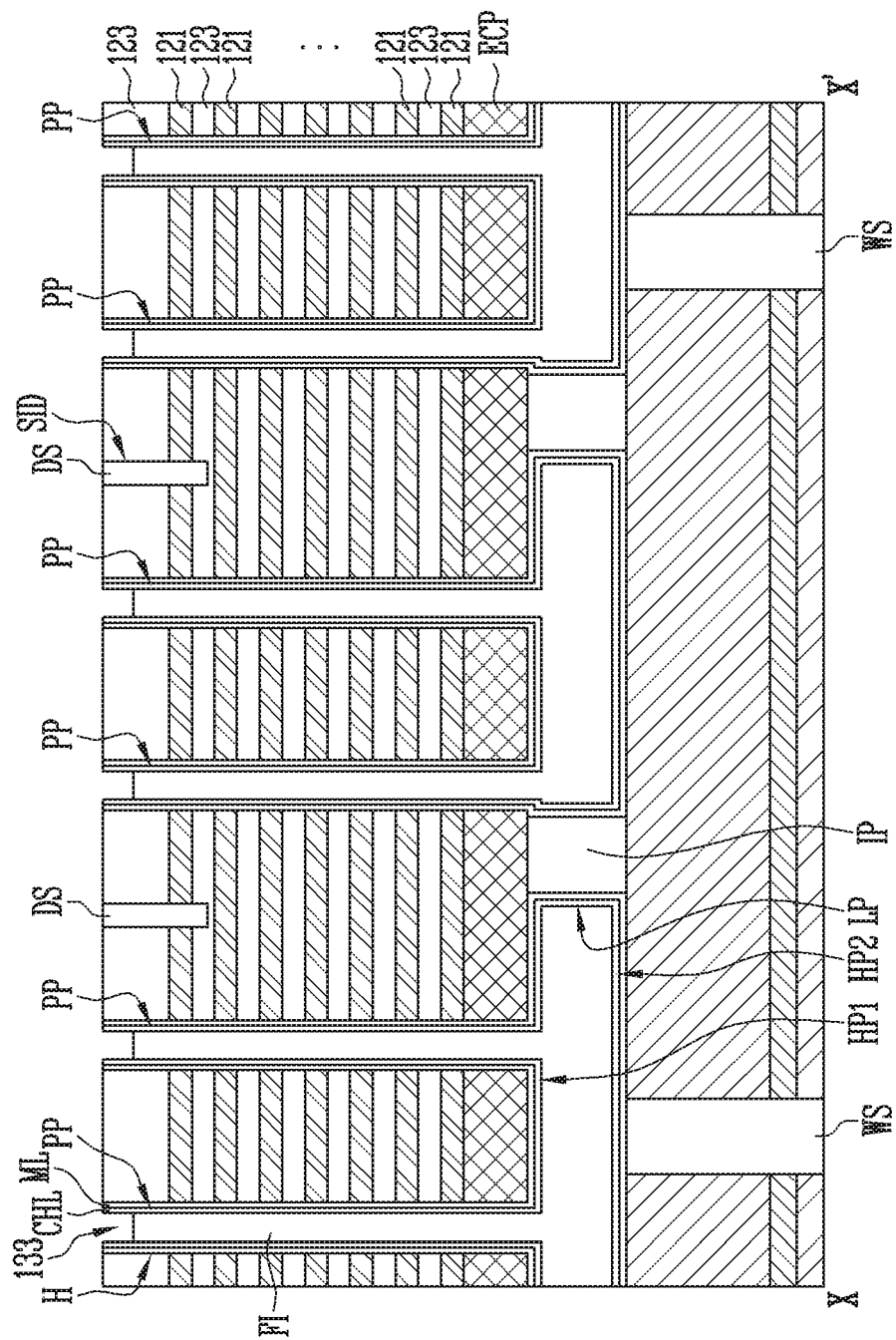

Referring to FIG. 8I, the method may further include the step of recessing parts of the gap-fill layer 131 so that the height of the gap-fill layer 131 is less than that of the vertical parts PP of the channel layer CHL. Thereby, a gap-fill pattern FI that is enclosed by the channel layer CHL and has a height lower than the vertical parts PP of the channel layer CHL may be formed. Recess areas 133 that open the inner surfaces of the vertical parts PP of the channel layer CHL may be defined on the gap-fill pattern FI.

Figure 8J:
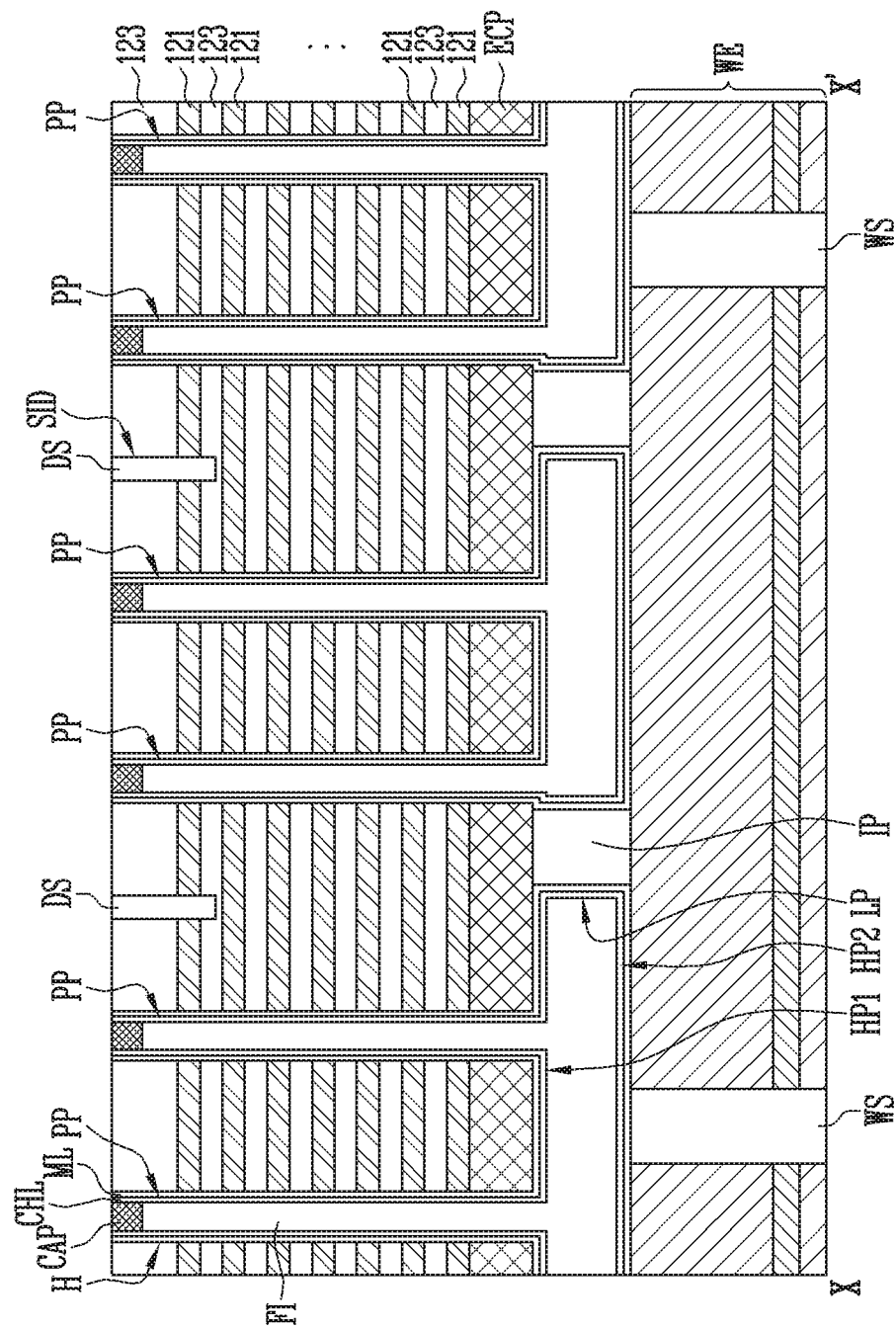

Referring to FIG. 8J, the method may further include the step of forming capping patterns CAP with which the respective recess areas 133 are filled. Each of the capping patterns CAP may be formed of a doped silicon layer including a second conductivity type impurity.

Figure 9:
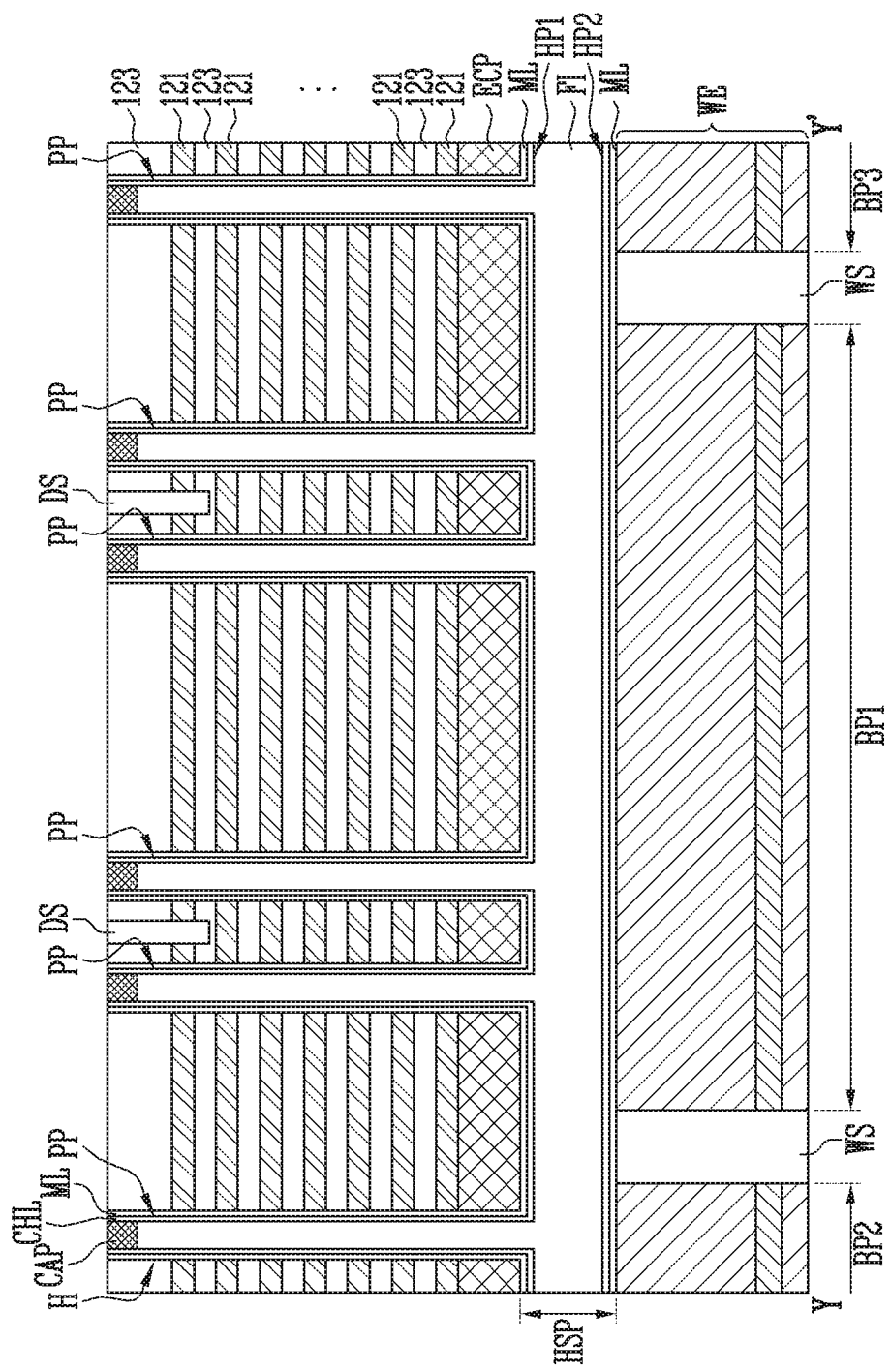

FIG. 9 is a sectional taken along line Y-Y' shown in FIG. 7. FIG. 9 illustrates the structure formed through the same process as that of FIGS. 8A to 83 and is a sectional view taken along the line not passing through the insulating pillars IP of FIG. 7. The structure of FIG. 9 includes the same components as those of FIGS. 6, and 8A to 8J. The same reference numerals are used to designate the same components. Therefore, repetitive descriptions of the same components will be omitted.

Referring to FIG. 9, the first horizontal part HP1 and the second horizontal part HP2 of the channel layer CHL may extend to overlap the first to third block patterns BP1 to BP3 separated from each other by the well separation insulating layers WS. In other words, the channel layer CHL may be a single pattern that integrally extends without being separated by memory blocks.

Referring to FIG. 5, after the step ST3 has been performed, the step ST5 of forming gate stacks that enclose the vertical parts of the channel and are separated from each other may be performed.

Figure 10:
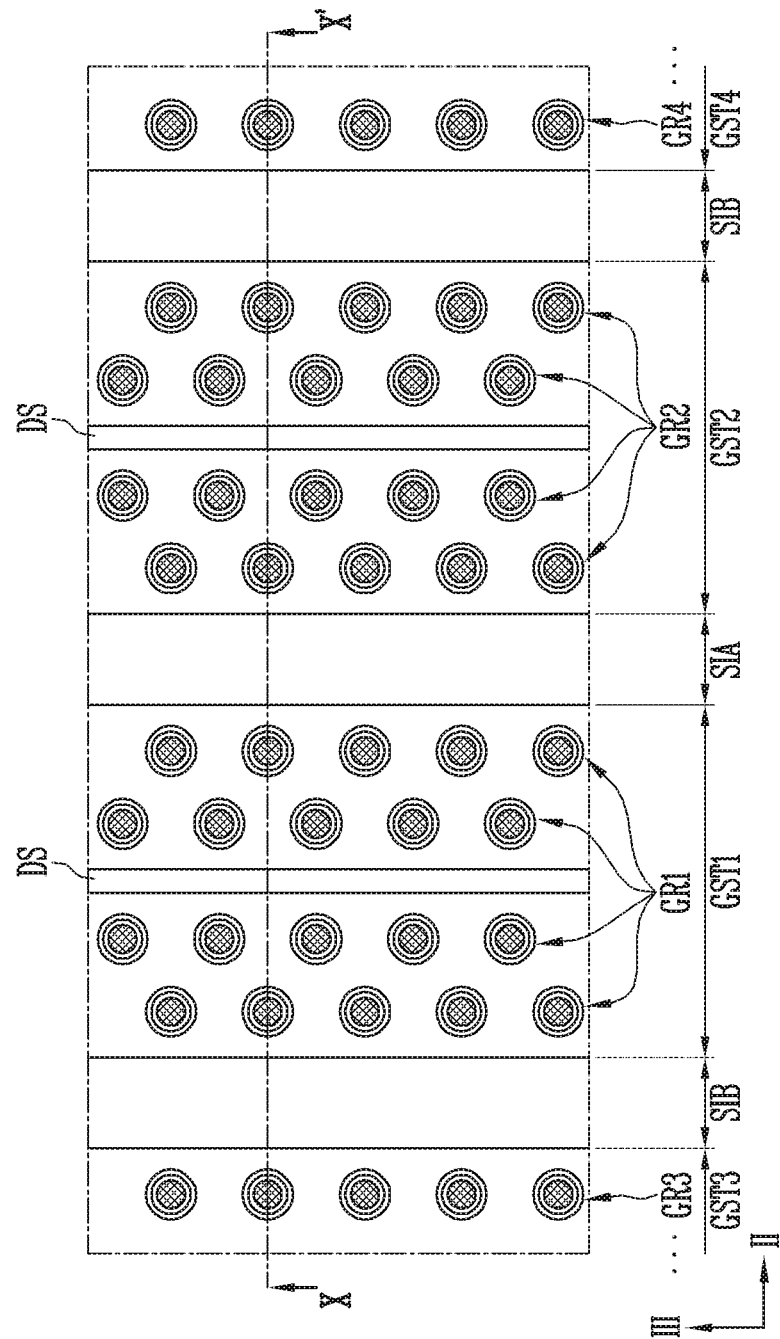

FIG. 10 is a plan view illustrating the gate stacks GST1 to GST4 formed through the step ST5 shown in FIG. 5. FIG. 10 illustrates a layout of the drain separation insulating layer DS and the first to fourth groups of vertical parts GR1 to GR4.

Referring to FIG. 10, the first gate stack GST1 enclosing the first group of vertical parts GR1, the second gate stack GST2 enclosing the second group of vertical parts GR2, the third gate stack GST3 enclosing the third group of vertical parts GR3, and the fourth gate stack GST4 enclosing the fourth group of vertical parts GR4 may be formed through the step ST5.

The first gate stack GST1 and the second gate stack GST2 may form a single memory block. The first gate stack GST1 and the second gate stack GST2 may be separated from each other by the first slit SIA. The third gate stack GST3 is disposed adjacent to the first gate stack GST1. The fourth gate stack GST4 is disposed adjacent to the second gate stack GST2. The third gate stack GST3 and the fourth gate stack GST4 may be respectively separated from the first gate stack GST1 and the second gate stack GST2 by the respective second slits SIB that define boundaries between the memory blocks.

The drain separation insulating layers DS may be disposed in the respective first to fourth gate stacks GST1 to GST4. In the drawings, since only a part of each of the third and fourth gate stacks GST3 and GST4 are illustrated, drain separation insulating layers disposed in the respective third and fourth gate stacks GST3 and GST4 are not shown.

The first and second slits SIA and SIB and the drain separation insulating layers DS extend in the third direction III.

FIGS. 11A to 11D are sectional views illustrating in detail the step ST5 shown in FIG. 5. FIGS. 11A to 11D are sectional views taken along line X-X' shown in FIG. 10.

Figure 11A:
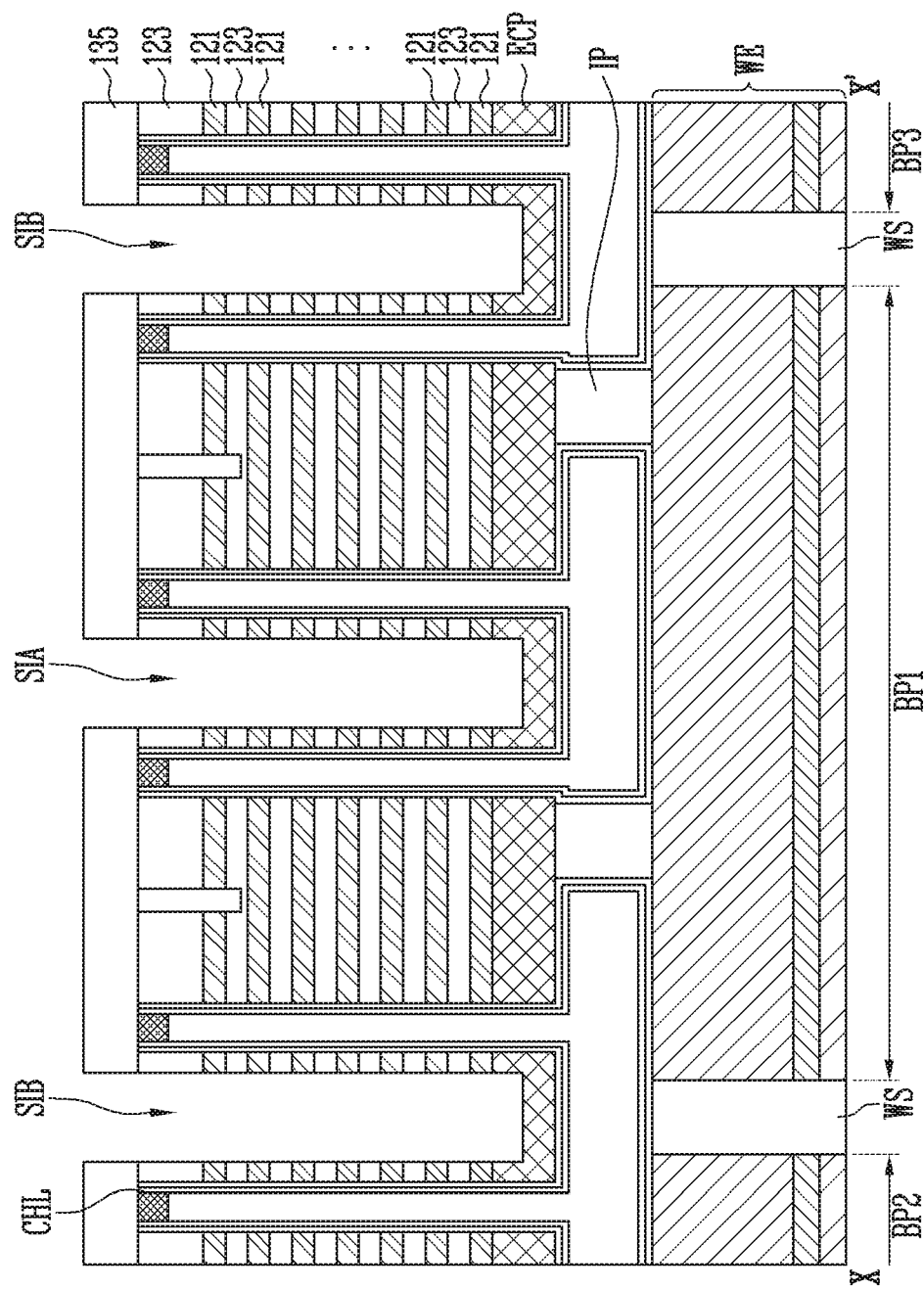

Referring to FIG. 11A, before the step ST5 is performed, an upper insulating layer 135 may be formed on the first and second material layers 121 and 123 through which the channel layer CHL passes.

The step ST5 may include the step of etching the upper insulating layer 135, the first material layers 121, and the second material layers 123 as a first etching process that is stopped when the etch stop conductive layer ECP is exposed. Thereby, the first and second slits SIA and SIB through which the etch stop conductive layer ECP is exposed may be formed. The depths of the first and second slits SIA and SIB formed through the first etching process are less than a target depth. The first and second slits SIA and SIB may not overlap the insulating pillars IP.

The first slit SIA may be disposed to overlap any one of the first to third block patterns BP1 to BP3. For example, the first slit SIA may overlap the first block pattern BP1. In other words, the well structure WE may extend to overlap the first slit SIA.

The second slits SIB may overlap the well separation insulating layers WS.

Figure 11B:
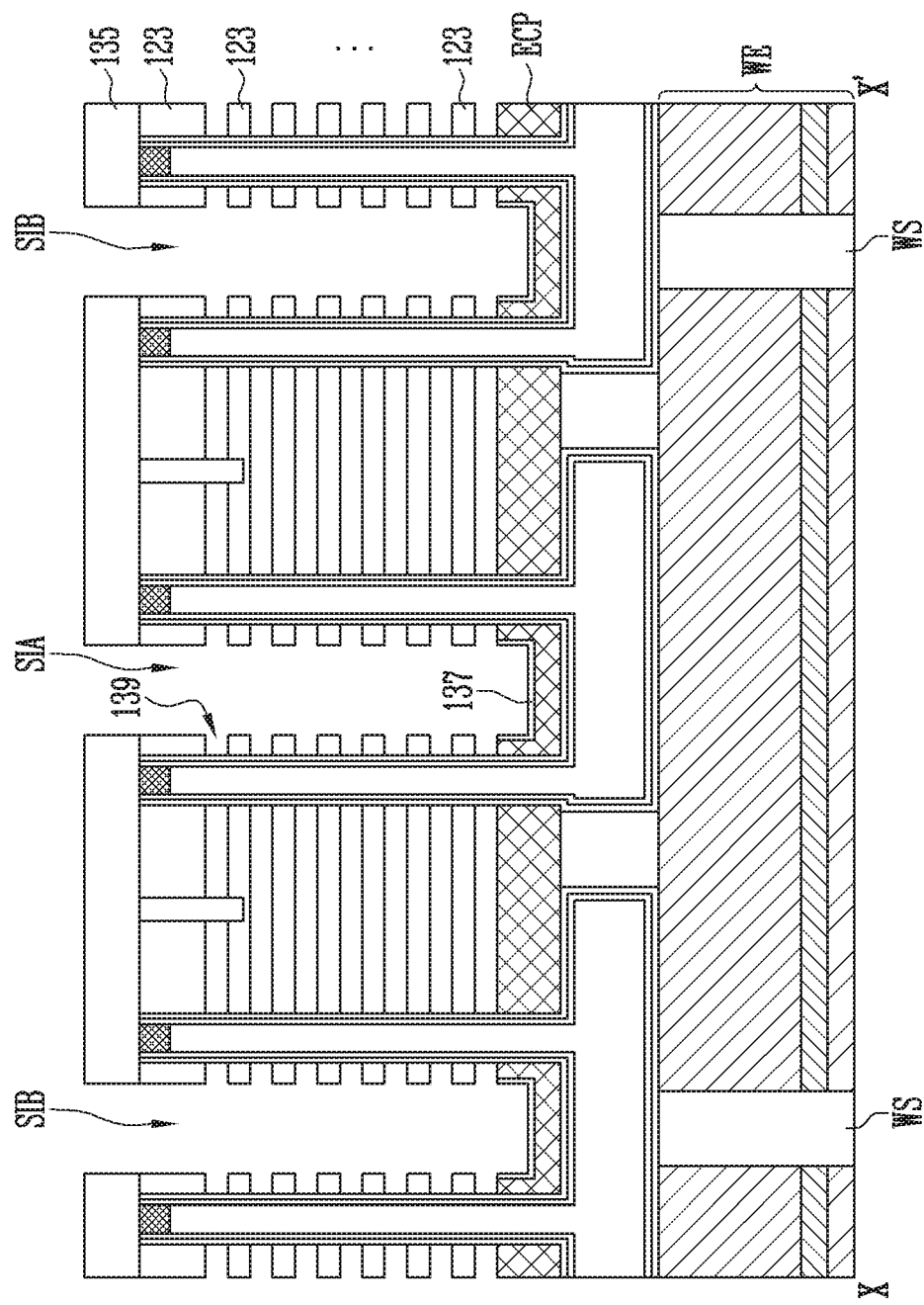

Referring to FIG. 11B, the step ST5 may further include the step of oxidizing the surface of the etch stop conductive layer ECP exposed through the first and second slits SIA and SIB to thereby form an oxidization area 137 on a portion of the surface of the etch stop conductive layer ECP.

The step ST5 may include the step of selectively removing the first material layers through the first and second slits SIA and SIB to thereby form open gate areas 139.

Figure 11C:
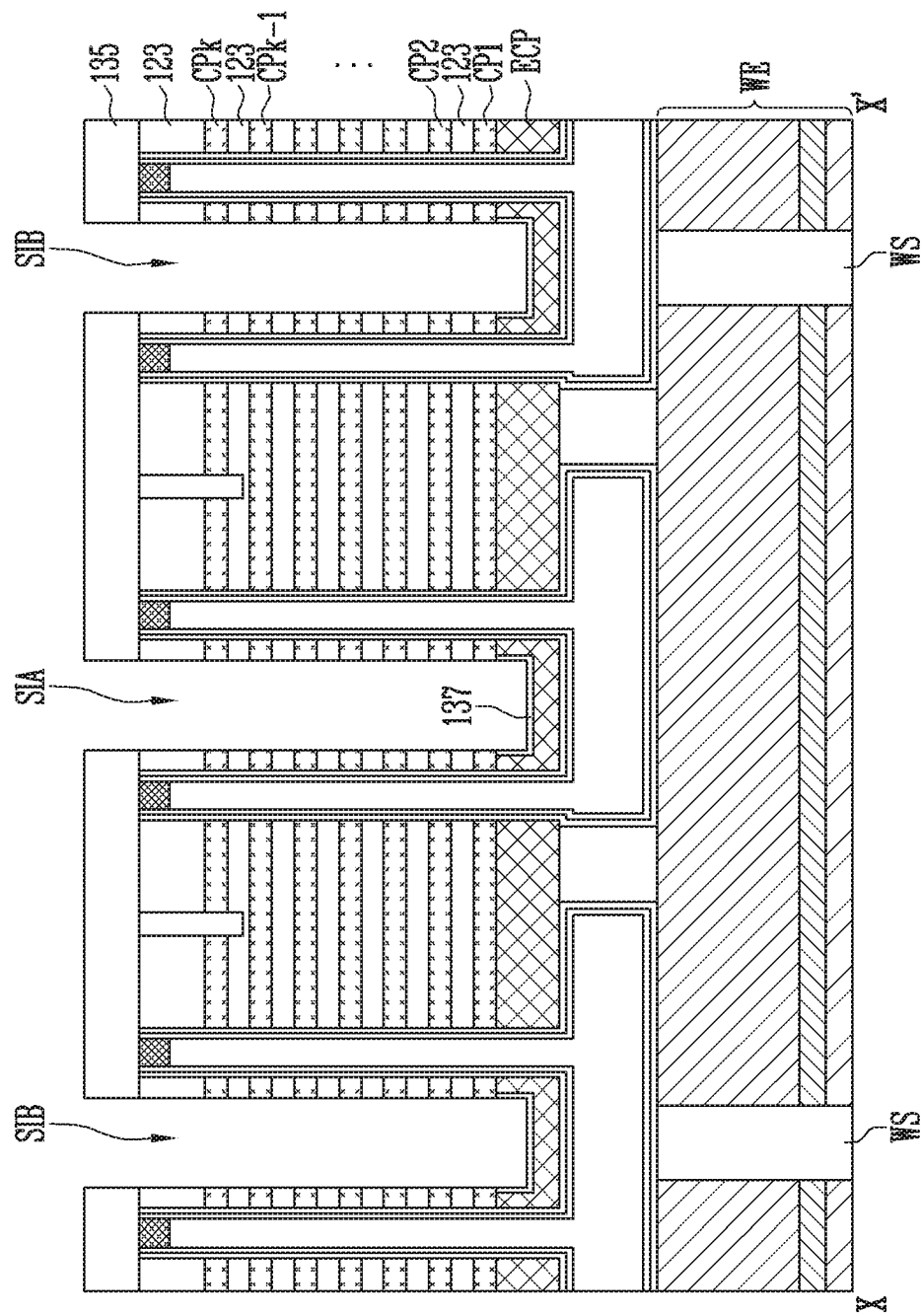

Referring to FIG. 11C, at the step ST5, the open gate areas 139 may be filled with conductive third material layers. The conductive third material layers may be the second conductive layers CP1 to CPk described with reference to FIGS. 1 to 3 and may be metal layers having a resistance lower than that of the etch stop conductive layer ECP.

During the process of forming the conductive third material layers, a process of removing any conductive material remaining in the first and second slits SIA and SIB may be further performed. Here, the etch stop conductive layer ECP may be protected by the oxidization area 137.

FIGS. 11B and 11C illustrate embodiments, taking into account the case where the first material layers are formed of sacrificial insulating material. In this case, the first material layers are replaced with third material layers that are second conductive layers CP1 to CPk through the first and second slits SIA and SIB.

Although not shown in the drawings, in the case where the first material layers are formed of the second conductive layers CP1 to CPk, the process of replacing the first material layers with the third material layers may be omitted.

Figure 11D:
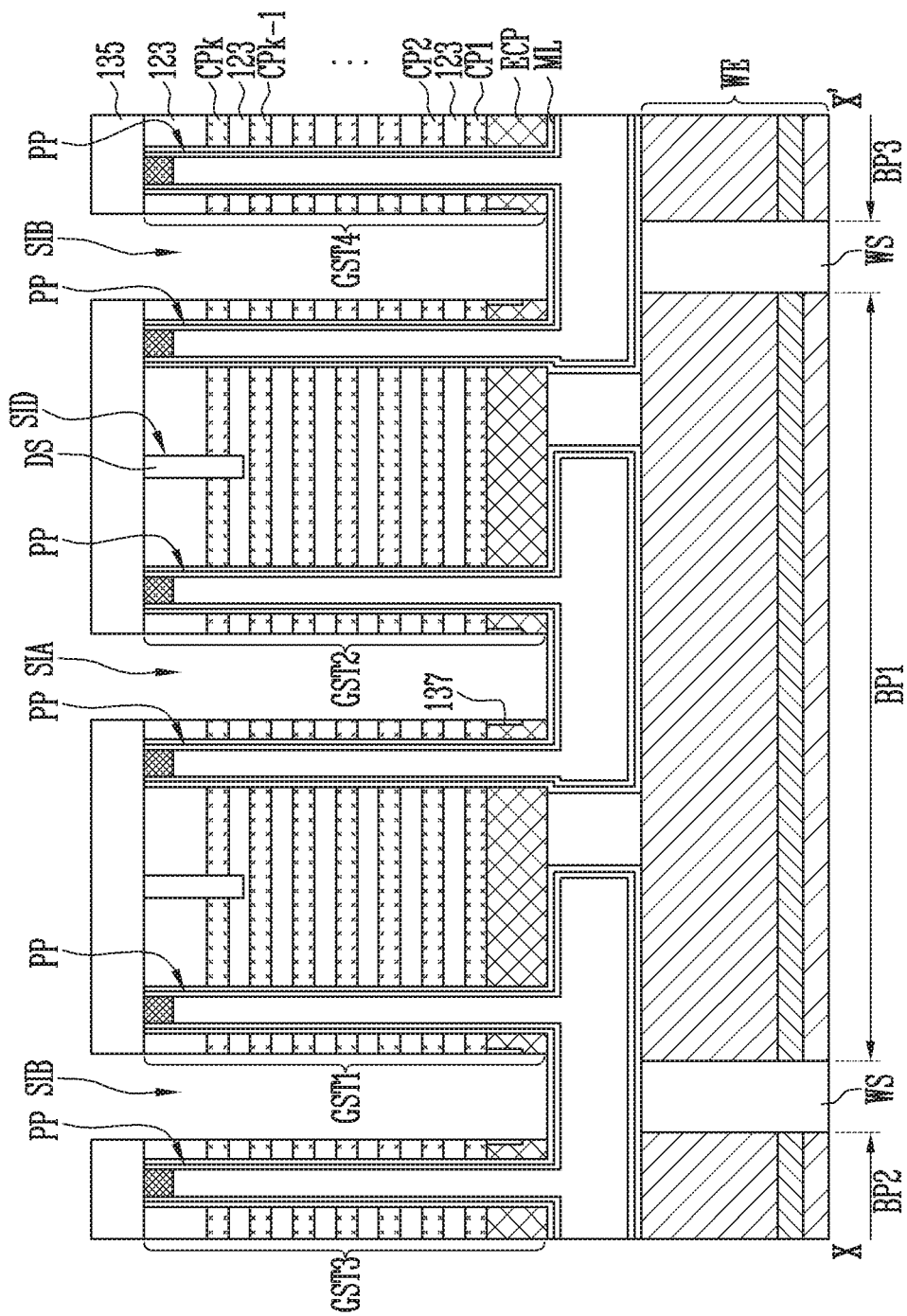

Referring to FIG. 11D, the first to fourth gate stacks GST1 to GST4 may be formed by etching the etch stop conductive layer ECP through a second etch process that is stopped when the multilayer memory layer ML is exposed. Here, the first and second slits SIA and SIB extend to a depth at which they completely pass through the etch stop conductive layer ECP.

The integrated channel layer CHL is associated to the first to fourth gate stacks GST1 to GST4. The first and second gate stacks GST1 and GST2 separated from each other by the first slit SIA overlap the single memory block pattern BP1.

Referring to FIG. 5, after the step ST5 has been performed, the step ST7 of forming source junctions may be performed.

Figure 12:
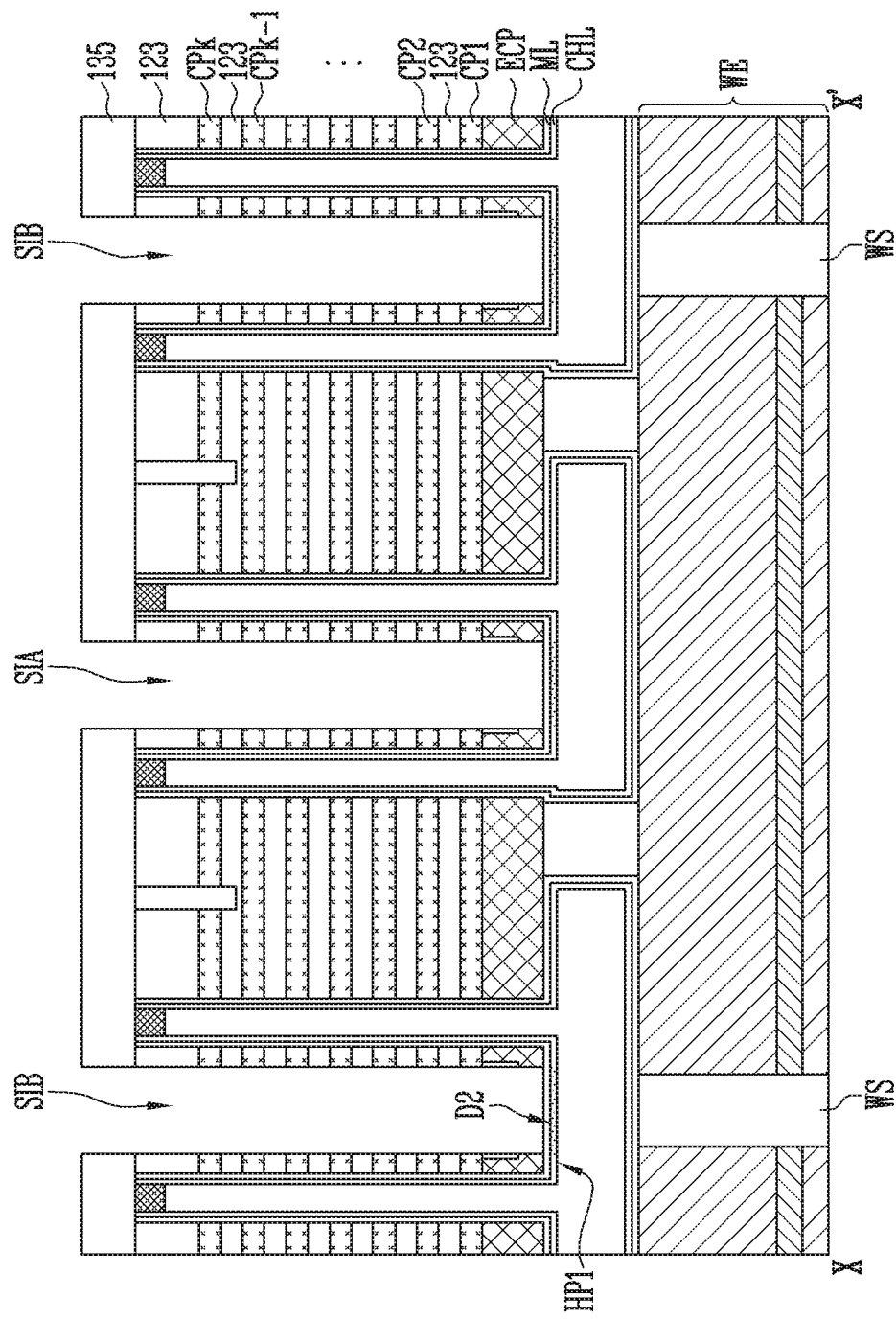

FIG. 12 is a sectional view illustrating the step ST7 shown in FIG. 5.

Referring to FIG. 12, source junctions D2 are formed by injecting an impurity of a second conductivity type different from the first conductivity type into the channel layer CHL through the first and second slits SIA and SIB. The source junctions D2 may be formed by injecting an n-type impurity. During the process of injecting the impurity to form the source junctions D2, the multilayer memory layer ML remaining on the bottom of each of the first and second slits SIA and SIB may function as a buffer layer.

The source junctions D2 may be formed in the direction (the third direction III of FIG. 10) in which the first and second slits SIA and SIB extend. The source junctions D2 are formed in the first horizontal part HP1 of the channel layer CHL.

Referring to FIG. 5, after the step ST7 has been performed, the step ST9 of forming insulating spacers may be performed.

Figure 13:
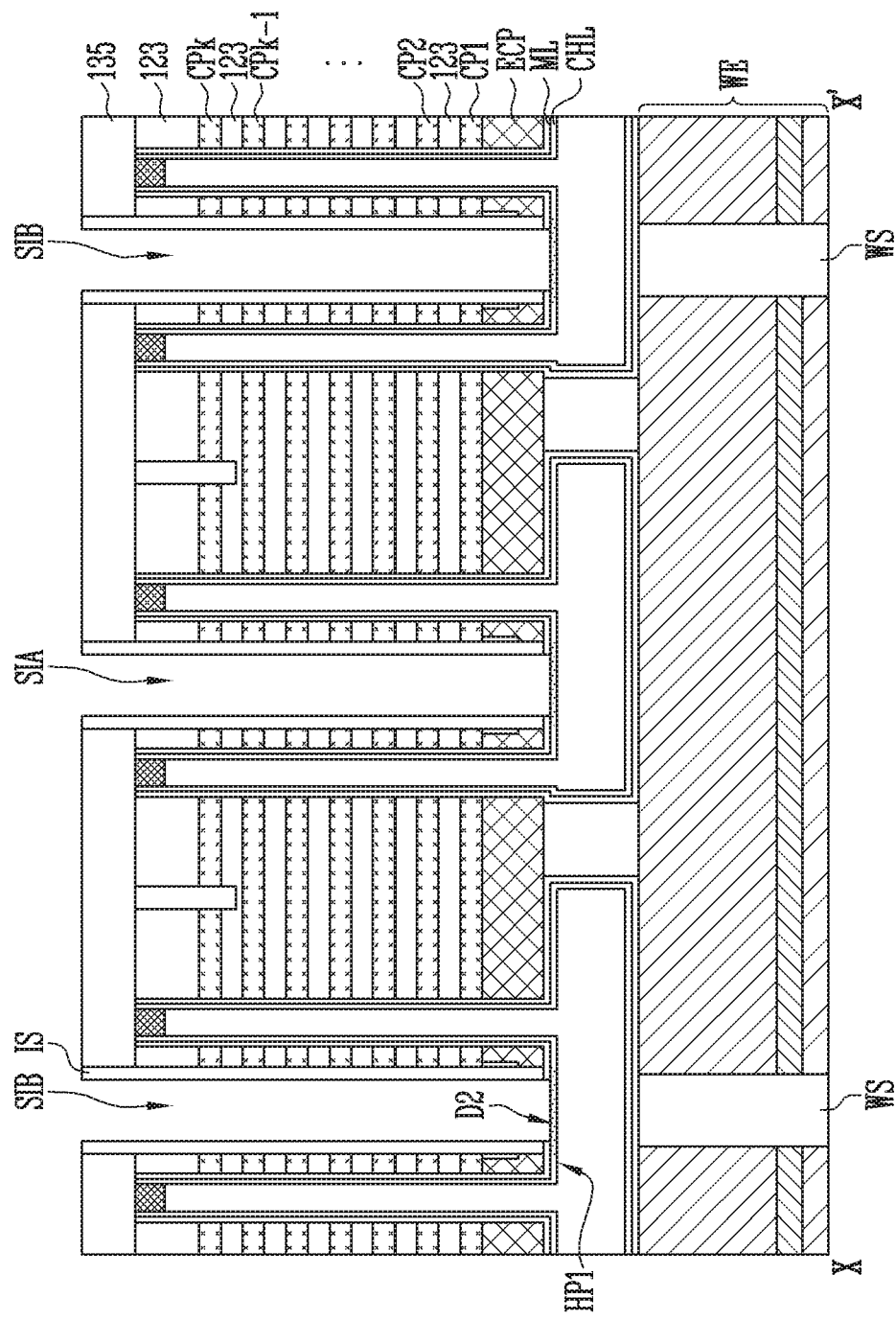

FIG. 13 is a sectional view illustrating the step ST9 shown in FIG. 5.

Referring to FIG. 13, the step ST9 may include the step of depositing an insulating layer along the surfaces of the first and second slits SIA and SIB, and the step of etching the insulating layer through an etch-back process. During the process of etching the insulating layer, the multilayer memory layer ML exposed through the bottoms of the first and second slits SIA and SIB may be etched. In this way, the insulating spacers IS may be formed on the first and second slits SIA and SIB. The insulating spacers IS may be formed in the direction (the third direction III of FIG. 10) In which the first and second slits SIA and SIB extend.

The source junctions D2 of the channel layer CHL may be exposed between the insulating spacers IS.

Referring to FIG. 5, after the step ST9 has been performed, the step ST11 of forming source semiconductor layers may be performed.

Figure 14:
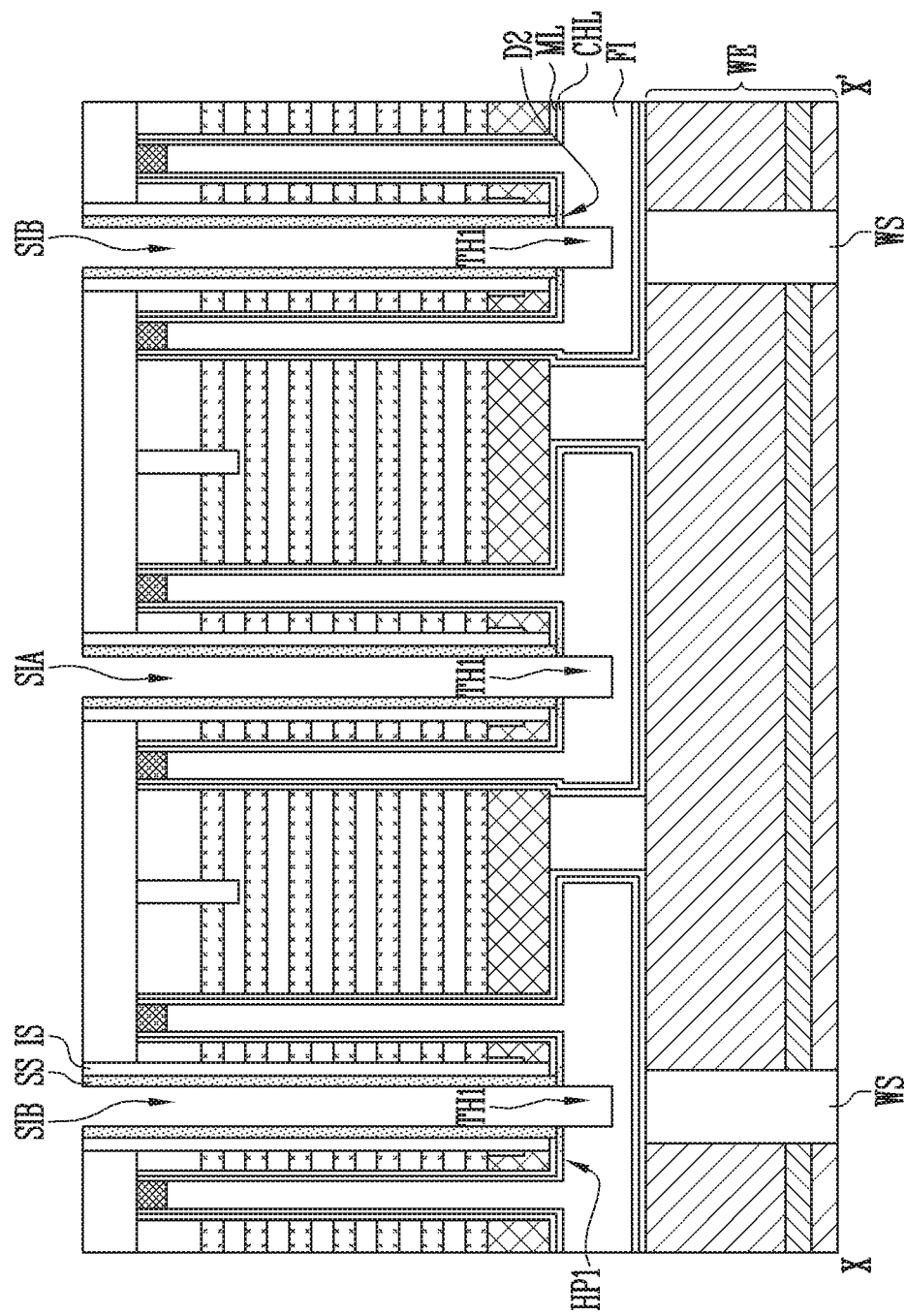

FIG. 14 is a sectional view illustrating the step ST11 shown in FIG. 5.

Referring to FIG. 14, the step ST11 may include the step of depositing a semiconductor layer including a second conductivity type impurity along the surfaces of the first and second slits SIA and SIB having the side surfaces covered with the insulating spacers IS, and the to step of etching the semiconductor layer formed on the bottoms of the first and second slits SIA and SIB. Thereby, the source semiconductor layers SS are formed on the insulating spacers IS.

After the step ST11 has been performed, a first through hole group may be formed. The first through hole group may include first through holes TH1. The first through holes TH1 may be coupled to the first and second slits SIA and SIB, and pass through the channel layer CHL between the adjacent source semiconductor layers SS. The first through holes TH1 may be formed to a depth at which they do not completely pass through the gap-fill pattern FI. The gap-fill pattern FI may be exposed through the first through holes TH1.

The first through holes TH1 may extend in the third direction (III of FIG. 10) in the same manner as that of the first and second slits SIA and SIB. The first through holes TH1 may pass through the first horizontal part HP1 of the channel layer CHL and, particularly, pass through the source junctions D2 to divide each of the source junctions D2 into a pair of patterns facing each other.

Referring to FIG. 5, after the step ST11 has been performed, the step ST13 of forming at least one well contact line may be performed.

FIGS. 15A to 15D are sectional views illustrating in detail an example of the step ST13 shown in FIG. 5.

Referring to FIG. 15A, the step ST13 may include the step of forming growth protection layers 141 on side surfaces of the first through holes TH1, the growth protection layers 141 extending on the source semiconductor layers SS. The step of forming the growth protection layers 141 may include the step of depositing an oxidization layer, and the step of etching the oxidization layer through an etch-back process.

The step ST13 may include the step of forming a second through hole group coupled to the first through hole group. The second through hole group may include second through holes TH2. The second through holes TH2 are coupled to the respective first through holes TH1, and pass through the gap-fill pattern FI, the second horizontal part HP2, and the multilayer memory layer ML to expose the well separation layers WS. The channel layer CHL may be divided into first to fourth channel patterns CH1 to CH4 by the first and second through holes TH1 and TH2.

The second through holes TH2 may extend in the third direction (III of FIG. 10) in the same manner as that of the first and second slits SIA and SIB. Hereinafter, for the sake of explanation, with regard to the second through holes TH2, second-slit-side second through holes (TH2 coupled to SIB), through which the well separation insulating layers WS are exposed, and a first-slit-side second through hole (TH2 coupled to SIA), through which the well structure WE is exposed, will be separately described below.

According to a series of manufacturing processes, the first horizontal part HP1 of each of the first to fourth channel patterns CH1 to CH4 may remain protruding sideways further than the insulating spacer IS and the multilayer memory layer ML. Parts of the first horizontal part HP1 that protrude sideways further than the multilayer memory layer ML may come into direct contact with the source semiconductor layers SS.

Referring to FIG. 15B, the step ST13 may include the step of extending the second-slit-side second through holes (TH2 coupled to SIB) into the well separation insulating layers WS, and extending the first-slit-side second through hole (TH2 coupled to SIA) into the well structure WE. For this operation, the well separation insulating layers WS and the well structure WE may be etched.

Referring to FIG. 15C, the step ST13 may include the step of forming a first contact layer 145A
and second contact layers 145B. The first and second contact layers 145A and 145B may be simultaneously formed by growing the semiconductor layer from the second horizontal part HP2 and the well structure WE that are exposed through the second through holes TH2. The first and second contact layers 145A and 145B may be formed by growing a silicon layer.

During the operation of growing the first and second contact layers 145A and 145B, a semiconductor layer is not grown from the source semiconductor layers SS or the first horizontal part HP1 because the source semiconductor layers SS and the first horizontal part HP1 are blocked by the growth protection layers 141.

The first contact layer 145A may be formed without void because it is grown using the second horizontal part HP2 and the second doped silicon layer D1B of the well structure WE as a seed layer. Since the second contact layers 145B are grown using only the second horizontal part HP2 as a seed layer, the through holes of the second horizontal part HP2 may be clogged with the second contact layers 145B before the space between the second contact layers 145B and the well separation insulating layers WS is completely filled. Thereby, an air tunnel 147 may be formed under each of the second contact layers 145B.

Referring to FIG. 15D, the step ST13 may include the step of etching the first and second contact layers 145A and 145B such that the second contact layers 145B are completely removed. Here, the etching process is controlled such that the first contact layer 145A can remain as the first well contact line WCL1.

The first well contact line WCL1 may come into direct contact with the well structure WE and the second horizontal part HP2 and electrically couple the well structure WE with the second horizontal part HP2.

Referring to FIG. 5, after the step ST13 has been performed, the step ST15 of forming the inter-well-source insulating patterns may be performed.

Figure 16A:
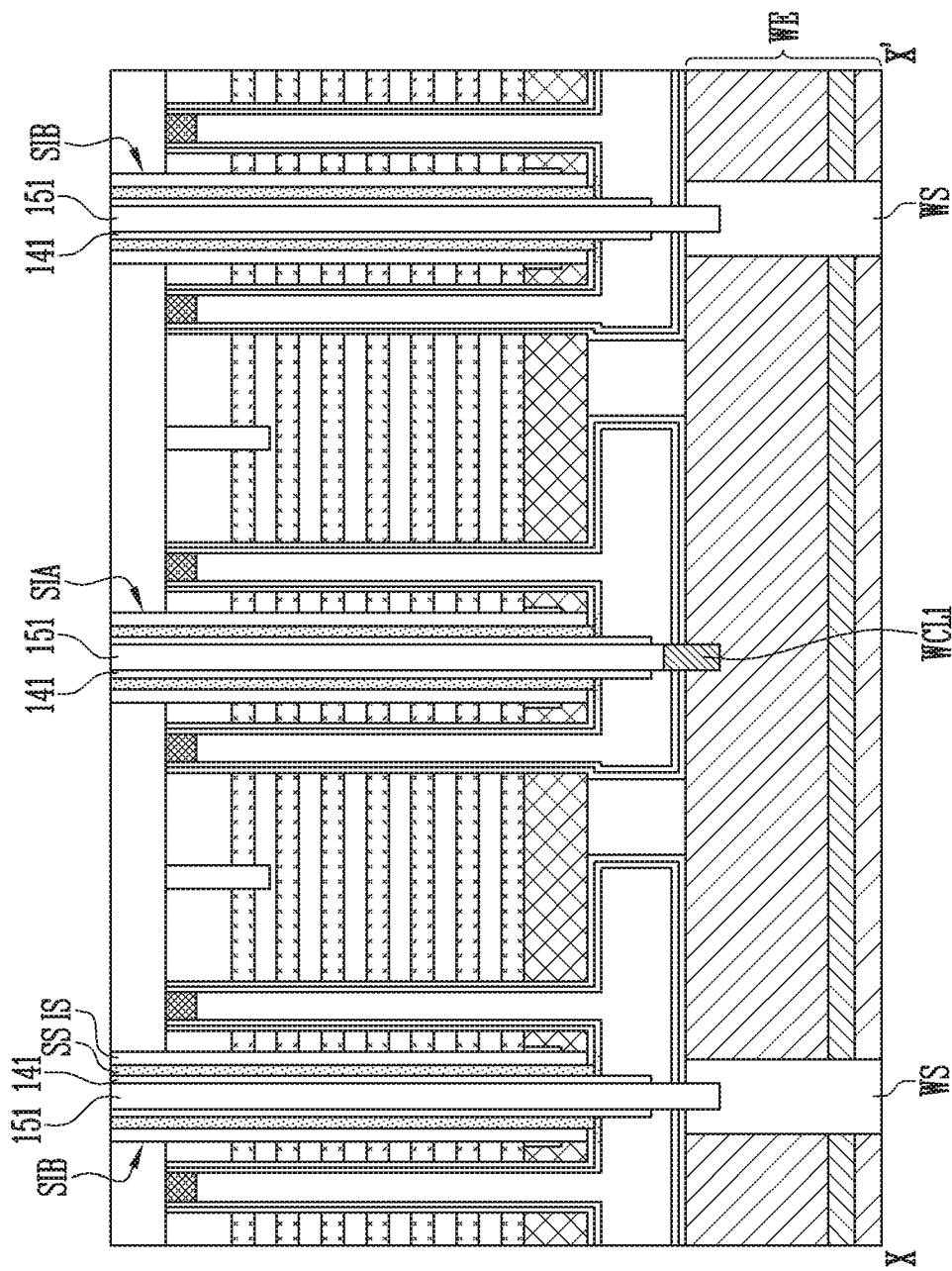

FIGS. 16A and 16B are sectional views illustrating the step ST15 shown in FIG. 5.

Referring to FIG. 16A, at the step ST15, inter-well-source insulating layers 151 are formed on the well separation insulating layers WS and the first well contact line WCL1 through the first and second slits SIA and SIB. The inter-well-source insulating layers 151 may fill the first and second slits SIA and SIB on the growth protection layers 141. The inter-well-source insulating layer 151 may be formed of oxide layers.

Referring to FIG. 16B, the step ST15 may include the step of etching the inter-well-source insulating layers 151 and the growth protection layers 141 such that the source semiconductor layers SS are exposed through the first and second slits SIA and SIB. Here, some of the inter-well-source insulating layers 151 may remain on the first well contact line WCL1 as a first inter-well-source insulating pattern SWI1, and the other inter-well-source insulating layers 151 may remain on the well separation insulating layers WS as second inter-well-source insulating patterns SWI2. The growth protection layers 141 may remain on side surfaces of the first and second inter-well-source insulating patterns SWI1 and SWI2 as growth protection patterns GP.

Referring to FIG. 5, after the step ST15 has been performed, the step ST17 of forming metal source lines may be performed.

Figure 17:
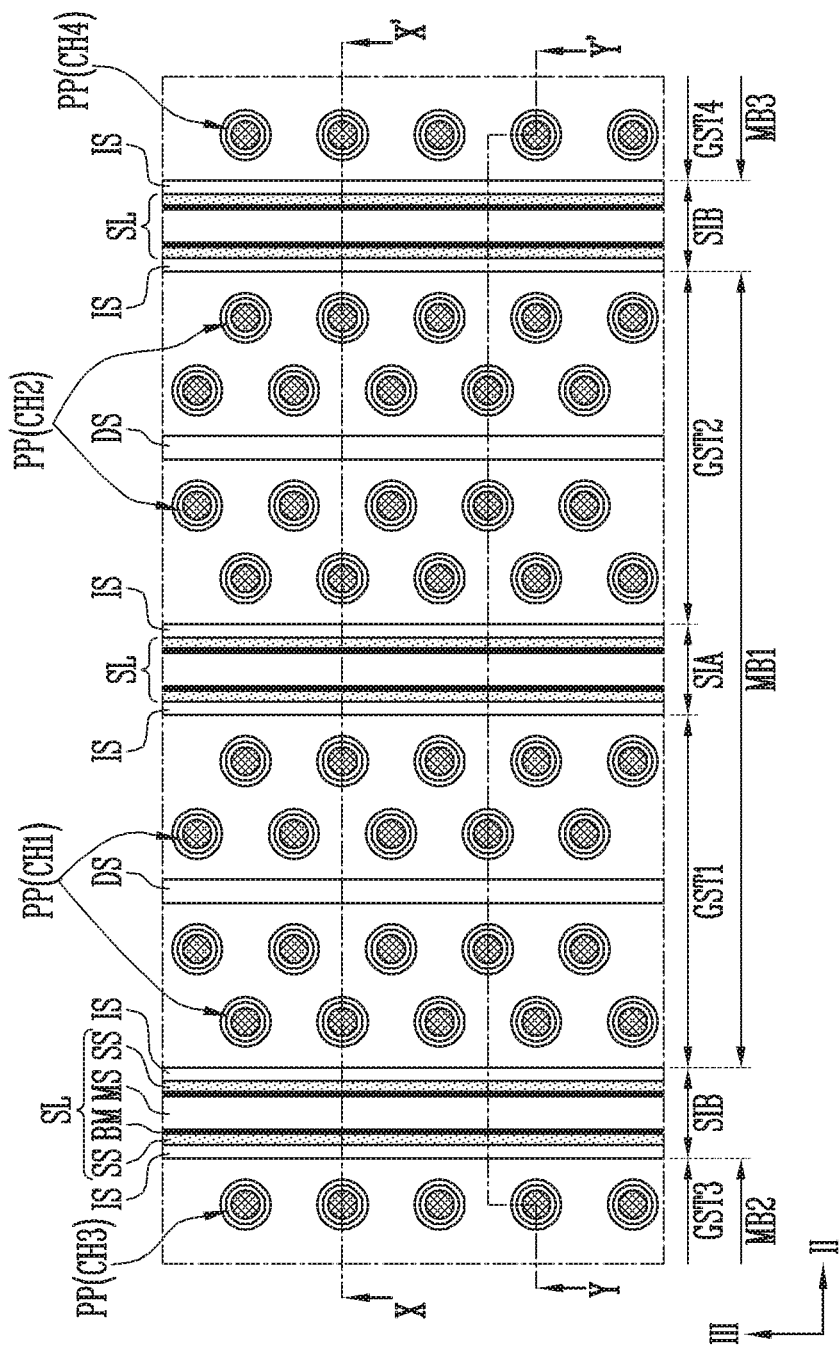

FIG. 17 is a plan view illustrating the metal source lines MS formed through the step ST17 shown in FIG. 5. FIG. 17 also illustrates a layout of the drain separation insulating layer DS and the vertical parts PP.

Referring to FIG. 17, the metal source lines MS may be respectively formed in the first and second slits SIA and SIB. The metal source lines MS may be formed of a metal having a low resistance and, for example, may include tungsten. To prevent diffusion of metal from the metal source lines MS, a barrier metal pattern BM may be formed on an outer surface of each of the metal source lines MS. In this way, the source lines SL are respectively formed in the first and second slits SIA and SIB.

Each of the source lines SL includes a pair of source semiconductor layers SS formed on the insulating spacers IS which cover the side surface of the corresponding one of the first and second slits SIA and SIB, a metal source line MS disposed between the pair of source semiconductor layers SS, and a barrier metal pattern BM enclosing the metal source line MS. The source semiconductor layers SS, the metal source line MS, and the barrier metal pattern BM that constitute each of the source lines SL may be formed of conductive materials, and be electrically coupled with each other.

The source lines SL may be insulated from the first to fourth gate stacks GST1 to GST4 by the insulating spacers IS formed on the side surfaces of the first and second slits SIA and SIB.

Figure 18:
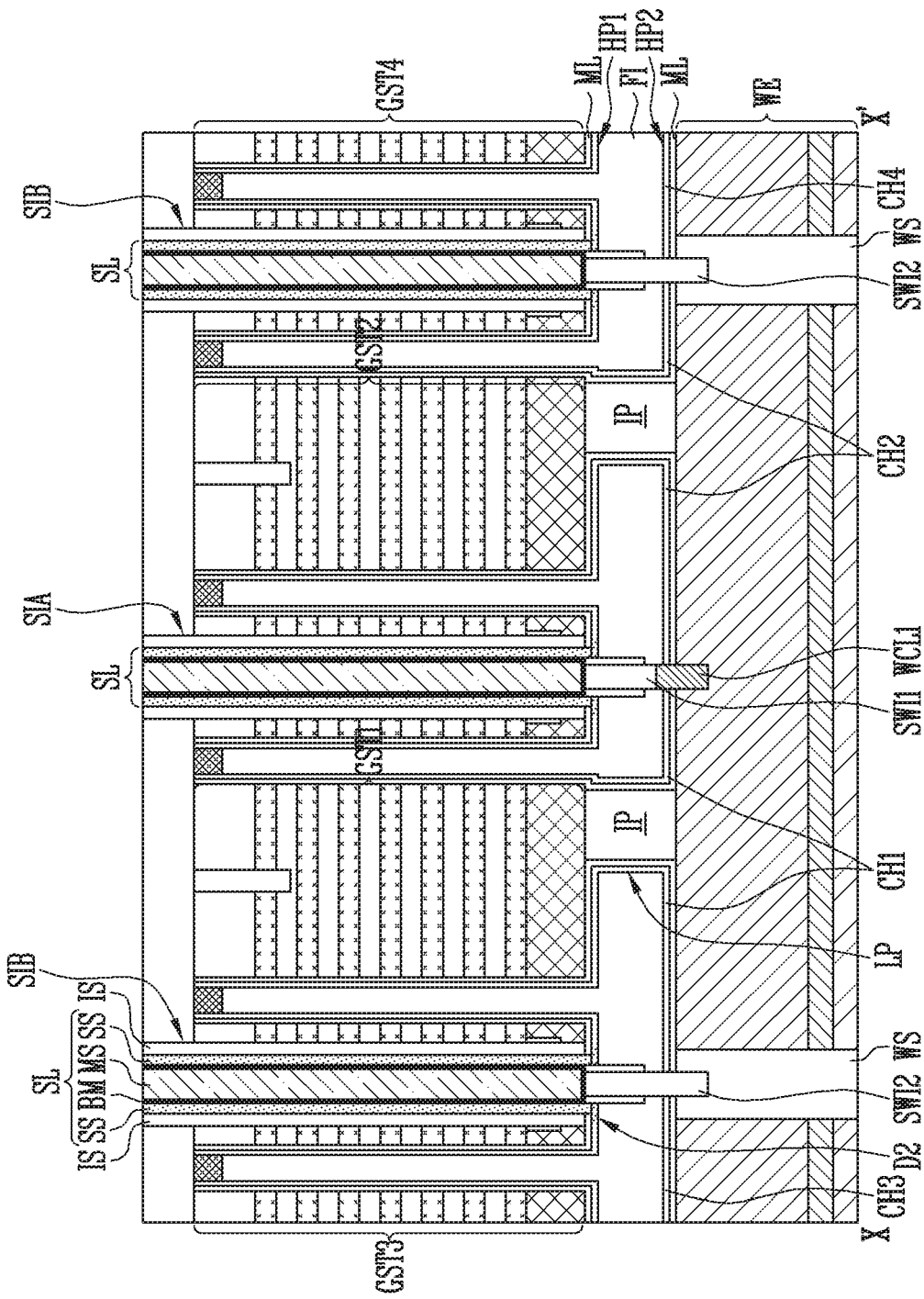
Figure 19:
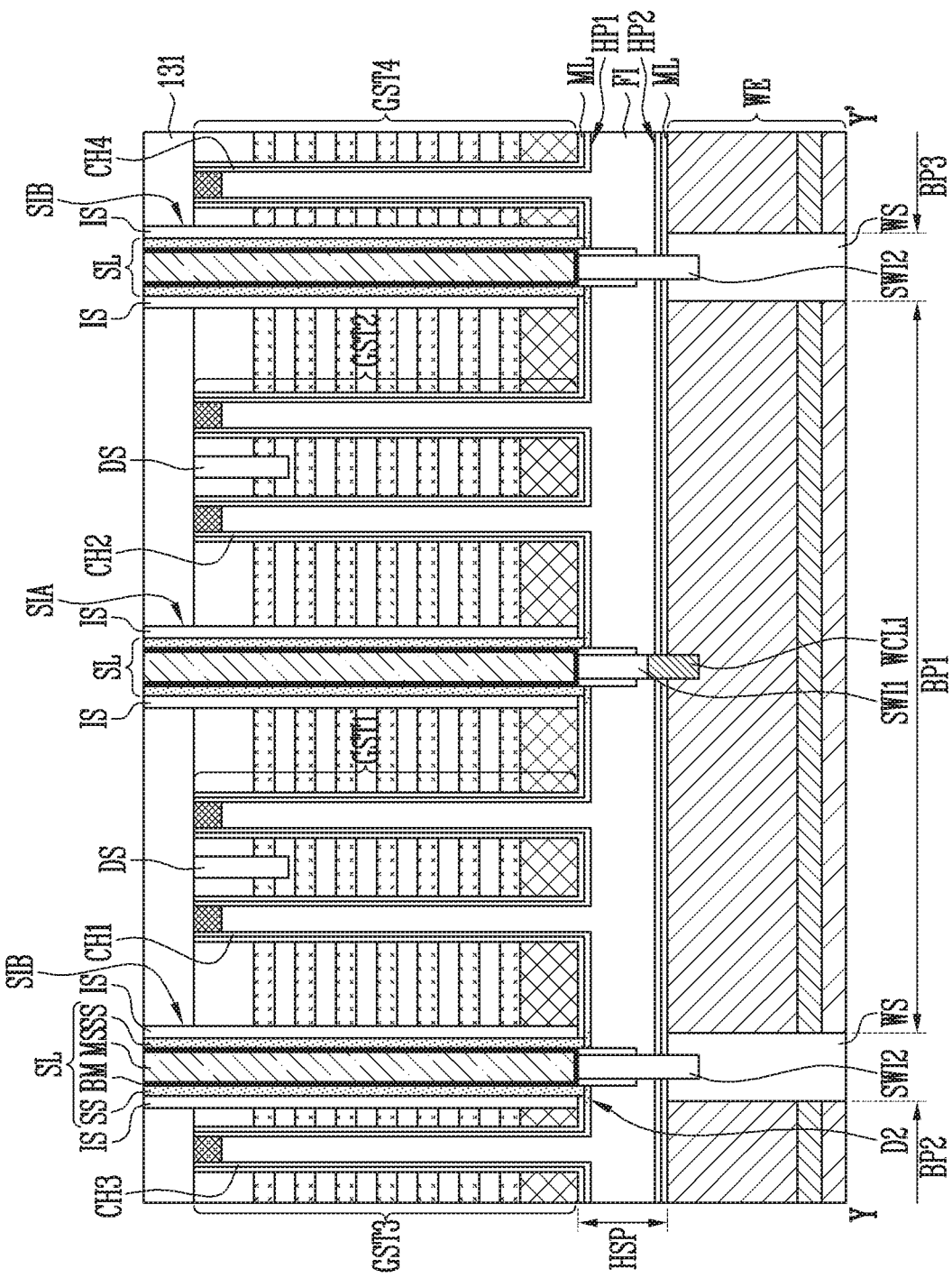

FIGS. 18 and 19 are sectional views illustrating the step ST17 shown in FIG. 5. FIG. 18 is a sectional view taken along line X-X' shown in FIG. 17. FIG. 19 is a sectional view taken along line Y-Y' shown in FIG. 17.

Referring to FIGS. 18 and 19, the step ST17 may include the step of forming a barrier metal layer along the surfaces of the source semiconductor layers SS and the first and second inter-well-source insulating patterns SWI1 and SWI2 that are exposed through the first and second slits SIA and SIB, the step of forming a metal source layer on the barrier metal layer, and the step of etching the barrier metal layer and the metal source layer and patterning the barrier metal patterns BM and the metal source lines MS that remain in the first and second slits SIA and SIB. In this way, the source lines SL are formed on the first and second inter-well-source insulating patterns SWI1 and SWI2 in the first and second slits SIA and SIB.

The source line SL in the first slit SIA is insulated from the first well contact line WCL1 by the first inter-well-source insulating pattern SWI1.

Each of the insulating pillars IP may have a side surface enclosed by the connection part LP, and remain disposed between the well structure WE and the corresponding one of the first to fourth gate stacks GST1 to GST4. Each of the first to fourth channel patterns CH1 to CH4 may not be divided into a plurality of patterns because it has the connection part LP enclosing the sidewall of the corresponding insulating pillar IP.

According to the above-mentioned process, the source junctions D2 each including a second conductivity type impurity (n-type) remain in the respective first to fourth channel patterns CH1 to CH4 in the first horizontal part HP1. Particularly, the source junctions D2 are disposed in the first horizontal part HP1 at positions adjacent to the source semiconductor layers SS and are brought into direct contact with the source semiconductor layers SS. The source junctions D2 make the flow of current to a channel area of a source select transistor smooth and more reliable, thus improving the operational characteristics of the source select transistor.

The processes described with reference to FIGS. 5 to 19 pertain to an example of the method of manufacturing the semiconductor device illustrated in FIG. 1.

Hereinafter, an example of a method of manufacturing the semiconductor device illustrated in FIG. 2 will be described with reference to FIGS. 5, and 20A to 22.

Figure 20A:
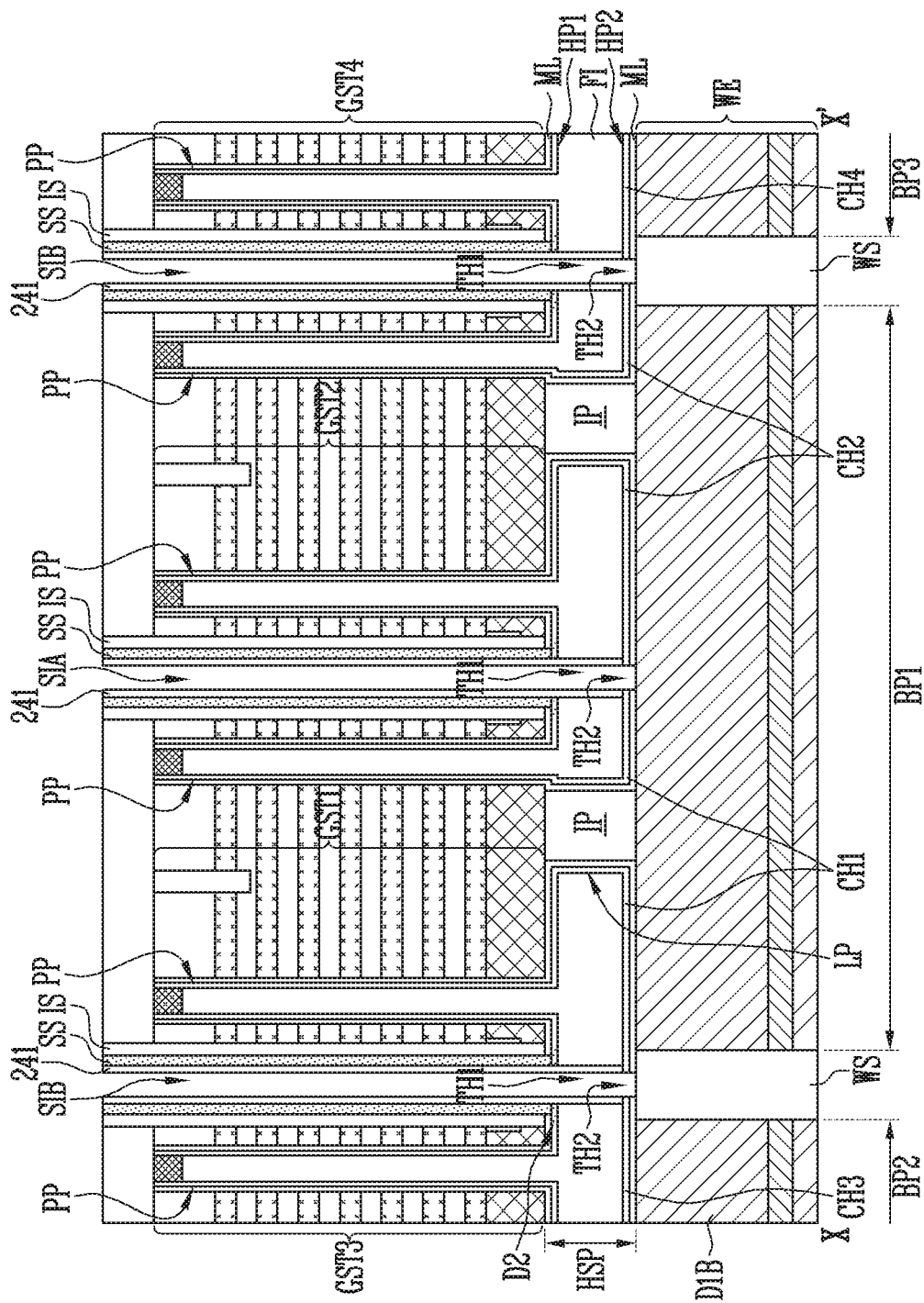
FIGS. 20A to 22 are views illustrating a method of manufacturing the semiconductor device illustrated in FIG. 2.
Figure 20B:
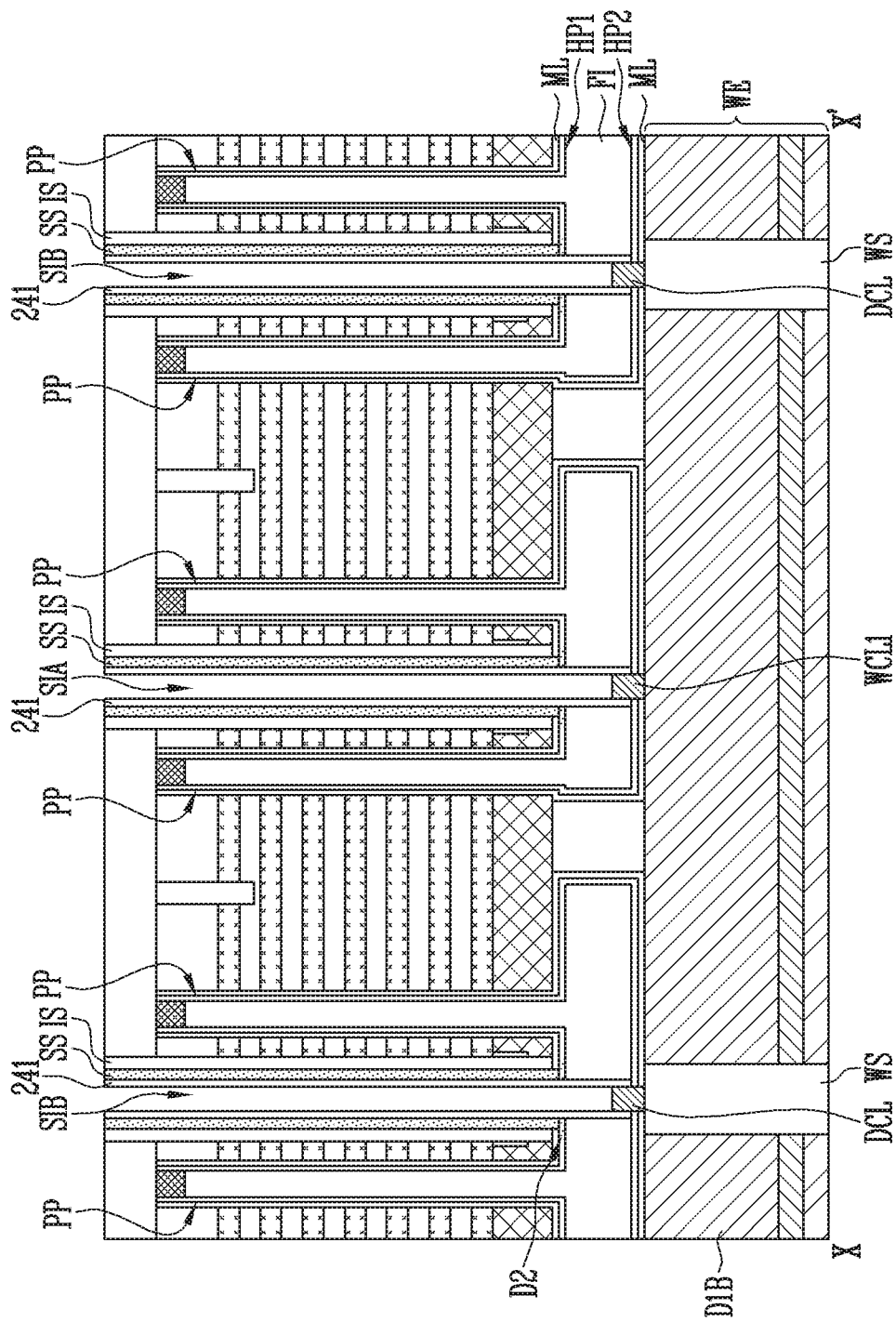

FIGS. 20A and 20B are sectional views illustrating the steps ST1 to ST13.

Referring to FIG. 20A, a series of processes from the step ST1 to the step ST11 may be performed. The steps ST1 to ST11 may be performed through the same processes as those described with reference to FIGS. 6 to 14.

The well structure WE may be divided into the first to third block patterns BP1 to BP3 by the well separation insulating layers WS through the steps ST1 to ST11 described with reference to FIGS. 6 to 14. The first to fourth gate stacks GST1 to GST4 may be disposed on the well structure WE and separated from each other by first and second slits SIA and SIB. The first to fourth gate stacks GST1 to GST4 are spaced apart from the well structure WE with a horizontal space HSP interposed therebetween. The gap of the horizontal space HSP may be maintained by insulating pillars IP disposed between the well structure WE and the first to fourth gate stacks GST1 to GST4. The first horizontal part HP1 of the channel layer extends along an upper surface of the horizontal space HSP that is adjacent to the first to fourth gate stacks GST1 to GST4. The second horizontal part HP2 of the channel layer extends along a lower surface of the horizontal space HSP that is adjacent to the well structure WE. The vertical parts PP of the channel layer protrude from the first horizontal part HP1 and pass through the first to fourth gate stacks GST1 to GST4. The connection parts LP of the channel layer enclose the insulating pillars IP and couple the first horizontal part HP1 with the second horizontal part HP2. The channel layer including the first horizontal part HP1, the second horizontal part HP2, the connection parts LP, and the vertical parts PP may enclose a gap-fill pattern FI. The channel layer including the first horizontal part HP1, the second horizontal part HP2, the connection parts LP, and the vertical parts PP may be enclosed by a multilayer memory layer ML. The insulating spacers IS may be formed on side surfaces of the first and second slits SIA and SIB. The source semiconductor layers SS may be formed on the insulating spacers IS. The source junctions D2 may be formed in the first horizontal part HP1 under the insulating spacers IS and the source semiconductor layers SS.

After the source semiconductor layers SS has been formed, a first through hole group may be formed. The first through hole group may include first through holes TH1. The first through holes TH1 may be coupled to the first and second slits SIA and SIB, and pass through the channel layer between the adjacent source semiconductor layers SS. The first through holes TH1 may completely pass through the first horizontal part HP1, the source junctions D2, and the gap-fill pattern FI and expose the second horizontal part HP2.

Thereafter, growth protection layers 241 are formed on side surfaces of the first through holes TH1, the growth protection layers 241 extending on the source semiconductor layers SS, and then the step ST13 may be performed.

The step ST13 may include the step of forming a second through hole group coupled to the first through hole group. The second through hole group may include second through holes TH2. The second through holes TH2 are coupled to the respective first through holes TH1. The second through holes TH2 pass through the second horizontal part HP2 and the multilayer memory layers ML so that the well structure WE and the well separation insulating layers WS are exposed through the second through holes TH2. The channel layer may be divided into the first to fourth channel patterns CH1 to CH4 by the first and second through hole groups.

Referring to FIG. 20B, the step ST13 may include the step of forming dummy contact lines DCL and a first well contact line WCL1. The dummy contact lines DCL and the first well contact line WCL1 may be simultaneously formed by growing a semiconductor layer from the second horizontal part HP2 and the well structure WE that are exposed through the second through hole group. The dummy contact lines DCL and the first well contact line WCL1 may be formed by growing a silicon layer.

During the operation of growing the dummy contact lines DCL and the first well contact line WCL1, a semiconductor layer is not grown from the source semiconductor layers SS or the first horizontal part HP1 because the source semiconductor layers SS and the first horizontal part HP1 are blocked by the growth protection layers 241. The dummy contact lines DCL come into contact with the second horizontal part HP2 and the well separation insulating layer WS. The first well contact line WCL1 comes into contact with the second horizontal part HP2 and the second doped silicon layer D1B of the well structure WE.

Referring to FIG. 5, after the step ST13 has been performed, the step ST15 of forming the inter-well-source insulating patterns may be performed.

Figure 21B:
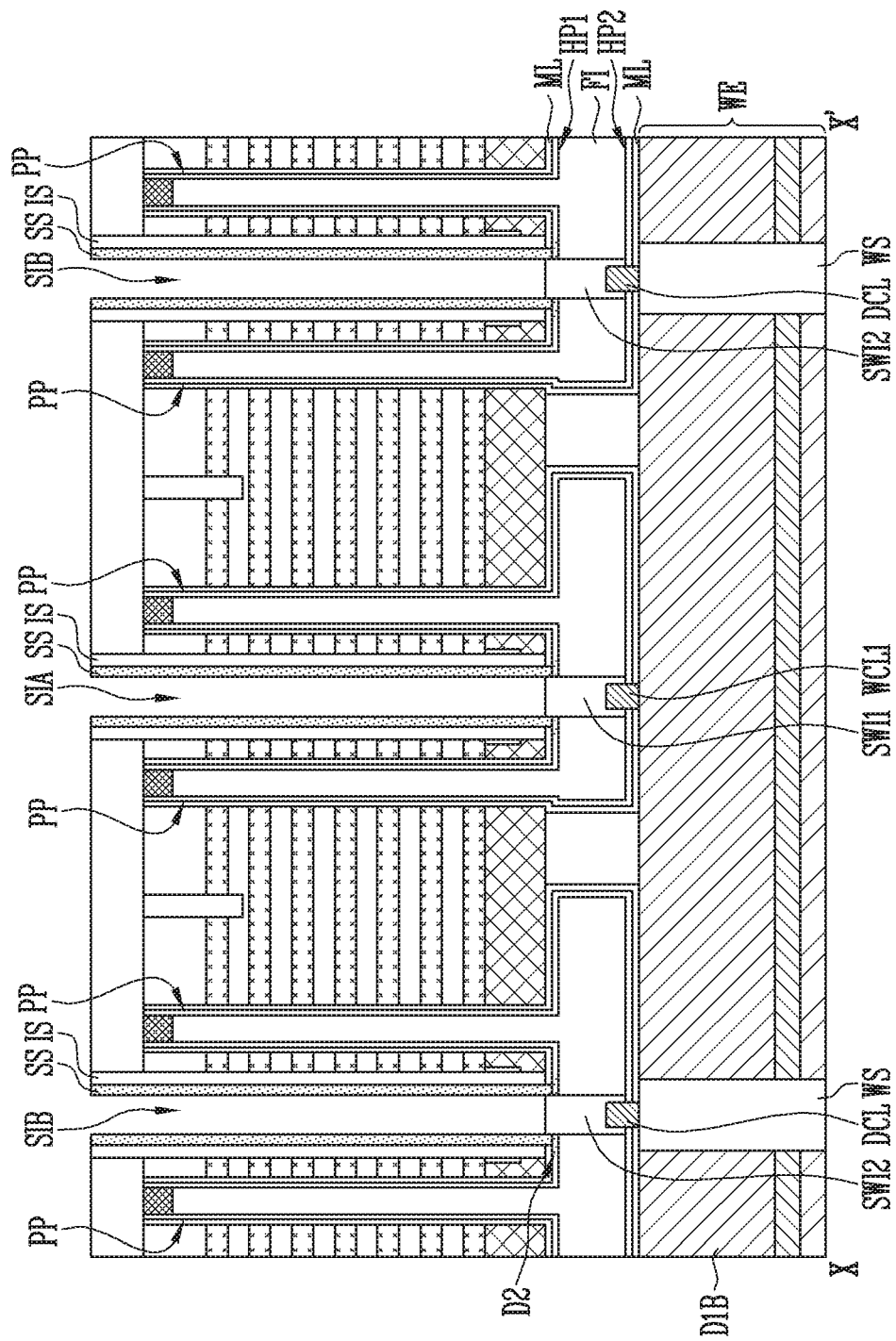

FIGS. 21A and 21B are sectional views illustrating the step ST15 shown in FIG. 5.

Referring to FIG. 21A, before the step ST15 is performed, the growth protection layers may be completely removed so that the source semiconductor layers SS can be exposed through the first and second slits SIA and SIB. Thereby, the side surface of each of the dummy contact lines DCL and the first well contact line WCL1 that protrude further than the second horizontal part HP2 may be exposed.

Referring to FIG. 21B, the step ST15 may include the step of forming inter-well-source insulating layers with which the first and second slits SIA and SIB are completely filled, and the step of reducing the heights of the inter-well-source insulating layers through an etching process so that the source semiconductor layers SS are exposed. In this way, a first inter-well-source insulating pattern SWI1 covering the first well contact line WCL1, and a second inter-well-source insulating pattern SWI2 covering the dummy contact lines DCL may be formed.

The first and second inter-well-source insulating patterns SWI1 and SWI2 may protrude further than the first horizontal part HP1 toward the first and second slits SIA and SIB. The first and second inter-well-source insulating patterns SWI1 and SWI2 may be come into contact with the source semiconductor layers SS.

Referring to FIG. 5, after the step ST15 has been performed, the step ST17 of forming metal source lines may be performed.

Figure 22:
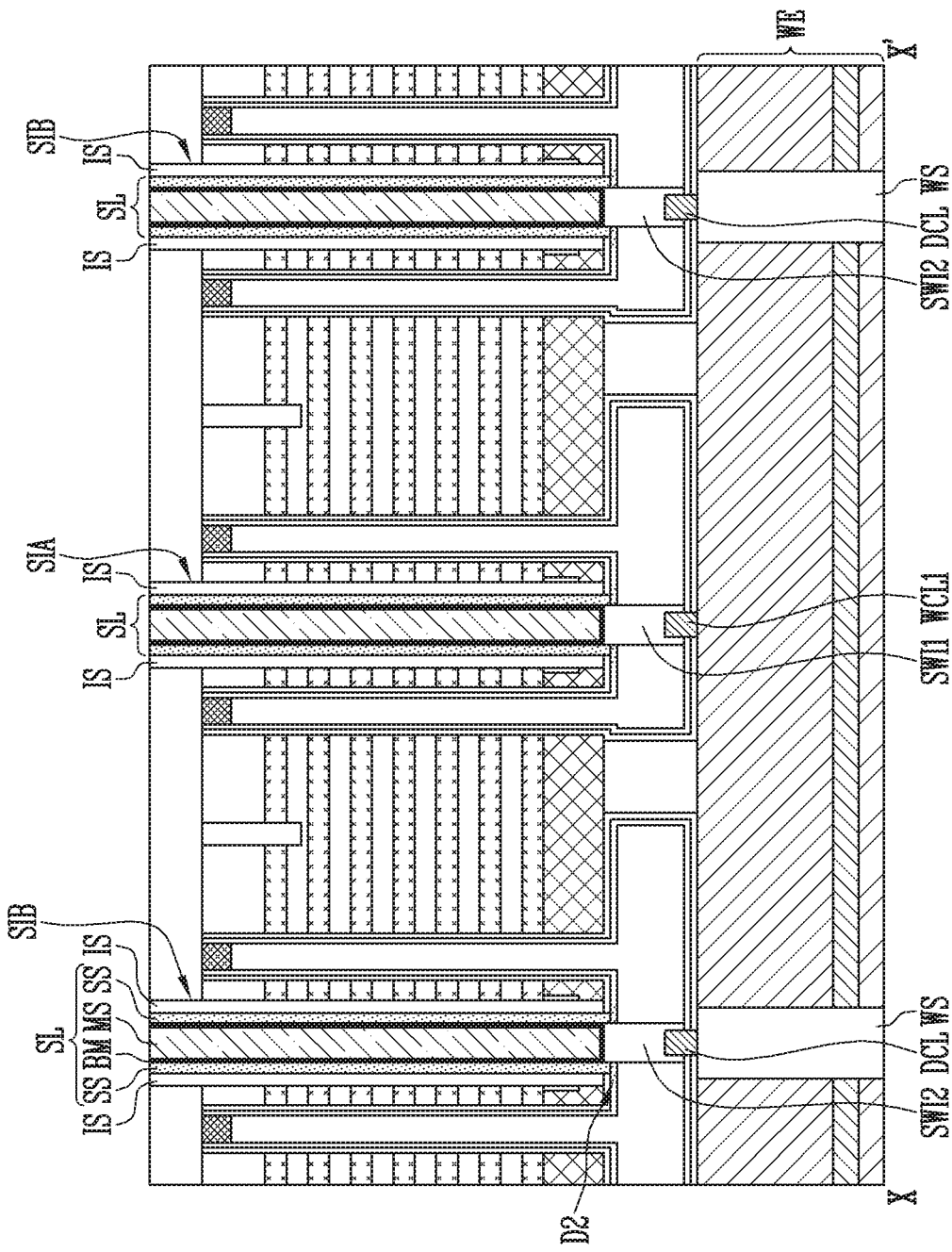

Referring to FIG. 22, the metal source lines MS may be formed through the same process as that described with reference to FIGS. 18 and 19. In this way, source lines SL are formed on the first and second inter-well-source insulating patterns SWI1 and SWI2 in the first and second slits SIA and SIB.

As described with reference to FIG. 17, each of the source lines SL may include a pair of source semiconductor layers SS, and a metal source line MS that is disposed between the pair of source semiconductor layers SS and enclosed by a barrier metal pattern BM.

Hereinafter, an example of a method of manufacturing the semiconductor device illustrated in FIG. 3 will be described with reference to FIGS. 5, and 23A to 24.

Figure 23A:
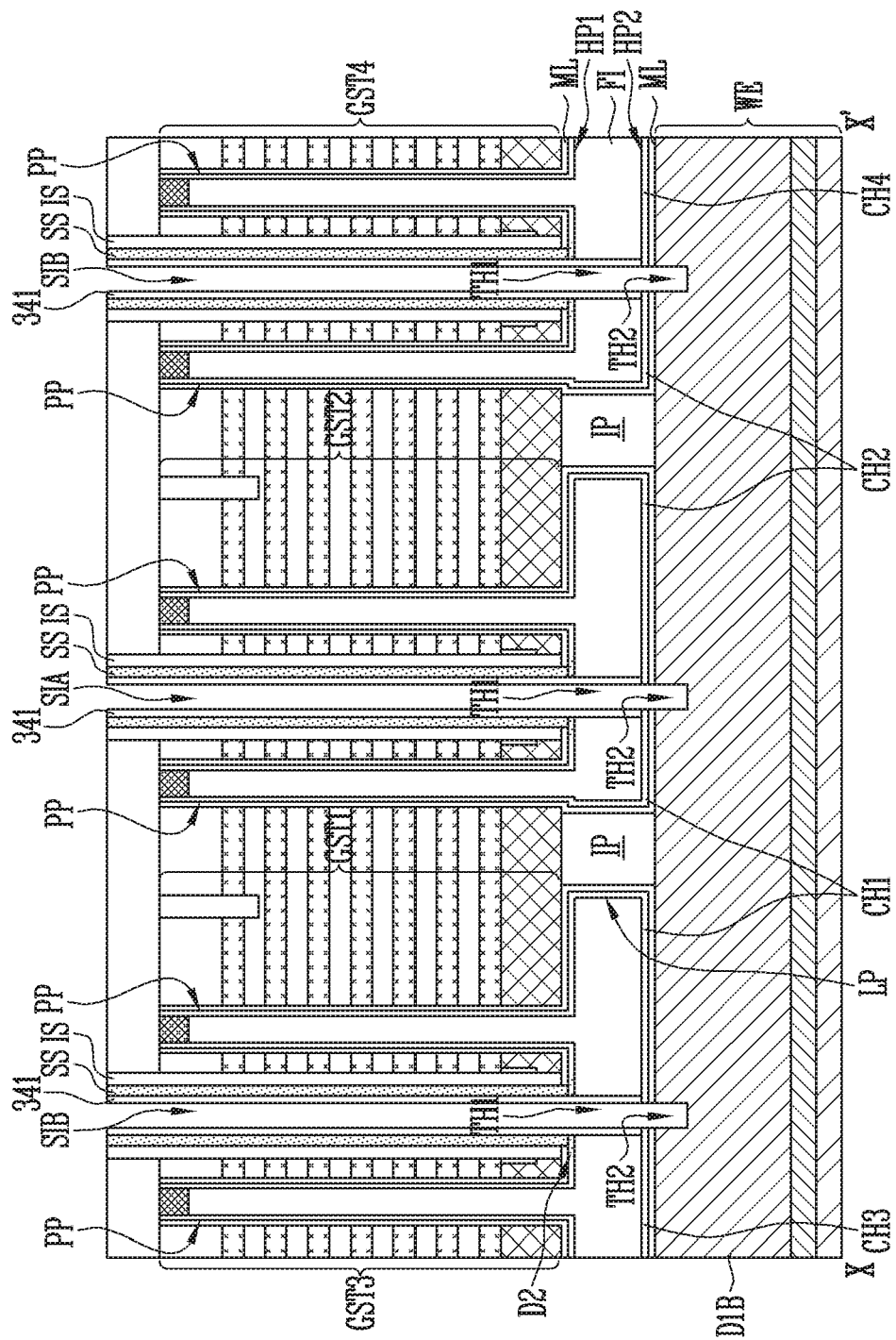

FIGS. 23A and 23B are sectional views illustrating the steps ST1 to ST13.

Referring to FIG. 23A, the well structure WE is formed by performing the step ST1 shown in FIG. 5. The well structure WE includes a first conductivity type impurity. The well structure WE is not divided into block patterns by well structure separation insulating layers.

Thereafter, a series of processes from the step ST3 to the step ST11 shown in FIG. 5 may be performed. The steps ST3 to ST11 may be performed through the same processes as those described with reference to FIGS. 7 to 14.

During the steps ST3 to ST11 described with reference to FIGS. 7 to 14, insulating pillars IP; a channel layer including a first horizontal part HP1, a second horizontal part HP2, connection parts LP, and vertical parts PP; a multilayer memory layer ML; a gap-fill pattern FI; first to fourth gate stacks GST1 to GST4; first and second slits SIA and SIB; source junctions D2; insulating spacers IS; and source semiconductor layers SS are formed.

After the source semiconductor layers SS have been formed, a growth protection layer 341 and a first through hole group including first through holes TH1 may be formed. A process of forming the first through hole group and the growth protection layer 341 is the same as that of the embodiment described with reference to FIG. 20A. After the growth protection layer 341 has been formed, the step ST13 may be performed.

The step ST13 may include the step of forming a second through hole group coupled to the first through hole group. The second through hole group may include second through holes TH2. The second through holes TH2 are coupled to the respective first through holes TH1. The second through holes TH2 pass through the second horizontal part HP2 and the multilayer memory layers ML and extend to the interior of the second doped silicon layer D1B of the well structure WE. The channel layer may be divided into the first to fourth channel patterns CH1 to CH4 by the first and second through hole groups.

In accordance with the present embodiment, the first to fourth gate stacks GST1 to GST4 share the well structure WE. For this structure, the well structure WE may extend to overlap the first and second slits SIA and SIB and the first to fourth gate stacks GST1 to GST4.

Referring to FIG. 23B, the step ST13 may include the step of forming a first well contact line WCL1 and second well contact lines WCL2. The first well contact line WCL1 and the second well contact lines WCL2 may be simultaneously formed by growing a semiconductor layer from the second horizontal part HP2 and the well structure WE that are exposed through the second through hole group. The first well contact line WCL1 and the second well contact lines WCL2 may be formed by growing a silicon layer.

During the operation of growing the first well contact line WCL1 and the second well contact lines WCL2, a semiconductor layer is not grown from the source semiconductor layers SS or the first horizontal part HP1 because the source semiconductor layers SS and the first horizontal part HP1 are blocked by the growth protection layers 341. Each of the first and second well contact lines WCL1 and WCL2 comes into contact with the second horizontal part HP2 and the second doped silicon layer D1B of the well structure WE.

Referring to FIG. 5, after the step ST15 has been performed, the steps ST15 and ST17 may be successively performed.

Figure 24:
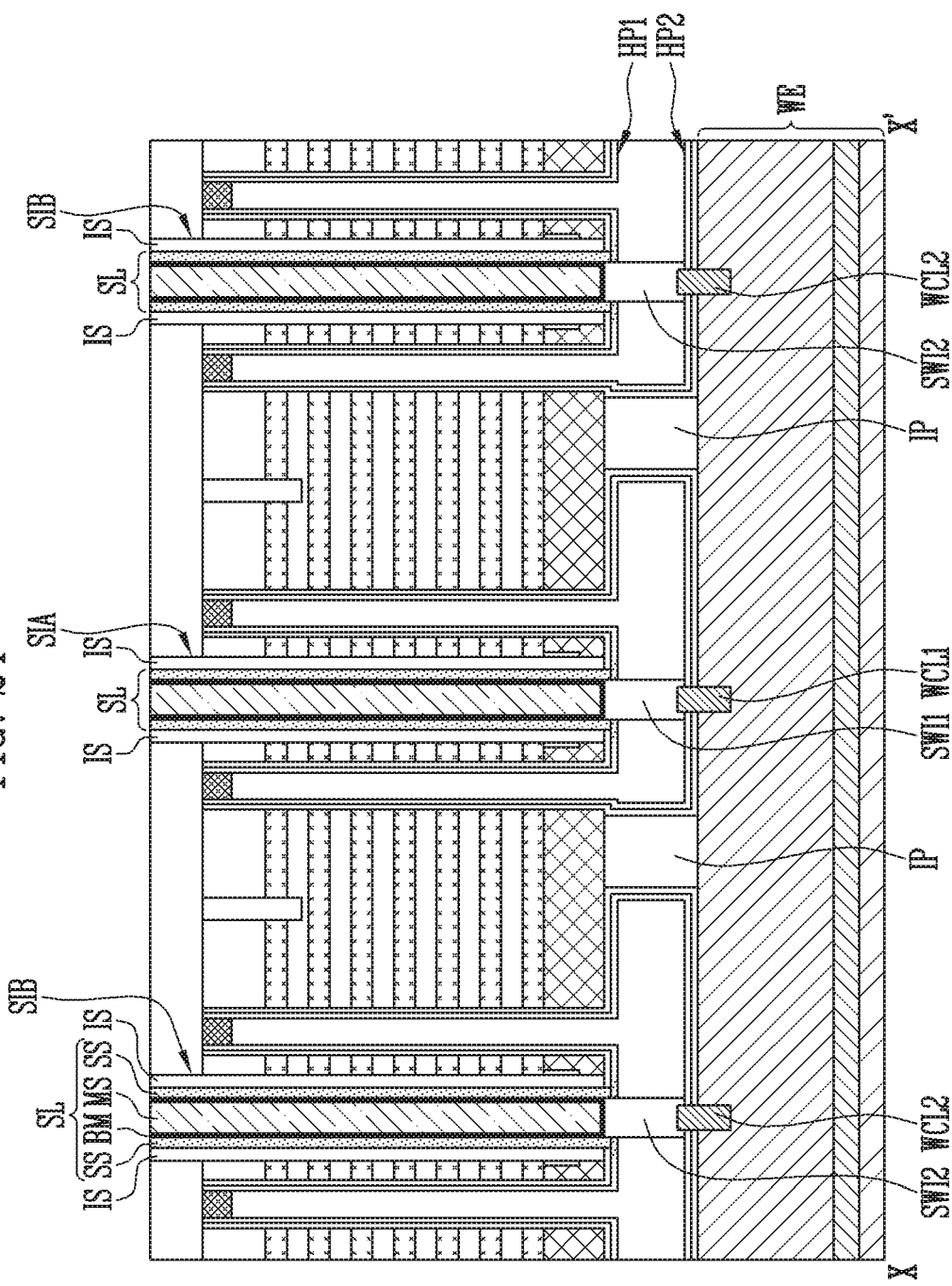

FIG. 24 is a sectional view illustrating the steps ST15 and ST17.

Referring to FIG. 24, before the step ST15 is performed, the growth protection layers may be completely removed so that the source semiconductor layers SS can be exposed through the first and second slits SIA and SIB. Thereby, the side surface of each of the first well contact line WCL1 and the second well contact lines WCL2 that protrude further than the second horizontal part HP2 may be exposed.

The step ST15 is the same as that of the embodiment described with reference to FIG. 21B. During the process described with reference to FIG. 21B, the first inter-well-source insulating pattern SWI1 covering the first well contact line WCL1 and the second inter-well-source insulating patterns SWI2 covering the second well contact lines WCL2 may be formed.

The first and second inter-well-source insulating patterns SWI1 and SWI2 may protrude further than the first horizontal part HP1 toward the first and second slits SIA and SIB. The first and second inter-well-source insulating patterns SWI1 and SWI2 may contact the source semiconductor layers SS.

Thereafter, the step ST17 may be performed through the same process as that described with reference to FIGS. 18 and 19. In this way, source lines SL are formed on the first and second inter-well-source insulating patterns SWI1 and SWI2 in the first and second slits SIA and SIB.

As described with reference to FIG. 17, each of the source lines SL may include a pair of source semiconductor layers SS, and a metal source line MS that is disposed between the pair of source semiconductor layers SS and enclosed by a barrier metal pattern BM.

In various embodiments of the present disclosure, the well contact line comes into direct contact with the well structure and parts of the channel pattern including the vertical parts and the horizontal parts that are integrally formed. Thereby, during an erase operation, holes may be supplied to the channel pattern. Furthermore, the well contact line is electrically insulated from the source line coupled to the channel pattern. Thereby, the operational reliability of the semiconductor device in accordance with the embodiments of the present disclosure may be enhanced.

Figure 25:
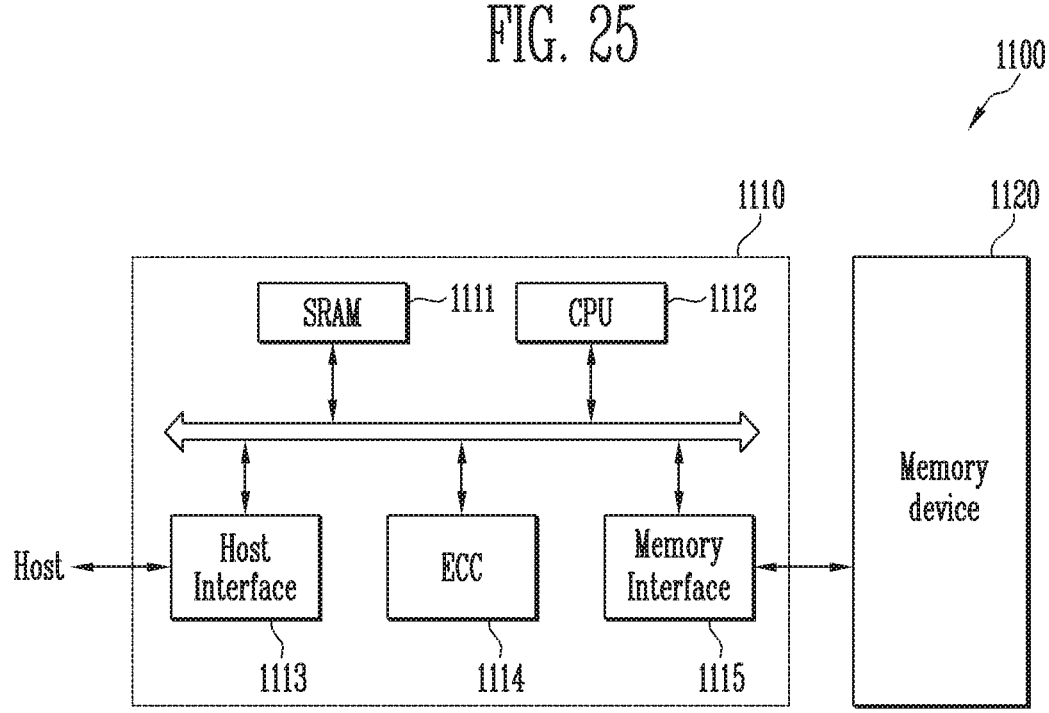
FIG. 25 is a block diagram illustrating the configuration of a memory system according to an embodiment of the present disclosure.

FIG. 25 is a block diagram illustrating the configuration of a memory system 1100 according to an embodiment of the present disclosure.

Referring FIG. 25, the memory system 1100 in accordance with an embodiment includes a memory device 1120 and a memory controller 1110.

The memory device 1120 may include the configuration described with reference to FIGS. 1 to 4B. The memory device 1120 may be a multi-chip package formed of a plurality of memory chips.

The memory controller 1110 is configured to control the memory device 1120, and may include a static random access memory (SRAM) 1111, a CPU 1112, a host interface 1113, an error correction code (ECC) 1114, and a memory interface 1115. The SRAM 1111 is used as an operation memory of the CPU 1112. The CPU 1112 performs general control operations for data exchange of the memory controller 1110. The host interface 1113 is provided with a data interchange protocol of a host coupled with the memory system 1100. Furthermore, the ECC 1114 detects and corrects an error included in the data that is read from the memory device 1120, and the memory interface 1115 interfaces with the memory device 1120. In addition, the memory controller 1110 may further include a read only memory (ROM) or the like that stores code data for interfacing with the host.

The above-described memory system 1100 may be a memory card or a solid state disk (SSD) equipped with the memory device 1120 and the controller 1110. For example, when the memory system 1100 is an SSD, the memory controller 1110 may communicate with an external device (e.g., a host) via one of various interface protocols, such as a universal serial bus (USB), a multimedia card (MMC), a peripheral component interconnection-express (PCI-E), a serial advanced technology attachment (SATA), a parallel advanced technology attachment (PATA), a small computer small interface (SCSI), an enhanced small disk interface (ESDI), and an integrated drive electronics (IDE).

Figure 26:
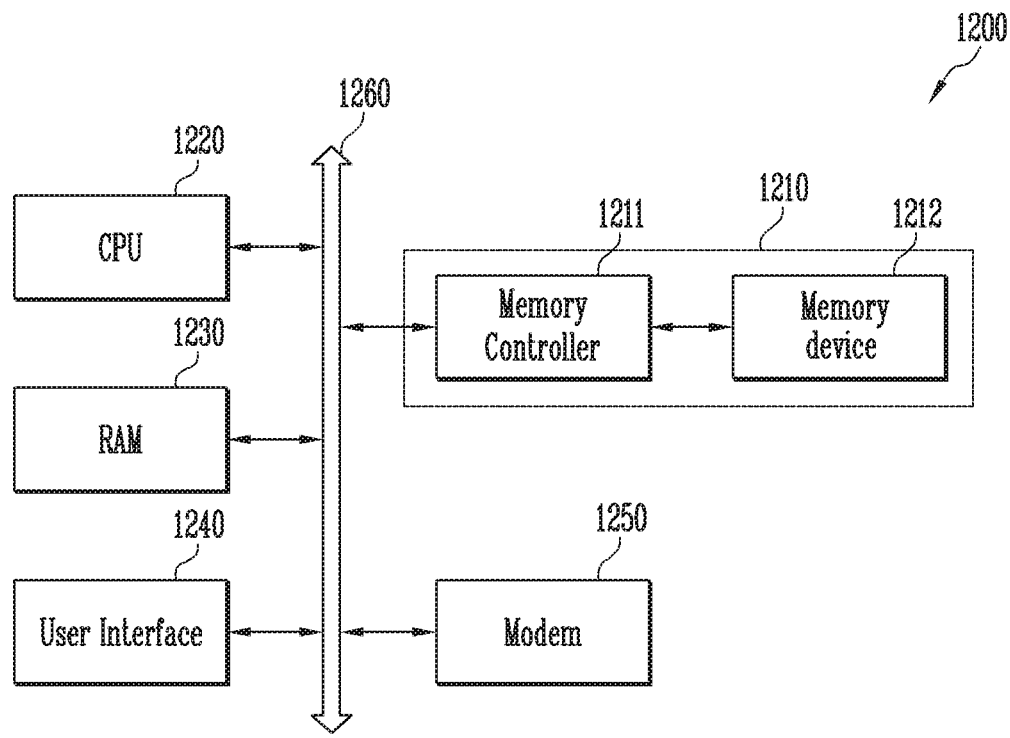
FIG. 26 is a block diagram illustrating the configuration of a computing system in accordance with an embodiment of the present disclosure.

FIG. 26 is a block diagram illustrating the configuration of a computing system 1200 in accordance with an embodiment of the present disclosure.

Referring to FIG. 26, the computing system 1200 in accordance with an embodiment of the present disclosure may include a CPU 1220, a random access memory (RAM) 1230, a user interface 1240, a modem 1250, and a memory system 1210 that are electrically coupled to a system bus 1260. Furthermore, if the computing system 1200 is a mobile device, it may further include a battery for supplying operating voltage to the computing system 1200. An application chip set, a camera image processor CIS, a mobile DRAM and the like may be further included.

As described above with reference to FIG. 25, the memory system 1210 may be configured with the memory device 1212 and the memory controller 1211.

Examples of embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A method of manufacturing a semiconductor device, comprising:
  forming a well structure including an impurity of a first conductivity type;
  forming a channel layer comprising a first horizontal part spaced from the well structure in a first direction and provided parallel to the well structure, a second horizontal part disposed closer to the well structure than the first horizontal part and provided parallel to the well structure, a connection part extending from the second horizontal part toward the first horizontal part, and vertical parts extending from the first horizontal part in the first direction, wherein the first horizontal part is formed on the second horizontal part with a gap-fill pattern interposed between the first horizontal part and the second horizontal part;
  forming a first through hole group passing through the first horizontal part;
  forming a second through hole group coupled to the first through hole group and passing through the second horizontal part; and
  forming a first well contact line coupling the well structure with the second horizontal part through the second through hole group,
  wherein the gap-fill pattern includes an insulating material.

2. The method according to claim 1, wherein the forming of the channel layer comprises:
   forming a sacrificial layer on the well structure, the sacrificial layer penetrated by insulating pillars;
   alternately stacking first material layers and second material layers on the sacrificial layer in the first direction;
   forming vertical holes passing through the first material layers and the second material layers so that the sacrificial layer is exposed through the vertical holes;
   removing the sacrificial layer through the vertical holes to open a horizontal space supported by the insulating pillars;
   forming a multilayer memory layer extending along surfaces of the vertical holes, a surface of the horizontal space, and side surfaces of the insulating pillars;
   forming the channel layer on the multilayer memory layer, the channel layer extending along surfaces of the vertical holes, the surface of the horizontal space, and the side surfaces of the insulating pillars; and
   forming the gap-fill pattern extending from internal space of the vertical holes into the horizontal space, the gap-fill pattern being enclosed by the channel layer.

3. The method according to claim 2,
   wherein the first through hole group includes first through holes passing through the first horizontal part of the channel layer formed along an upper surface of the horizontal space that is adjacent to the vertical holes,
   wherein the second through hole group includes second through holes passing through the second horizontal part of the channel layer formed along a lower surface of the horizontal space that is adjacent to the well structure, and
   wherein the channel layer is divided into first to third channel patterns by the first through hole group and the second through hole group.

4. The method according to claim 3, further comprising:
   forming first to third gate stacks enclosing the vertical parts of the channel layer.

5. The method according to claim 4, wherein the forming of the first to third gate stacks comprises:
   forming first and second slits passing through the first material layers and the second material layers; and
   replacing the first material layers with third material layers having conductivity through the first and second slits, and
   wherein the first slit is disposed between the first and second gate stacks, and the second slit is disposed between the first and third gate stacks.

6. The method according to claim 5, further comprising, before the forming of the first material layers and the second material layers,
   forming an etch stop conductive layer on the sacrificial layer, the etch stop conductive layer having an etch rate different from etch rates of the first and second material layers,
   wherein the forming of the first and second slits comprises:
   etching the first material layers and the second material layers through a first etching process that is stopped when the etch stop conductive layer is exposed; and
   etching the etch stop conductive layer through a second etching process that is stopped when the multilayer memory layer is exposed.

7. The method according to claim 5, further comprising:
   forming source junctions in the channel layer by injecting an impurity of a second conductivity type different from the first conductivity type into the channel layer through the first and second slits.

8. The method according to claim 5, further comprising:
   forming insulating spacers on side surfaces of the first and second slits; and
   forming source semiconductor layers on the insulating spacers, each of the source semiconductor layer including an impurity of a second conductivity type different from the first conductivity type.

9. The method according to claim 8, wherein the forming of the first through hole group comprises forming the first through holes through the first and second slits, the first through holes passing through the channel layer between the adjacent source semiconductor layers and exposing the gap-fill pattern.

10. The method according to claim 9,
    wherein the well structure comprises a plurality of block patterns separated from each other by a well separation insulating layer overlapping the second slit, and
    wherein the first gate stack and the second gate stack are formed to overlap one of the block patterns.

11. The method according to claim 10, further comprising, before the forming of the second through hole group,
    forming growth protection layers on side surfaces of the first through holes, the growth protection layers extending on the source semiconductor layers,
    wherein the second through holes pass through the multilayer memory layer and the channel layer that are disposed under the first through holes, and
    wherein the second through holes include a second-slit-side second through hole formed to expose the well separation insulating layer, and a first-slit-side second through hole formed to expose the well structure.

12. The method according to claim 11, wherein the forming of the first well contact line comprises:
    growing first and second contact layers from the channel layer and the well structure that are exposed through the second through hole group such that the first contact layer filling completely the first-slit-side second through hole and the second contact layer defining an air tunnel in the second-slit-side second through hole are simultaneously formed; and
    etching the first and second contact layers such that the second contact layer is completely removed and the first contact layer remains as the first well contact line.

13. The method according to claim 11,
    wherein the first well contact line is formed in the first-slit-side second through hole, and
    wherein, while the first well contact line is formed, a dummy contact line is formed in the second-slit-side second through hole.

14. The method according to claim 11, further comprising:
    forming inter-well-source insulating layers over the well separation insulating layer and the first well contact line through the first and second slits;
    reducing heights of the inter-well-source insulating layers so that the source semiconductor layers are exposed through the first and second slits; and
    forming metal source lines in the first and second slits, the metal source lines coupled to the source semiconductor layers.

15. The method according to claim 14, wherein, while the heights of the inter-well-source insulating layers are reduced, the growth protective layers are etched.

16. The method according to claim 15, further comprising, before the forming of the inter-well-source insulating layers, completely removing the growth protective layers.

17. The method according to claim 9, wherein the well structure extends to overlap the first and second slits.

18. The method according to claim 17, wherein the forming of the second through hole group comprises:

forming the second through holes through the first through holes, the second through holes passing through the multilayer memory layer and the channel layer that are disposed under the first through holes, and exposing the well structure, the second through holes overlapping the respective first and second slits.

19. The method according to claim 17, wherein the first well contact line is formed in the second through hole that overlaps the first slit, and wherein, while the first well contact line is formed, a second well contact line is formed in the second through hole that overlaps the second slit, the second well contact line extending from the well structure and contacting with the second horizontal part.

20. The method according to claim 19, further comprising:

forming inter-well-source insulating layers over the first and second well contact lines through the first and second slits;

reducing heights of the inter-well-source insulating layers so that the source semiconductor layers are exposed through the first and second slits; and forming metal source lines in the first and second slits, the metal source lines coupled to the source semiconductor layers.

\* \* \* \* \*